(12) United States Patent
Kiuchi

(10) Patent No.: US 9,072,210 B2
(45) Date of Patent: Jun. 30, 2015

(54) SUBSTRATE CARTRIDGE, SUBSTRATE PROCESSING APPARATUS, SUBSTRATE PROCESSING SYSTEM, CONTROL APPARATUS, AND METHOD OF MANUFACTURING DISPLAY ELEMENT

(71) Applicant: NIKON CORPORATION, Tokyo (JP)

(72) Inventor: Tohru Kiuchi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/306,848

(22) Filed: Jun. 17, 2014

(65) Prior Publication Data

US 2014/0290041 A1    Oct. 2, 2014

Related U.S. Application Data

(62) Division of application No. 12/876,842, filed on Sep. 7, 2010, now Pat. No. 8,801,307.

(60) Provisional application No. 61/272,462, filed on Sep. 25, 2009, provisional application No. 61/272,557, filed on Oct. 6, 2009.

(30) Foreign Application Priority Data

Sep. 25, 2009   (JP) .................................. 2009-219953

(51) Int. Cl.
| | |
|---|---|
| *B41J 15/04* | (2006.01) |
| *H05K 13/00* | (2006.01) |
| *H01L 21/67* | (2006.01) |

(52) U.S. Cl.
CPC ............. *H05K 13/0023* (2013.01); *B41J 15/04* (2013.01); *H01L 21/67132* (2013.01)

(58) Field of Classification Search
CPC ......... B41J 15/04; B41J 15/042; B41J 15/044
See application file for complete search history.

(56) References Cited

U.S. PATENT DOCUMENTS

| | | | |
|---|---|---|---|
| 4,475,700 A | 10/1984 | MacLeod et al. | |
| 4,533,093 A | 8/1985 | Gelardi et al. | |
| 4,646,189 A | 2/1987 | Sasaki et al. | |
| 5,308,015 A | 5/1994 | Gelardi et al. | |

(Continued)

FOREIGN PATENT DOCUMENTS

| | | |
|---|---|---|
| WO | WO 2006/100868 | 9/2006 |
| WO | WO 2007/139317 A1 | 12/2007 |

OTHER PUBLICATIONS

English-language Written Opinion of the International Searching Authority issued by European Patent Office in International Application No. PCT/JP2010/067293, mailed Mar. 2, 2011 (7 pages).

(Continued)

*Primary Examiner* — David Banh
(74) *Attorney, Agent, or Firm* — Finnegan, Henderson, Farabow, Garrett & Dunner, L.L.P.

(57) ABSTRACT

In order to provide a substrate cartridge, a substrate processing apparatus, a substrate processing system, a control apparatus, and a method of manufacturing a display element capable of preventing foreign objects from being attached to the substrate, there is provided a substrate cartridge including: a cartridge mainframe that has an opening which a substrate is carried in/out and accommodates the substrate through the opening; a mount portion that is provided in the cartridge mainframe and is detachably connected to an external connecting portion; and a blocking unit that blocks the opening depending on a connection state between the mount portion and an external connecting portion.

8 Claims, 37 Drawing Sheets

(56) References Cited

U.S. PATENT DOCUMENTS

| | | |
|---|---|---|
| 5,417,380 A | 5/1995 | Gelardi et al. |
| 5,796,563 A | 8/1998 | Iwano et al. |
| 5,815,479 A | 9/1998 | Lee |
| 6,560,062 B1 | 5/2003 | Kovacs |
| 2002/0051622 A1 | 5/2002 | Fujii |
| 2002/0122270 A1 | 9/2002 | Kano et al. |
| 2008/0213621 A1 | 9/2008 | Takashima et al. |

OTHER PUBLICATIONS

English-language International Search Report issued by the European Patent Office in International Application No. PCT/JP2010/067293, mailed Mar. 2, 2011 (3 pages).

Office Action mailed Jul. 18, 2013, in U.S. Appl. No. 12/876,842.

English-language Written Opinion of the International Searching Authority issued by the European Patent Office in International Application No. PCT/JP2010/067293, mailed Mar. 2, 2011 (7 pages).

FIG. 1
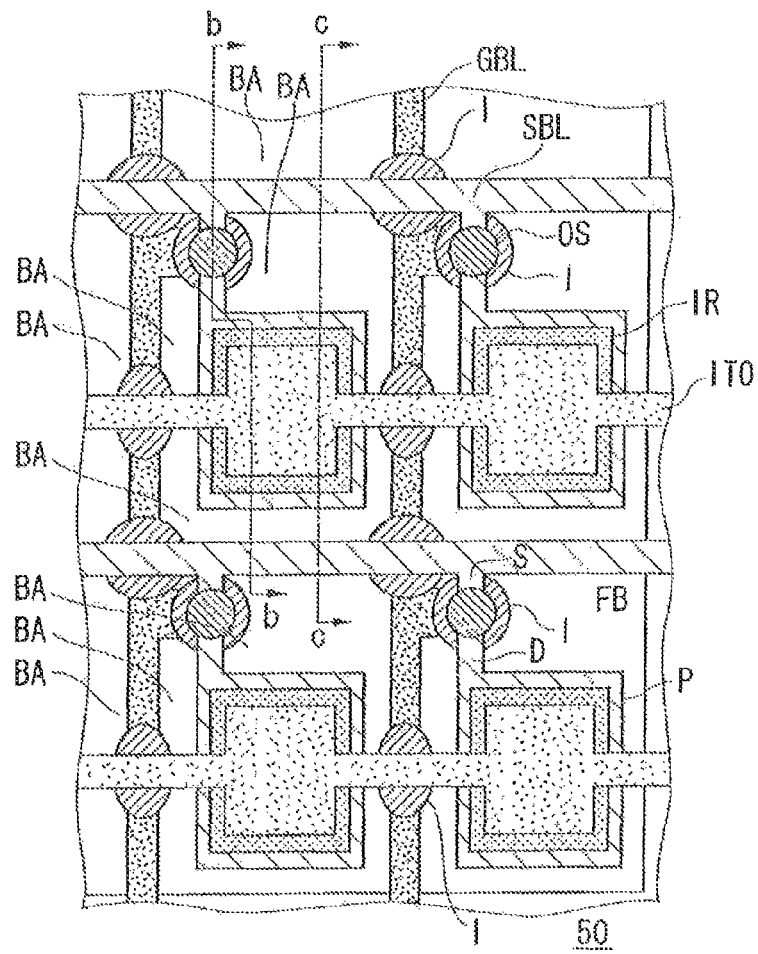
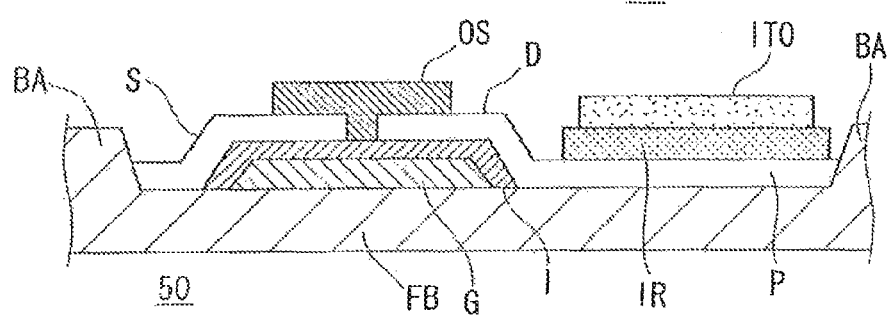
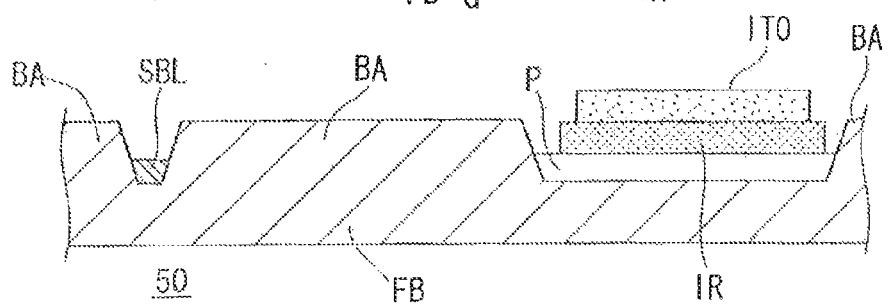

FIG. 34
(a)
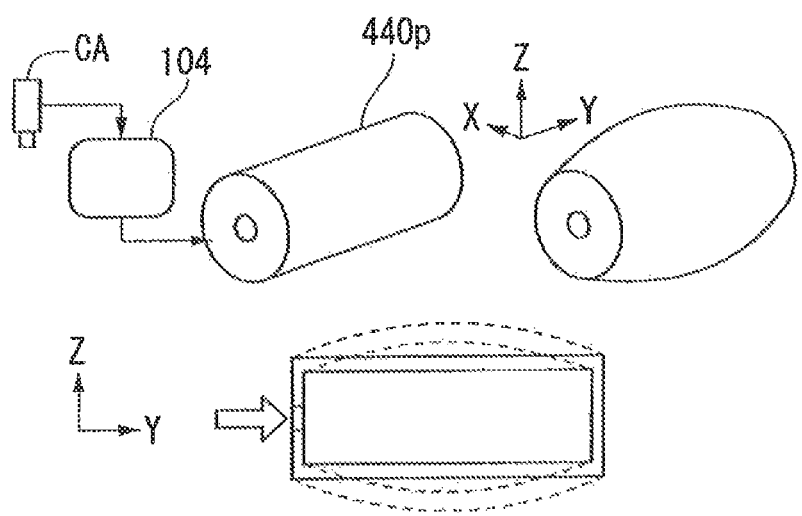
(b)
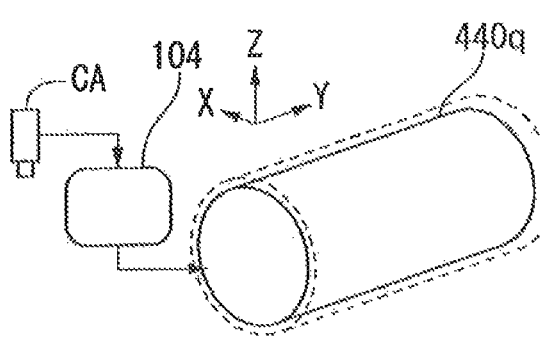
(c)
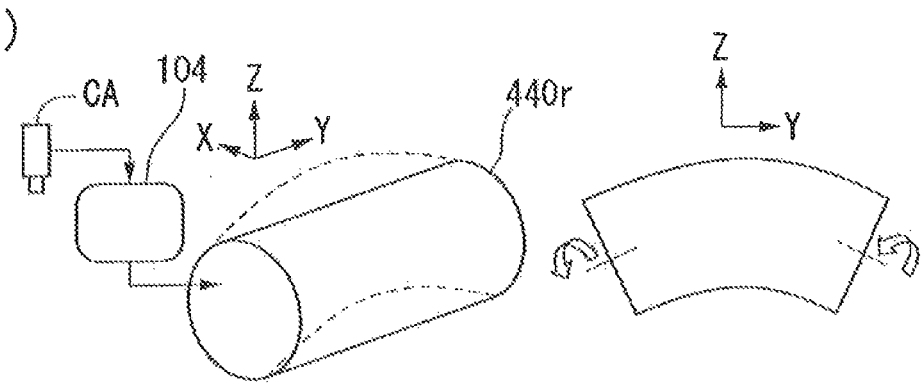

FIG. 35
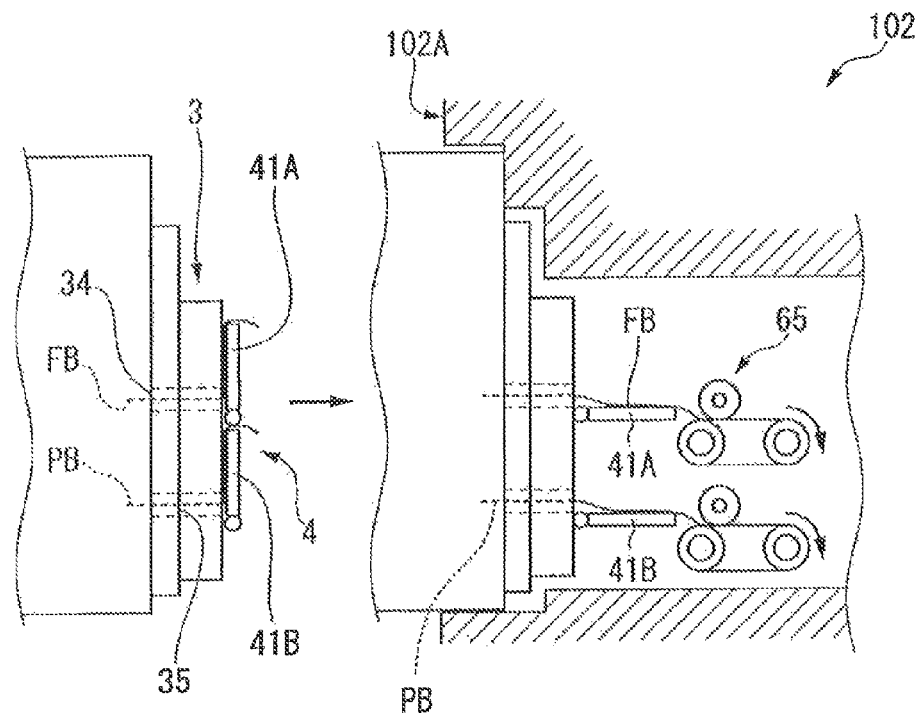
FIG. 36
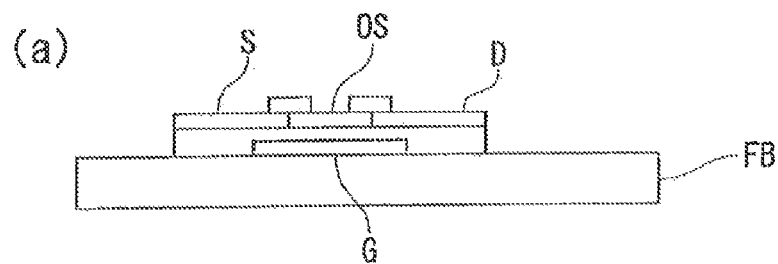
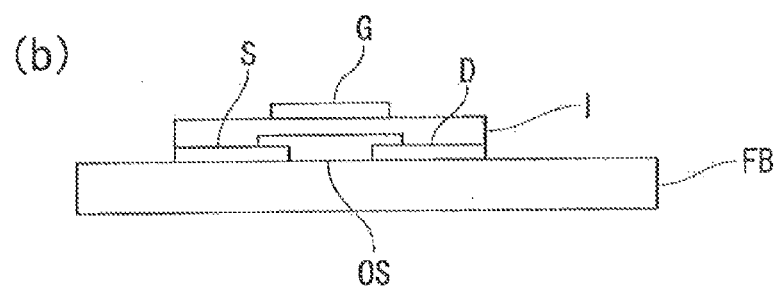

SUBSTRATE CARTRIDGE, SUBSTRATE PROCESSING APPARATUS, SUBSTRATE PROCESSING SYSTEM, CONTROL APPARATUS, AND METHOD OF MANUFACTURING DISPLAY ELEMENT

CROSS-REFERENCE TO RELATED APPLICATION

This is a divisional of application Ser. No. 12/876,842, filed Sep. 7, 2010 (now allowed), which is a non-provisional application claiming priority to and the benefit of U.S. Provisional Application No. 61/272,462, filed Sep. 25, 2009, Japanese Patent Application No. 2009-219953, filed Sep. 25, 2009, and U.S. Provisional Application No. 61/272,557, filed Oct. 6, 2009. The entire contents of which are incorporated herein by reference.

BACKGROUND

1. Field of the Invention

The present invention relates to a substrate cartridge, a substrate processing apparatus, a substrate processing system, a control apparatus, and a method of manufacturing a display element.

2. Description of Related Art

As a display element of a display device such as a display, for example, an organic electroluminescence (EL) element is known in the art. The organic EL element includes positive and negative electrodes on a substrate and an organic light-emitting layer interposed between the positive and negative electrodes. The organic EL element is configured to obtain display light emitted by implanting holes into the organic light-emitting layer from the positive electrode and combining holes and electrons in the organic light-emitting layer. The organic EL element has, for example, an electric circuit connected to positive and negative electrodes on the substrate.

As a method of manufacturing the organic EL element, for example, a technique called a roll-to-roll method (hereinafter, simply referred to as a "roll method") is known in the art (e.g., refer to Pamphlet of PCT Publication No. 2006/100868). In the roll method, a substrate is transported by supplying a single sheet-like substrate wound around a roller of the substrate supply side and winding the supplied substrate around a roller of the substrate recovery side, and, while the substrate is wound after being supplied, the light-emitting layer, the positive or negative electrode, the electric circuit, and the like of the organic EL element are sequentially formed on the substrate.

In the configuration disclosed in the Patent Document, for example, a roller for supplying the substrate and a roller for winding the substrate are removable from the manufacturing line. The removed roller may be transported to, for example, another manufacturing line and reinstalled therein for use.

However, in the aforementioned configuration, since the substrate wound around the roller is placed in an external environment of the manufacturing line while being exposed, foreign objects such as dust may adhere to the substrate.

Aspects of the present invention provides a substrate cartridge, a substrate processing apparatus, and a substrate processing system capable of preventing foreign objects from adhering to the substrate.

SUMMARY

A substrate cartridge according to an aspect of the present invention includes: a cartridge mainframe that has an opening which a substrate is carried in/out and accommodates the substrate through the opening; a mount portion that is provided in the cartridge mainframe and is detachably connected to an external connecting portion; and a blocking unit that blocks the opening depending on a connection state between the mount portion and an external connecting portion.

A substrate cartridge according to an aspect of the present invention includes a cartridge mainframe that has an opening which a substrate is carried in/out and accommodating the substrate through the opening; and a mount portion that is provided in the cartridge mainframe and detachably connected to an external connecting portion, wherein the opening is provided to be blocked by the substrate depending on a connection state between the mount portion and the external connecting portion.

A substrate processing apparatus according to an aspect of the present invention includes: a substrate processing unit that performs processing on a substrate; the substrate cartridge; and a substrate processing side connecting portion that is provided in the substrate processing unit and connected to the substrate cartridge.

A substrate processing system according to an aspect of the present invention includes: a first processing apparatus that performs a first process for a substrate; a second processing apparatus that performs a second process for the substrate after the first process; and a substrate relay apparatus that recovers the substrate from the first processing apparatus and supplies the recovered substrate to the second processing apparatus, wherein the substrate cartridge is used as the substrate relay apparatus.

A control apparatus according to an aspect of the present invention includes: a substrate processing apparatus that performs processing on the substrate; and a main control unit that performs control of the substrate cartridge connected to the substrate processing apparatus.

A method of manufacturing a display element according to an aspect of the present invention includes: a process of performing processing on the substrate in the substrate processing unit; and a process of supplying the substrate to the substrate processing unit using the substrate cartridge.

According to aspects of the present invention, it is possible to prevent foreign objects from adhering to the substrate.

BRIEF DESCRIPTION OF THE DRAWINGS

FIG. 1 is a schematic diagram illustrating an organic EL element according to an embodiment of the present invention.

FIG. 34 illustrates a configuration of a roller of the substrate processing apparatus.

FIG. 35 illustrates a configuration of a blocking unit of another substrate processing apparatus.

FIG. 36 illustrates a configuration of another organic EL element.

DESCRIPTION OF EMBODIMENTS

Hereinafter, an embodiment of the present invention will be described with reference to the accompanying drawings.

(Organic EL Element)

FIG. 1(a) is a plan view illustrating a configuration of the organic EL element. FIG. 1(b) is a cross-sectional view taken along the line b-b of FIG. 1(a). FIG. 1(c) is a cross-sectional view taken along the line c-c of FIG. 1(a).

As shown in FIGS. 1(a) to 1(c), the organic EL element 50 is a bottom contact type in which the gate electrode G and the gate insulation layer 1 are formed on the sheet substrate FB. Further, the source electrode S, the drain electrode D and the pixel electrode P are formed thereon, and then, the organic semiconductor layer OS is formed thereon.

As shown in FIG. 1(b), the gate insulation layer 1 is formed on the gate electrode G. On the gate insulation layer 1, the source electrode S of the source bus line SBL is formed, and at the same time, the drain electrode D connected to the pixel electrode P is formed. The organic semiconductor layer OS is formed between the source electrode S and the drain electrode D. As a result, a field effect transistor is completely manufactured. In addition, as shown in FIGS. 1(b) and 1(c), the light-emitting layer IR is formed on the pixel electrode P, and the transparent electrode ITO is formed on the light-emitting layer IR.

As shown in FIGS. 1(b) and 1(c), for example, barriers BA (bank layer) are formed on the sheet substrate FB. In addition, as shown in FIG. 1(c), the source bus line SBL is formed between the barriers BA. Since the barriers BA are provided in this manner, the source bus line SBL is formed with high precision, and at the same time, the pixel electrode P and the light-emitting layer IR are also formed accurately. In addition, although not shown in FIGS. 1(b) and 1(c), similar to the source bus line SBL, the gate bus line GBL is also formed between the barriers BA.

The organic EL element 50 is preferably used in, for example, a display device, a display unit of an electric appliance, or the like. In this case, for example, the organic EL element 50 formed in a panel shape is used. In order to manufacture such an organic EL element 50, it is necessary to form a substrate where thin film transistors (TFT) and pixel electrodes are formed. In order to form with high precision one or more organic compound layers (light-emitting element layer) including the light-emitting layer on the pixel electrode of the substrate, it is preferable that the barriers BA (bank layer) be readily formed with high precision in the boundary area of the pixel electrode.

(Substrate Processing Apparatus)

Figure 2:
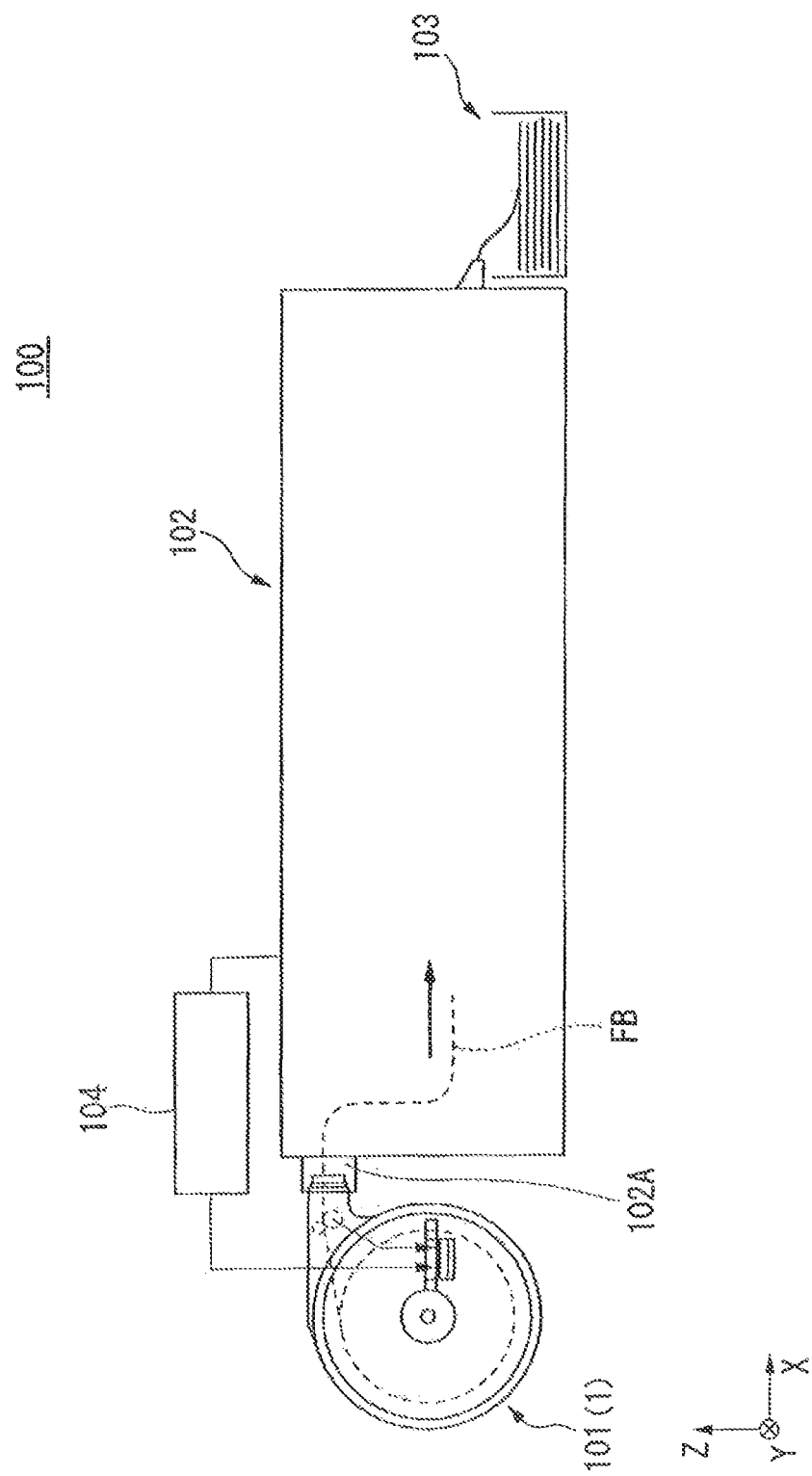
FIG. 2 illustrates a configuration of a substrate processing apparatus.

FIG. 2 is a schematic diagram illustrating a configuration of the substrate processing apparatus 100 for performing processing using the sheet substrate FB having flexibility.

The substrate processing apparatus 100 is an apparatus for forming an organic EL element 50 shown in FIG. 1 using a strip-like sheet substrate FB. As shown in FIG. 2, the substrate processing apparatus 100 includes the substrate supply unit 101, the substrate processing unit 102, the substrate recovery unit 103, and the control unit 104. The sheet substrate FB is transported from the substrate supply unit 101 to the substrate recovery unit 103 via the substrate processing unit 102. The control unit 104 collectively performs control of the operation of the substrate processing apparatus 100.

Hereinafter, an XYZ rectangular coordinates system is established, and a positional relationship of each member will be described referring to the XYZ rectangular coordinates system. The X-axis direction denotes a transport direction of the sheet substrate FB within a horizontal plane, the Y-axis direction denotes a direction perpendicular to the X-axis direction within a horizontal plane, and the Z-axis direction denotes a direction perpendicular (i.e., vertical) to each of the X-axis and Y-axis directions. In addition, rotation (inclination) directions around the X-axis, the Y-axis, and the Z-axis are denoted by θX, θY, and θZ, respectively.

For example, a heat-resistant resin film, stainless steel, or the like may be used as the sheet substrate FB. Specifically, materials of the sheet substrate FB may include polyethylene resin, polypropylene resin, polyester resin, ethylenevinyl copolymer resin, polyvinyl chloride resin, cellulose resin, polyamide resin, polyimide resin, polycarbonate resin, polystyrene resin, polyvinylacetate resin, or the like. For example, a Y direction dimension of the sheet substrate FB is formed at about 1 m to 2 m, and a Y direction dimension is formed at 10 m or larger. Needless to say, such dimensions are just exemplary, and but not limited thereby. For example, the Y direction dimension of the sheet substrate FB may be less than 50 cm, or equal to or larger than 2 m. In addition, the X direction dimension of the sheet substrate FB may be less than 10 m. Furthermore, flexibility of the present embodiment means a flexible property where the substrate can flex without any causing cracks or fractures when a predetermined force such as at least about a self weight is applied to the substrate. In addition, the flexibility changes depending on a material, size, or thickness of the substrate, or an environment such as a temperature.

It is preferable that the sheet substrate FB has a lower thermal expansion coefficient such that the dimensions do not change even when heated, for example, at a temperature of approximately 200° C. For example, it is possible to reduce the thermal expansion coefficient by mixing an inorganic filler with the resin film. The inorganic filler may include, for example, titanium oxide, zinc oxide, alumina, silicon oxide, or the like.

The substrate supply unit 101 is connected to the supply side connecting portion 102A provided in the substrate processing unit 102. The substrate supply unit 101 supplies the substrate processing unit 102, for example, with a sheet substrate FB wound in a roll shape. The substrate recovery unit 103 recovers the sheet substrate FB performed processing in the substrate processing unit 102.

Figure 3:
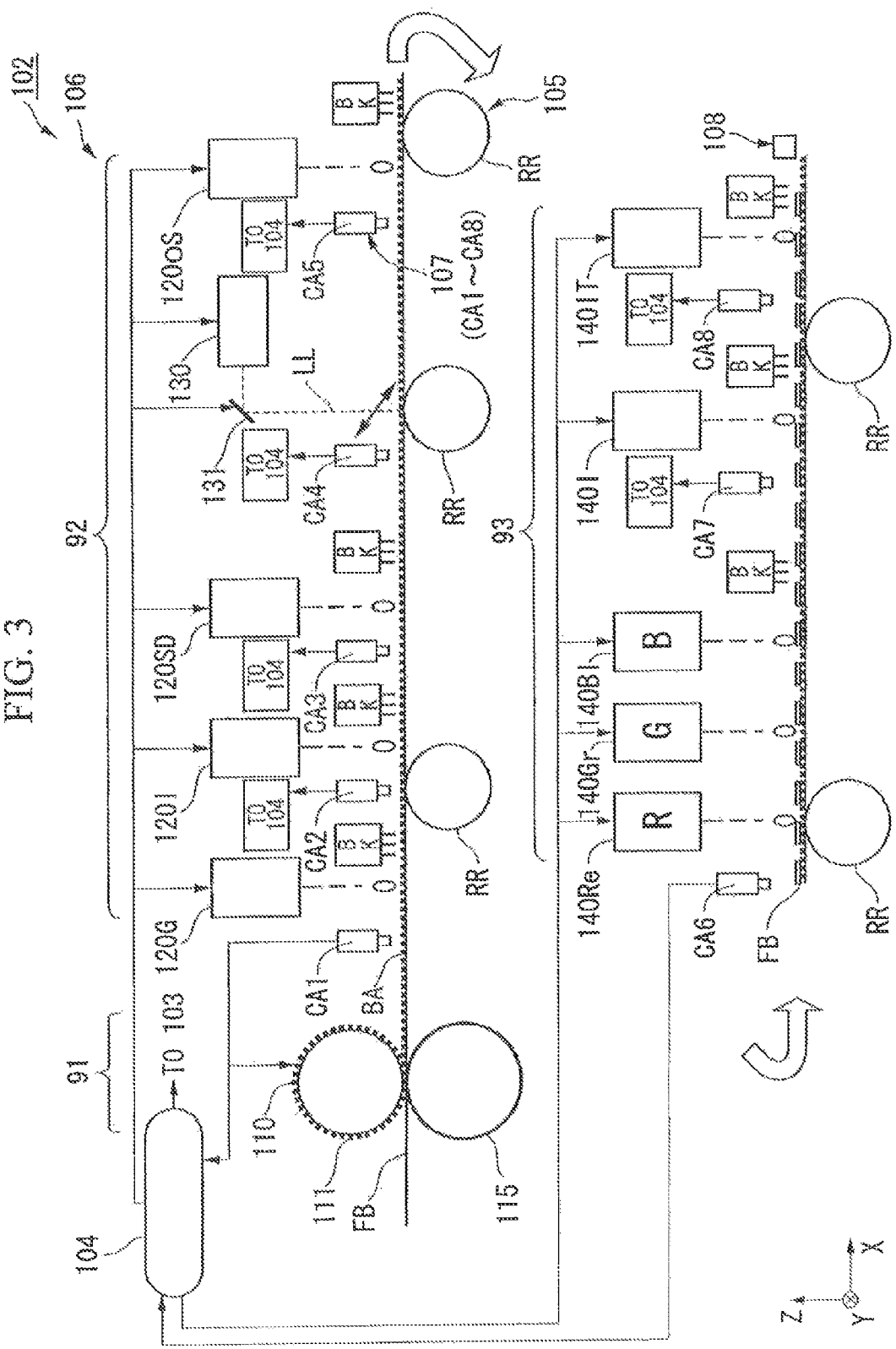
FIG. 3 illustrates a configuration of a substrate processing unit.

FIG. 3 illustrates a configuration of the substrate processing unit 102.

As shown in FIG. 3, the substrate processing unit 102 includes the transport unit 105, the element formation unit 106, the alignment unit 107, and the substrate cutting unit 108. The substrate processing unit 102 forms each constituent of the organic EL element 50 in the sheet substrate FB while transporting the sheet substrate FB supplied from the substrate supply unit 101 and transports the sheet substrate FB having the organic EL element 50 to the substrate recovery unit 103.

The transport unit 105 has a plurality of rollers RR disposed along the X direction. The sheet substrate FB is also transported in the X-axis direction by rotating the roller RR. The roller RR may be a rubber roller for inserting the sheet substrate FB from both faces. If the sheet substrate FB has perforations, the roller RR may be ratcheted. Some of plural rollers RR are movable in the Y-axis direction perpendicular to the transport direction.

The element formation unit 106 includes the barrier formation unit 91, the electrode formation unit 92, and the light-emitting layer formation unit 93. The barrier formation unit 91, the electrode formation unit 92, and the light-emitting layer formation unit 93 are arranged in this order from the upstream side to the downstream side in the transport direction of the sheet substrate FB. Hereinafter, each configuration of the element formation unit 106 will be described.

The barrier formation unit 91 includes the imprint roller 110 and the heat transfer roller 115. The barrier formation unit 91 forms the barriers BA on the sheet substrate FB supplied from the substrate supply unit 101. The barrier formation unit 91 presses the sheet substrate FB with the imprint roller 110 and heats the sheet substrate FB at a temperature more than a glass transition point with the heat transfer roller 115 such that the pressed barriers BA can maintain their shapes. As a result, the pattern shape formed on the roller surface of the imprint roller 110 is transferred to the sheet substrate FB. The sheet substrate FB is heated by the heat transfer roller 115, for example, at a temperature of approximately 200° C.

The roller surface of the imprint roller 110 is mirror-finished, and the fine imprint mold 111 configured of a material such as SiC and Ta is installed on the roller surface. The fine imprint mold 111 constitutes a wiring stamper and a color filter stamper of the thin film transistor.

The imprint roller 110 forms the alignment mark AM on the sheet substrate FB using the fine imprint mold 111. In order to form the alignment mark AM in both sides of the Y-axis direction, which is the widthwise direction of the sheet substrate FB, the fine imprint mold 111 has a stamper for the alignment mark AM.

The electrode formation unit 92 is provided in the +X-side of the barrier formation unit 91 to form a thin film transistor, for example, using an organic semiconductor. Specifically, the organic semiconductor layer OS is formed after the gate electrode G, the gate insulation layer 1, the source electrode S, the drain electrode D, and the pixel electrode P are formed as shown in FIG. 1.

The thin film transistor (TFT) may be made of an inorganic semiconductor or an organic semiconductor. While an amorphous silicon series is known in the art as the inorganic semiconductor thin film transistor, an organic semiconductor thin film transistor may also be used. If the thin film transistor is configured by using this organic semiconductor, it is possible to form the thin film transistor using a print technique or a droplet applying technique. In addition, out of the organic semiconductor thin film transistors, the field effect transistor FET shown in FIG. 1 is particularly preferable.

The electrode formation unit 92 includes the droplet applying device 120, the heat processing device BK, and the cutting device 130.

The droplet applying device 120 according to the present embodiment includes, for example, a droplet applying device 120G used to form the gate electrode G, a droplet applying device 120I used to form the gate insulation layer 1, a droplet applying device 120SD used to form the source electrode S, the drain electrode D, and the pixel electrode P, a droplet applying device 120OS used to form the organic semiconductor OS, or the like.

Figure 4:
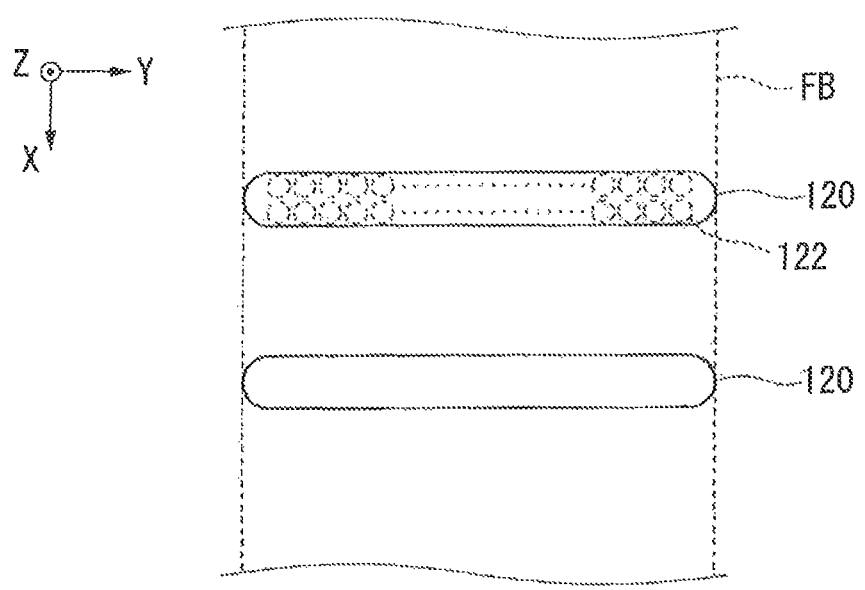
FIG. 4 illustrates a configuration of a droplet applying device.

FIG. 4 is a plan view illustrating a configuration of the droplet applying device 120. FIG. 4 illustrates a configuration of the droplet applying device 120 as seen from the +Z-side. The droplet applying device 120 extends along the Y-axis direction. A non-illustrated driving device is provided in the droplet applying device 120. The droplet applying device 120 is movable, for example, in the X direction, the Y direction, and the θZ direction by the driving device.

A plurality of nozzles 122 are formed in the droplet applying device 120. The nozzle 122 is provided in a plane facing the sheet substrate FB in the droplet applying device 120. The nozzles 122 are arranged, for example, along the Y-axis direction, and a line of nozzles 122 (nozzle lines) are formed, for example, in two lines. The control unit 104 can have all of the nozzles 122 collectively applied the droplet, or independently adjusted the timing for applying the droplet in each nozzle 122.

The droplet applying device 120 may employ, for example, an inkjet technique, a dispenser technique, or the like. The inkjet technique may include a charge control type, a pressurized vibration type, an electro-mechanical conversion type, an electro-heat conversion type, an electrostatic suction type, or the like. In the droplet applying method, materials are used in less waste, and a desired amount of the material can be accurately set to a desired position. In addition, the amount of a single droplet of metal ink applied by the droplet applying method may be set to, for example, 1 to 300 nanograms.

Returning to FIG. 2, the droplet applying device 120G applies metal ink within the barrier BA of the gate bus line GBL. The droplet applying device 120I applies electrically insulated ink made of polyimide-based resin or urethane-based resin to the switching unit. The droplet applying device 120SD applies metal ink within the barrier BA of the source bus line SBL and the barrier BA of the pixel electrode P. The droplet applying device 120OS applies the organic semiconductor ink to the switching unit between the source electrode S and the drain electrode D.

The metal ink is a liquid of which conductors having a particle diameter of approximately 5 nm stably disperse in a solvent at room temperature, and carbon, silver (Ag), or gold (Au) may be used as the conductor. The compound making the organic semiconductor ink may include a single crystal material, an amorphous material, a low-molecular material, or a polymer material. More preferably, as the compound of the organic semiconductor ink, there are a single crystal of condensed aromatic hydrocarbon compound such as pentacene, triphenylene, or anthracene, or n-conjugated polymer.

Each heat processing device BK is disposed in the +X-side (downstream side in the substrate transport direction) of each droplet applying device 120. The heat processing device BK is configured to, for example, blast hot air or radiate far infrared rays to the sheet substrate FB. The heat processing device BK dries or bakes the droplet applied on the sheet substrate FB using such heat radiation to cure the droplet.

The cutting device 130 is provided in the upstream side of the droplet applying device 120OS in the +X-side of the droplet applying device 120SD. The cutting device 130 cuts the source electrode S and the drain electrode D formed by the droplet applying device 120SD, for example, using laser light or the like. The cutting device 130 includes a non-illustrated light source and a Galvano mirror 131 for irradiating the laser light from the light source onto the sheet substrate FB.

As the laser light, laser having a wavelength absorbed by the metal film to be cut is preferable, and doubled, tripled, or quadrupled harmonic waves of a wavelength conversion laser such as YAG is more preferable. In addition, by using the pulsed laser, it is possible to prevent heat diffusion and reduce damage in other areas than the cut portions. When aluminum is used as a material, a femto-second laser beam having a wavelength of 760 nm is preferably used.

In the present embodiment, for example, a femto-second laser irradiation unit using a titanium sapphire laser is used as the light source. The femto-second laser irradiation unit radiates a pulse of laser light LL, for example, having a frequency of 10 KHz to 40 KHz.

In the present embodiment, since the femto-second laser is used, the fabricating can be carried out in a sub-micron order, and an interval between the source electrode S and the drain electrode D which determines performance of a field effect transistor can be accurately cut. The interval between the source electrode S and the drain electrode D is set to, for example, 3 μm to 30 μm approximately.

For example, another way to the aforementioned femto-second laser, a carbon dioxide gas laser or a green laser may be used. Furthermore, another way to laser, it may be configured to be cut mechanically using a dicing saw or the like.

The Galvano mirror 131 is arranged in the middle of the optical path of the laser light LL. The Galvano mirror 131 reflects laser light LL from the light source to the sheet substrate FB. The Galvano mirror 131 is rotatably provided, for example, in the θX direction, the θY direction, and the θZ direction. The irradiation position of the laser light LL is adjusted by rotating the Galvano mirror 131.

By using both the barrier formation unit 91 and the electrode formation unit 92 described above, it is possible to form the thin film transistor or the like using the print technique or the droplet applying technique without a so-called photolithography process. For example, when only the electrode formation unit 92 which adopts the print technique, the droplet applying technique and the like is used, it may fail manufacturing the thin film transistor with high precision due to ink bleeding or spreading.

On the contrary, since the barrier BA is formed by using the barrier formation unit 91, it is possible to prevent the ink bleeding or spreading. In addition, the interval between the source electrode S and the drain electrode D, which determines the performance of the thin film transistor, is formed through laser machining or mechanical machining.

The light-emitting layer formation unit 93 is arranged in the +X-side of the electrode formation unit 92. In the light-emitting layer formation unit 93, components of the organic EL device such as the light-emitting layer IR and the pixel electrode ITO are formed on the sheet substrate FB where the electrodes have been provided. The light-emitting layer formation unit 93 includes the droplet applying device 140 and the heat processing device BK.

The light-emitting layer IR formed in the light-emitting layer formation unit 93 contains a host compound and a phosphorescence compound (also called a phosphorescence emission compound). The host compound refers to the compound contained in the light-emitting layer. The phosphorescence compound emits light in an excited triplet state and emits phosphorescent light at room temperature.

In the present embodiment, as the droplet applying device 140, for example, the droplet applying device 140Re for forming a red light-emitting layer, the droplet applying device 140Gr for forming a green light-emitting layer, the droplet applying device 140Bl for forming a blue light-emitting layer, the droplet applying device 140I for forming an insulation layer, the droplet applying device 140IT for forming a pixel electrode ITO, and the like are used.

The droplet applying device 140 may adopt an inkjet method or a dispenser method similar to the aforementioned droplet applying device 120. When the organic EL element 50 includes a hole transport layer and an electron transport layer and the like as a component, a device for forming such layers (such as a droplet applying device) should be separately provided.

The droplet applying device 140Re applies an R-solution on the pixel electrode P. The droplet applying device 140Re is adopted to adjust the discharge amount of the R-solution so as to provide a film thickness of 100 nm after drying. The R-solution includes, for example, a solution obtained by dissolving polyvinylcarbazole (PVK) as a host material mixed with a red dopant in 1,2-dichloroethane.

The droplet applying device 140Gr applies a G-solution on the pixel electrode P. The G-solution includes, for example, a solution obtained by dissolving polyvinylcarbazole (PVK) as a host material mixed with a green dopant in 1,2-dichloroethane.

The droplet applying device 140Bl applies a B-solution on the pixel electrode P. The B-solution includes, for example, a solution obtained by dissolving polyvinylcarbazole (PVK) as a host material mixed with a blue dopant in 1,2-dichloroethane.

The droplet applying device 120I applies electrically insulated ink on a part of the gate bus line GBL or the source bus line SBL. As the electrically insulated ink, for example, polyimide-based resin ink or urethane-based resin ink is used.

The droplet applying device 120IT applies indium tin oxide (ITO) ink on the red, green, and blue light-emitting layers. As the ITO ink, a compound obtained by adding several percent of tin oxide ($SnO_2$) to indium oxide ($In_2O_3$) is used. In addition, an amorphous material such as IDIXO ($In_2O_3$—ZnO) that can be used to manufacture a transparent conductive film may be used. The transparent conductive film preferably has a transmittance more than 90%.

Each heat processing device BK is disposed in the +X-side (a downstream side in the substrate transport direction) of each droplet applying device 140. The heat processing device BK is able to be, for example, blast hot air or radiate far infrared rays to the sheet substrate FB, similar to the heat processing device BK used in the electrode formation unit 92. The heat processing device BK dries or bakes the droplet applied on the sheet substrate FB using such heat radiation to cure the droplet.

The alignment unit 107 includes a plurality of alignment cameras CA (CA1 to CA8) provided along the X direction. The alignment camera CA may capture an image using a CCD or CMOS element under visible light illumination and process the captured image to detect the position of the alignment mark AM. Alternatively, the alignment camera CA may irradiate laser light onto the alignment mark AM and receive the dispersed light therefrom to detect the position of the alignment mark AM.

The alignment camera CA1 is disposed in the +X-side of the heat transfer roller 115. The alignment camera CA1 detects the position of the alignment mark AM formed by the heat transfer roller 115 on the sheet substrate FB. Each alignment camera CA2 to CA8 is disposed in the +X-side of the heat processing device BK. The alignment cameras CA2 to CA8 detect the position of the alignment mark AM on the sheet substrate FB passing through the heat processing device BK.

By passing through the heat transfer roller 115 and the heat processing device BK, the sheet substrate FB may be stretched or contracted in the X-axis direction and the Y-axis direction. By disposing the alignment camera CA, in this manner, in the +X-side of the heat transfer roller 115 or the heat processing device BK which performs the heat processing, it is possible to detect a positional deviation of the sheet substrate FB caused by thermal deformation or the like.

The detection results from the alignment cameras CA1 to CA8 are transmitted to the control unit 104. The control unit 104 adjusts, for example, the applying position or timing of the ink from the droplet applying device 120 or the droplet applying device 140, the supply speed of the sheet substrate FB from the substrate supply unit 101, the transport speed of the roller RR, the movement in the Y direction by the roller RR, the cutting position or timing of the cutting device 130, or the like based on the detection results from the alignment cameras CA1 to CA8.

(Substrate Cartridge)

In the present embodiment, the substrate cartridge 1 is used as the substrate supply unit 101 and the substrate recovery unit 103. In the following descriptions, for convenience descriptions, an XYZ rectangular coordinates system similar to that of FIG. 2 is established, and a positional relationship of each member will be described referring to the XYZ rectangular coordinates system. In the following XYZ rectangular coordinates system, a case where the substrate cartridge 1 is used as the substrate supply unit 101 while the substrate supply unit 101 is connected to the substrate processing unit 102 will be exemplarily described.

Figure 5:
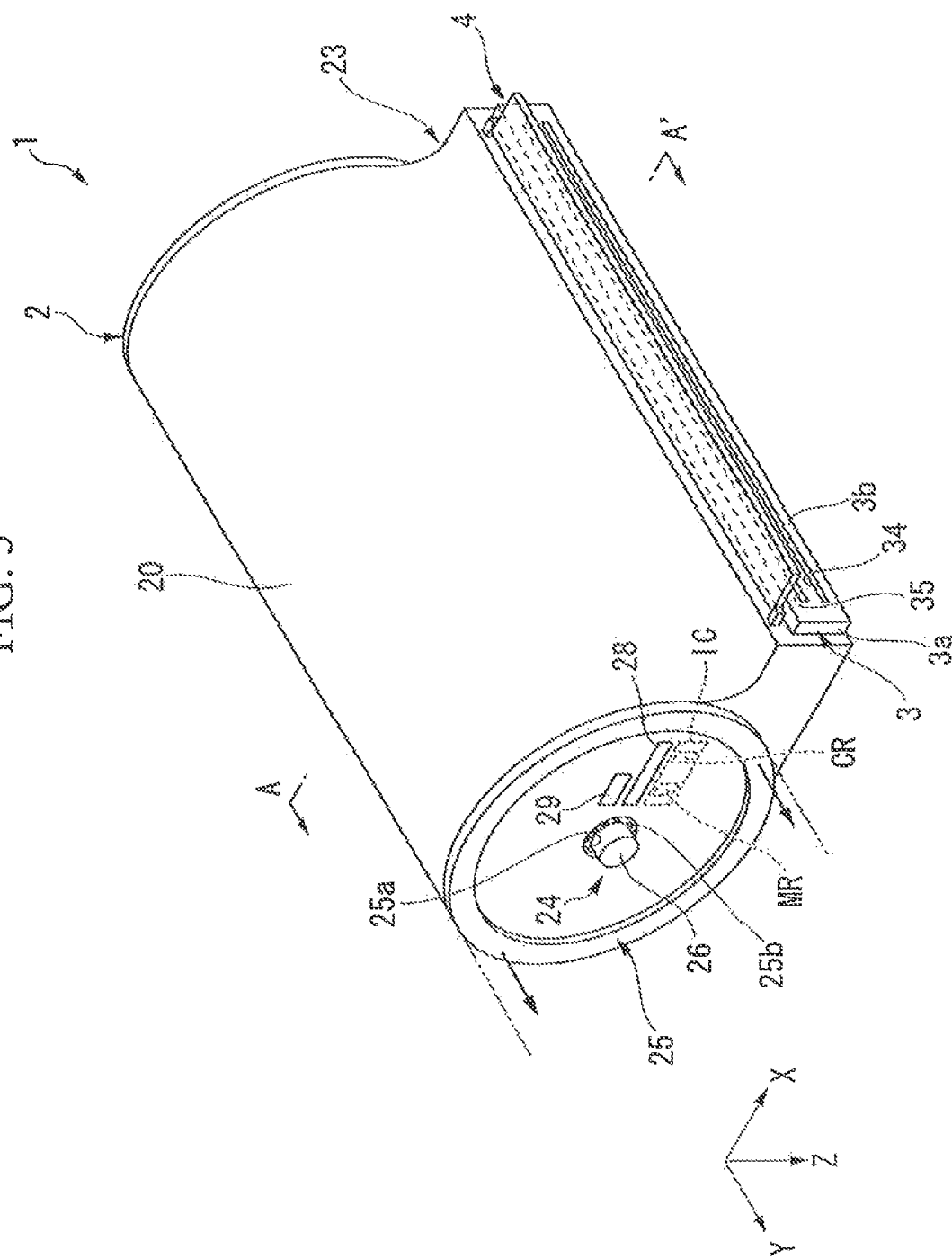
FIG. 5 is a perspective view illustrating a configuration of a substrate cartridge.
Figure 6:
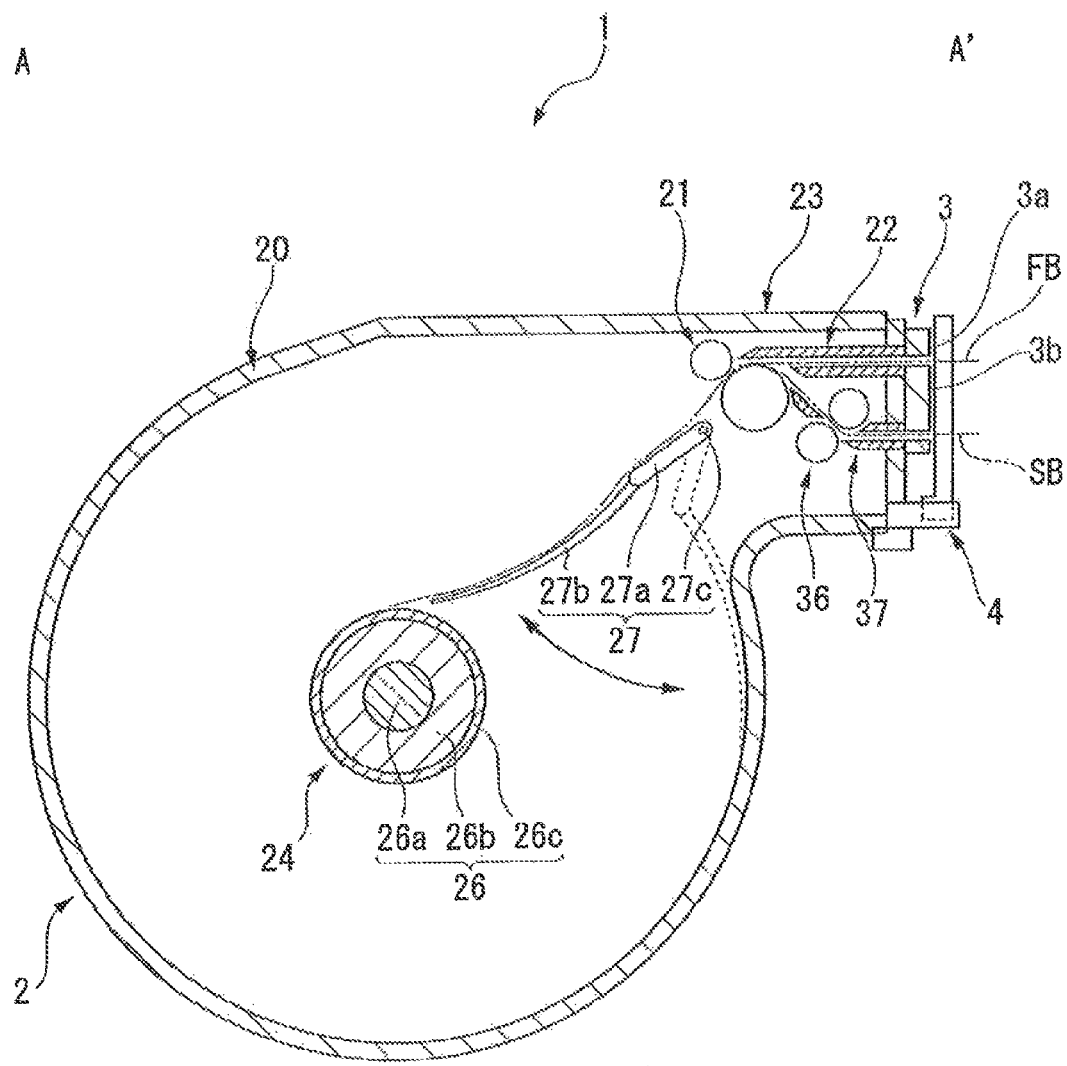
FIG. 6 is a cross-sectional view illustrating a configuration of a substrate cartridge.

FIG. 5 is a perspective view illustrating a configuration of the substrate cartridge 1. In addition, FIG. 6 illustrates a cross-sectional configuration taken along the line A-A' of FIG. 5. As shown in FIGS. 5 and 6, the substrate cartridge 1 includes a cartridge mainframe 2, a mount portion 3, and a blocking unit 4.

The cartridge mainframe 2 is a part for accommodating the sheet substrate FB. The cartridge mainframe 2 includes an accommodation unit 20, a transport unit (transport mechanism) 21, a substrate guide unit 22, a second substrate transport unit 36, and a second substrate guide unit 37. In addition, the aforementioned mount portion 3 is provided in the cartridge mainframe 2. In addition, for example, the cartridge mainframe 2 is made of aluminum or duralumin.

The accommodation unit 20 is a part for accommodating the sheet substrate FB. For example, the accommodation unit 20 has a cylindrical shape to accommodate the sheet substrate FB wound in a roll shape, and a part thereof is protruded toward the +X-side (protrusion 23). In the present embodiment, it extends in the Y direction in the drawing. The accommodation unit 20 has a cap 25 and a substrate driving mechanism 24.

The cap 25 is provided in an end portion of the +Y or −Y-side of the accommodation unit 20. The cap 25 is detachably provided in the accommodation unit 20. The internal side of the accommodation unit 20 can be accessed by detaching the cap 25 from the accommodation unit 20. As an open/close mechanism of the cap 25, for example, threads for engaging the cap 25 and the accommodation unit 20 with each other may be provided, or the cap 25 and the accommodation unit 20 may be connected using a hinge mechanism. The cap 25 has a window 28 and a display 29.

The window 28 is made of, for example, a material that can transmit visible light such as glass or plastic. The inside of the accommodation unit 20 can be observed through the window 28. The display 29 is a portion for displaying information such as a condition of the sheet substrate FB. The display 29 displays dimensions such as the length of the sheet substrate FB accommodated in the accommodation unit 20 and a remaining length of the sheet substrate FB.

The substrate driving mechanism 24 is a part for performing operation for winding the sheet substrate FB and operation for supplying the sheet substrate FB. The substrate driving mechanism 24 is provided inside the accommodation unit 20. The substrate driving mechanism 24 has a roller (shaft) 26 and a guide 27. As shown in FIG. 6, the roller 26 has a rotational shaft member 26a, an enlarged radius portion 26b, and an attaching portion 26c.

The rotational shaft member 26a is a cylindrical member formed of high rigidity metal such as aluminum. The rotational shaft member 26a is rotatably supported, for example, through the bearing member 25b and the opening 25a provided in the center of the cap 25. In this case, the center axis of the rotational shaft member 26a is aligned, for example, in parallel with the Y direction so as to rotate the rotational shaft member 26a in the θY direction.

The rotational shaft member 26a is connected to a non-illustrated rotation driving mechanism. By controlling the rotation driving mechanism, the rotational shaft member 26a is rotated with respect to the center axis. The rotation driving mechanism can rotate the rotational shaft member 26a, for example, in either the +θY or −θY direction as shown in FIG. 6.

The enlarged radius portion 26b is formed to have a uniform thickness on the surface of the rotational shaft member 26a. The enlarged radius portion 26b is formed to integrally rotate with the rotational shaft member 26a. The attaching portion 26c is formed to have a uniform thickness on the surface of the enlarged radius portion 26b as seen in a cross-sectional view. The attaching portion 26c is made of a material having adhesion capable of attaching the sheet substrate FB.

The guide 27 has a pivot member (first guide member) 27a and a leading end member (first guide member) 27b. The pivot member 27a is installed in the accommodation unit 20, for example, through a shaft 27c in its one end, and pivotably provided in the θY direction with respect to the shaft 27c. The pivot member 27a is connected to the non-illustrated rotation driving mechanism.

The leading end member 27b is connected to the other end of the pivot member 27a as seen in a cross-sectional view. For example, the leading end member 27b is formed to have an arc-shaped rounded surface as seen in a cross-sectional view. The sheet substrate FB is guided to the roller 26 through the arc-shaped rounded surface in the +Z-side provided in the leading end member 27b as seen in a cross-sectional view. The leading end member 27b is integrally pivoted with the pivot member 27a. For example, when the pivot member 27a is pivoted to be apart from the roller 26 (outwardly in the radial direction of the roller 26), it makes contact along the inner circumference of the accommodation unit 20. Therefore, it is possible to avoid contact between the sheet substrate FB wound around the roller 26 and the leading end member 27b.

The mount portion 3 is a part connected to the substrate processing unit 102. The mount portion 3 is provided, for example, in an end of the +X-side of the protrusion 23 of the accommodation unit 20. The mount portion 3 has an insert 3a for connecting with the substrate processing unit 102. When the substrate cartridge 1 is used as the substrate supply unit 101, the mount portion 3 is connected to the supply side connecting portion 102A of the substrate processing unit 102. When the substrate cartridge 1 is used as the substrate recovery unit 103, the mount portion 3 is connected to the recovery side connecting portion 102B of the substrate processing unit 102. Even when the mount portion 3 is connected to any one of the substrate supply unit 101 or the substrate recovery unit 103 of the substrate processing unit 102, it can be detachably connected.

The mount portion 3 is provided with an opening 34 and a second opening 35. The opening 34 is provided in the +Z-side and is a part for carrying the sheet substrate FB in/out the cartridge mainframe 2. The cartridge mainframe 2 accommodates the sheet substrate FB through the opening 34. The sheet substrate FB accommodated in the cartridge mainframe 2 is supplied to an external side from the cartridge mainframe 2 through the opening 34.

The second opening 35 is provided in the −Z-side and is a part for carrying the stripe-shaped second substrate SB different from the sheet substrate FB in/out the cartridge mainframe 2. Such a second substrate SB may include, for example, a protection substrate for protecting an element formation face of the sheet substrate FB or the like. For example, an interleaving paper may be used as the protection substrate. The second opening 35 is arranged, for example, to have a gap for the opening 34. The second opening 35 is formed, for example, to have the same dimensions and shape as those of the opening 34. In addition, in the present embodiment, a material having conductivity such as a stainless steel thin plate (e.g., having a thickness less than 0.1 mm) may be used as the second substrate SB. In this case, if the second substrate SB is electrically connected to the cartridge mainframe 2 when the second substrate SB is accommodated in the cartridge mainframe 2 together with the sheet substrate FB, it is possible to prevent the sheet substrate FB from being charged.

Figure 7:
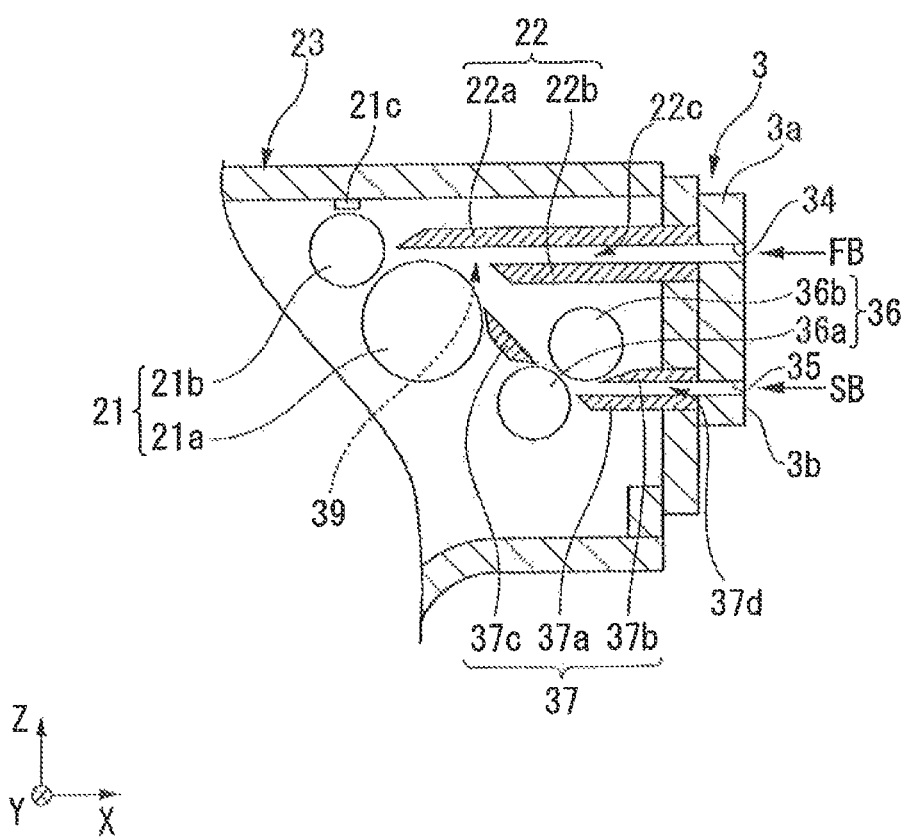
FIG. 7 is an expanded illustration of a cross-section of the substrate cartridge.

For example, the transport unit 21, the substrate guide unit 22, the second substrate transport unit 36, and the second substrate guide unit 37 are provided inside the protrusion 23. FIG. 7 is a cross-sectional view exaggeratingly illustrating the vicinity of the protrusion 23 of FIG. 6. In FIG. 7, some components are intentionally omitted to facilitate understanding of the drawings.

The substrate guide unit 22 is provided between the opening 34 and the transport unit 21. The substrate guide unit 22 is a part for guiding the sheet substrate FB between the opening 34 and the transport unit 21. The substrate guide unit 22 includes substrate guide members 22a and 22b. The substrate guide members 22a and 22b face each other to be separated with a gap 22c in the Z direction and their facing surfaces are respectively provided nearly in parallel with the XY plane. The gap 22c is connected to the opening 34, and the sheet substrate FB is movable through the opening 34 and the gap 22c.

The second substrate guide unit 37 is a part for guiding the second substrate SB between the mount portion 3 and the transport unit 21. The second substrate guide unit 37 includes second substrate guide members 37a, 37b, and 37c. The second substrate guide members 37a and 37b face each other to be separated with a gap 37d in the Z direction and their facing surfaces are provided nearly in parallel with the XY plane. The second substrate guide member 37c is disposed with inclination to guide the second substrate SB to the +Z-side. Specifically, the −X-side end portion of the second substrate guide member 37c is arranged for inclining in the +Z-side with respect to the +X-side end portion thereof.

The second substrate transport unit 36 transports the second substrate SB between the mount portion 3 and the transport unit 21. The second substrate transport unit 36 is disposed between the second substrate guide members 37a and 37b and the second substrate guide member 37c. The second substrate transport unit 36 has an active roller 36a and a passive roller 36b. The active roller 36a is rotatably provided, for example, in the BY direction and connected to the non-illustrated rotation driving mechanism. The passive roller 36b is disposed to be apart from the active roller 36a with a gap so as to interpose and hold the second substrate SB with the active roller 36a. In other words, the second substrate SB is interposed and held between the active roller 36a and the passive roller 36b.

The transport unit 21 transports the sheet substrate FB and the second substrate SB between the mount portion 3 and the accommodation unit 20. The transport unit 21 includes a tension roller (tension mechanism) 21a and a measurement roller (measurement unit) 21b. The tension roller 21a is a roller for applying tension to the sheet substrate FB and the second substrate SB between the tension roller 21a and the roller 26. The tension roller 21a is rotatably provided in the BY direction. A non-illustrated rotation driving mechanism is connected, for example, to the tension roller 21a. In addition, the tension roller 21a and the measurement roller 21b may be respectively movably provided in the Z direction in FIG. 7.

The measurement roller 21b has a smaller diameter than that of the tension roller 21a. The measurement roller 21b is disposed to be separated from the tension roller 21a with a predetermined gap so as to be able to interpose and hold the sheet substrate FB and the second substrate SB with the tension roller 21a. The size of the gap between the measurement roller 21b and the tension roller 21a may be configured to be adjustable to interpose and hold only the sheet substrate FB or a combination of the sheet substrate FB and the second substrate SB. The measurement roller 21b is a passive roller rotating accompanied by rotation of the tension roller 21a.

By rotating the tension roller 21a while interposing the sheet substrate FB between the tension roller 21a and the measurement roller 21b, it is possible to transport the sheet substrate FB in the winding direction and the supplying direction of the sheet substrate FB respectively while applying tension to the sheet substrate FB.

The transport unit 21 includes, for example, a detection unit 21c for detecting a rotation number or a rotation angle of the measurement roller 21b. For example, an encoder may be used as the detection unit 21c. For example, by using the detection unit 21c, it is possible to measure the transport distance of the sheet substrate FB through the measurement roller 21b.

The cartridge mainframe 2 is provided with an information processing unit IC (refer to FIG. 5). The information processing unit IC includes, for example, an IC chip or the like, and is embedded, for example, in the cartridge mainframe 2. The information processing unit IC is provided with a memory unit MR for storing processing information of the substrate processing apparatus 100 and the substrate cartridge 1, a communication unit CR, for example, for communicating processing information with the control unit 104, or the like.

Such processing information may include, for example, information on a takt or a throughput of the substrate processing apparatus 100, information on a transport speed of the substrate cartridge 1 or a winding/feeding speed of the roller 26, information on the sheet substrate FB, or the like. The term "takt" refers to a processing time in a unit area of processing (e.g., an area that can be processed by the droplet applying device 120 or 140 or the like at one time, or a screen area or an entire panel area in a single panel of the organic EL element 50). The term "throughput" refers to a quantity of the sheet substrates FB that can be processed in a unit time (e.g., the length, the number of panels, the number of the substrate cartridges 1, or the like).

For example, when the sheet substrate FB is inserted through the opening 34, and the second substrate SB is inserted through the second opening 35, the sheet substrate FB and the second substrate SB are guided by the substrate guide unit 22 and the second substrate guide unit 37, respectively, and join together in the joining portion 39. The sheet substrate FB and the second substrate SB joining at the joining portion 39 are transported by the transport unit 21 while they are joining together. At this moment, the transport unit 21 presses the sheet substrate FB and the second substrate SB to be in close contact with each other. Thus, the transport unit 21 also functions as a pressing machinery for pressing the second substrate SB onto the sheet substrate FB.

Referring to FIGS. 5 and 6, the blocking unit 4 is provided in the +X side end of the protrusion 23. The blocking unit 4 blocks the opening 34 and the second opening 35 in response to the connection state between the mount portion 3 and the substrate processing unit 102. The blocking unit 4 has a cap member 41 and a switching mechanism 42.

Figure 8:
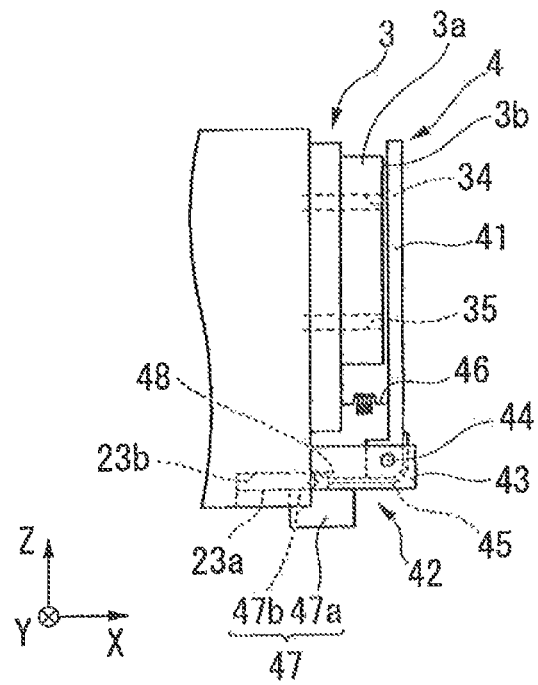
FIG. 8 is a lateral view illustrating a configuration of a part of the substrate cartridge.
Figure 9:
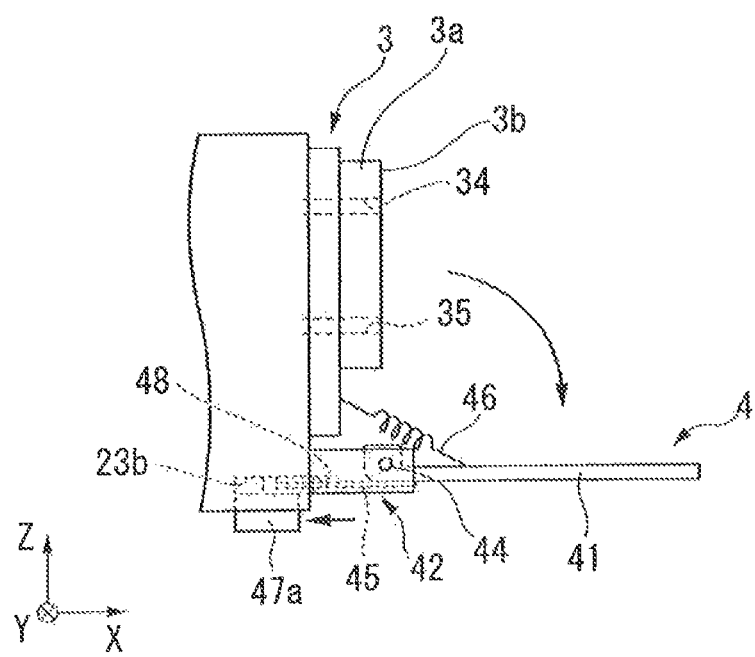
FIG. 9 is a side elevation illustrating a configuration of a part of the substrate cartridge.

FIGS. 8 and 9 illustrate an enlarged view of the +X side end of the protrusion 23 and a configuration of the blocking unit 4.

As shown in FIGS. 8 and 9, the cap member 41 is formed to have dimensions that cover an end face 3b of the mount portion 3. The cap member 41 is installed in the mount portion 3 through a fixing member 43 and a shaft 44.

The fixing member 43 is fixed to abut on the +X side end of the protrusion 23. The shaft 44 is rotatably supported by the fixing member 43. The cap member 41 is integrated with the shaft 44. For this reason, the cap member 41 is rotatable around the shaft 44. The cap member 41 has a closed state in which the end face 3b of the mount portion 3 is covered as shown in FIG. 8 and also has an opened state in which the end face of the mount portion 3 is not covered as shown in FIG. 9. The cap member 41 is provided to open or close the opening 34 and the second opening 35 provided on the end face 3b by rotating around the shaft 44.

The switching mechanism 42 is a portion for switching to open or close the cap member 41. The switching mechanism 42 has a belt member 45, an elastic member 46, and a movable member 47.

The belt member 45 is formed by using a flexible material. One end of the belt member 45 is fixed in the cap member 41, and the other end is fixed in the movable member 47. The elastic member 46 connects between the cap member 41 and the protrusion 23 so that the cap member 41 and the protrusion 23 are attracted to each other by an elastic force. Therefore, unless an external force is added, the cap member 41 enters a closed state by virtue of the elastic force of the elastic member 46.

The movable member 47 is disposed, for example, in the −Z side of the fixing member 43. The movable member 47 has a head 47a and a belt fixation 47b.

Meanwhile, a trench 48 is formed in the −Z side of the fixing member 43. The trench 48 is formed, for example, along the X direction. A trench 23a is provided in the −Z side of the protrusion 23 along the −X direction from a portion making contact with the fixing member 43. A trench 23b is provided in the bottom of the trench 23a along the trench 23a. The trench 23b is formed along the extension line of the aforementioned trench 48 and is connected to the trench 48.

The belt fixation 47b is inserted into the trench 48 of the fixing member 43. Therefore, the movable member 47 can move in the direction (X direction) along the trench 48 while the belt fixation 47b is inserted into the trench 48. The +X side end of the trench 48 is formed to abut on the belt fixation 47b when the cap member 41 is in a closed state.

The trench 23a is formed such that the dimensions of the Y direction are approximately equal to the dimensions of the Y direction of the head 47a, and the head 47a can enter into the trench 23a from the side of the fixing member 43. A trench 23b is provided in the bottom of the trench 23a along the trench 23a. The trench 23b is formed along the extension line of the aforementioned trench 48 and is connected to the trench 48. The −X side end of the trench 23a is formed to abut on the head 47a, for example, when the cap member 41 is opened approximately by 90° with respect to the closed state.

For example, by moving the movable member 47 to the −X direction with respect to the fixing member 43 by virtue of an external force or the like, the belt fixation 47b moves toward the −X direction, and the belt member 45 is stretched to the −X side. The cap member 41 connected to the belt member 45 is opened by pulling (straining) the belt member 45 as shown in FIG. 9. By releasing the external force from the state shown in FIG. 9, the cap member 41 is attracted to the protrusion 23 by virtue of the elastic force of the elastic member 46, and the cap member 41 is returned to the closed state as shown in FIG. 8. The belt member 45 is pulled to the +X side by the cap member 41, and the movable member 47 is also returned to an original position when the cap member 41 is switched from the opened state to the closed state.

(Operation of Accommodating Sheet Substrate in Substrate Cartridge)

Figure 10:
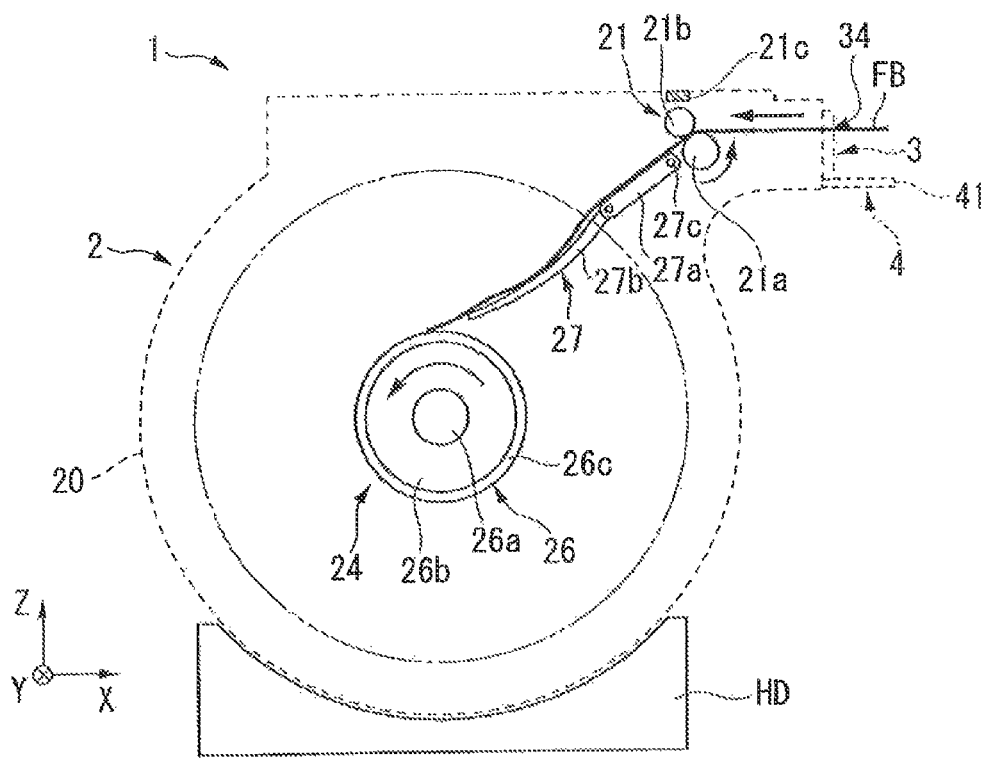
FIG. 10 illustrates an accommodating operation of the substrate cartridge.
Figure 11:
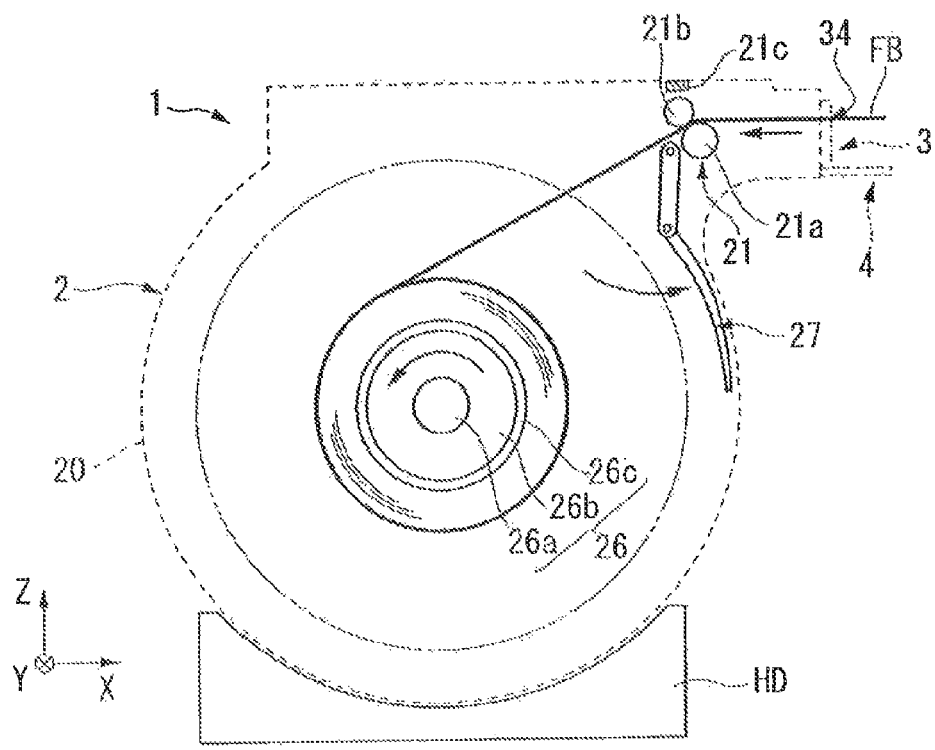
FIG. 11 illustrates an accommodating operation of the substrate cartridge.

Next, an operation of accommodating the sheet substrate FB in the substrate cartridge 1 configured as described above will be described. FIGS. 10 and 11 illustrate states of the substrate cartridge 1 during the accommodating operation. In FIGS. 10 and 11, in order to facilitate discrimination, the contour of the substrate cartridge 1 is shown as a dashed line.

As shown in FIGS. 10 and 11, when the sheet substrate FB is accommodated in the substrate cartridge 1, for example, the cap member 41 of the blocking unit 4 enters the opened state by attracting the movable member 47 to the side of the protrusion 23 so that the substrate cartridge 1 is held in the holder HD. In this state, the sheet substrate FB is inserted from the opening 34. When the sheet substrate FB is inserted, the tension roller 21a and the rotating shaft member 26a (roller unit 26) are set to have a rotatable state.

The sheet substrate FB inserted through the opening 34 is guided to the transport unit 21 by the substrate guide unit 22. In the transport unit 21, the sheet substrate FB is transported to the accommodation unit 20 while being interposed between the tension roller 21a and the measurement roller 21b. As the measurement roller 21b is rotated, the transport length of the sheet substrate FB is detected, for example, by the detection unit 21c.

The sheet substrate FB transported to the accommodation unit 20 by the transport unit 21 is guided while being warped to the −Z direction due to the self weight. In the present embodiment, since the guide unit 27 is provided in the −Z side of the sheet substrate FB, the sheet substrate FB is guided to the roller unit 26 along the pivot member 27a and the leading end member 27b of the guide unit 27.

As the leading end of the sheet substrate FB reaches the attaching portion 26c of the roller unit 26, the leading end of the sheet substrate FB is attached to the attaching portion 26c. In this state, as the roller unit 26 rotates, the sheet substrate FB is steadily attached to the attaching portion 26c, and the sheet substrate FB is wound around the roller unit 26. After the sheet substrate FB is attached to the attaching portion 26c, the sheet substrate FB is transported in order not to bend the sheet substrate FB between the roller unit 26 and the transport unit 21, for example, while adjusting the rotation speed of the tension roller 21a and the rotation speed of the rotational shaft member 26a.

After the sheet substrate FB is wound around the roller unit 26, for example, in a single turn, the guide unit 27 is withdrawn as shown in FIG. 11. By rotating the roller unit 26 in this state, the sheet substrate FB is steadily wound around the roller unit 26. While the winding thickness of the sheet substrate FB gradually increases, the sheet substrate FB does not make contact with the guide unit 27 because the guide unit 27 has been already withdrawn.

After winding the sheet substrate FB as much as a desired length, for example, the external portion of the sheet substrate out of the opening 34 is cut out so that the cap member 41 of the blocking unit 4 becomes a closed state. In this manner, the sheet substrate FB is accommodated in the substrate cartridge 1. During the operation of accommodating the sheet substrate FB, for example, the entire length of the sheet substrate FB accommodated in the substrate cartridge 1 may be calculated based on the measurement length of the sheet substrate FB measured by the detection unit 21c. In addition, the calculation result may be displayed on the display unit 29, stored in the memory unit MR, or transmitted using the communication unit CR.

In addition, for example, the sheet substrate FB may be wound while an operator observes the internal side of the accommodation unit 20 through the window 28. In this case, for example, the winding operation may be performed while checking whether or not the sheet substrate FB is wound in a bent state or whether or not the wound shape (rolled shape) of the sheet substrate FB has deviated. When a trouble occurs, the winding operation may be immediately stopped.

(Operation of Substrate Processing Apparatus)

Next, the operations of the substrate processing apparatus 100 configured as described above will be described.

In the present embodiment, an operation of connecting the substrate cartridge 1 accommodating the sheet substrate FB to the supply side connecting portion 102A as a substrate supply unit 101, an operation of supplying the sheet substrate FB accommodated in the substrate cartridge 1 by the substrate supply unit 101, an operation of forming elements by the substrate processing unit 102, and an operation of removing the substrate cartridge 1 are sequentially performed.

Figure 12:
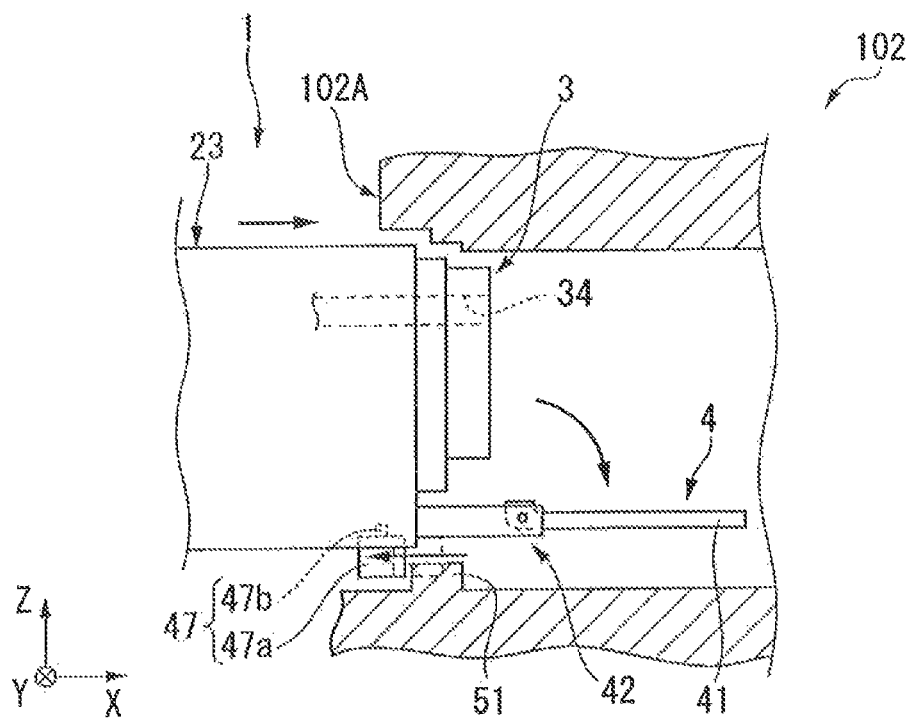
FIG. 12 illustrates a connection operation of the substrate cartridge.

First, an operation of connecting the substrate cartridge 1 will be described. FIG. 12 illustrates an operation of connecting the substrate cartridge 1.

As shown in FIG. 12, the supply side connecting portion 102a includes an insertion hole having a shape corresponding to the mount portion 3 and an engagement portion 51 for engagement with the movable member 47.

In the connecting operation, while the substrate cartridge 1 is held in the holder (e.g., having the same configuration as that of the holder HD of FIG. 10), positioning between the mount portion 3 and the supply side connecting portion 102a is performed. After the positioning, the mount portion 3 is moved to the +X side to be inserted into the substrate processing unit 102. At this moment, the movable member 47 engaged with the engagement portion 51 relatively moves in the −X direction with respect to the mount portion 3. For this reason, when the mount portion 3 is connected to the substrate processing unit 102, the cap member 41 enters an opened state.

Figure 13:
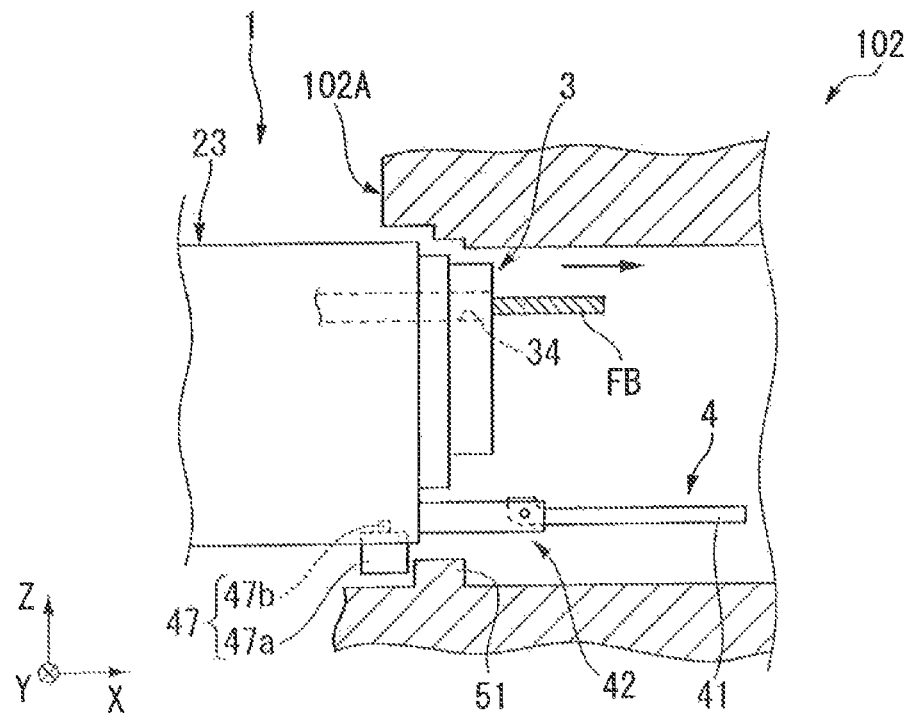
FIG. 13 illustrates a connection operation of the substrate cartridge.

Next, a supply operation will be described. In order to supply the sheet substrate FB to the substrate processing unit 102, for example, the tension roller 21a and the rotational shaft member 26a (roller unit 26) of the substrate cartridge 1 are rotated in the direction reversed to that of the accommodating operation so as to supply the sheet substrate FB through the opening 34 as shown in FIG. 13.

Next, an element formation operation will be described. In the element formation operation, while the sheet substrate FB is supplied from the substrate supply unit 101 to the substrate processing unit 102 as shown in FIG. 2, elements are formed on the sheet substrate FB in the substrate processing unit 102. As shown in FIG. 3, the sheet substrate FB is transported by the roller RR in the substrate processing unit 102.

The control unit 104 may communicate processing information, for example, with the substrate cartridge 1 and perform control of the operations of the substrate processing unit 102 based on the processing information. Specifically, the rotation speed of each roller RR of the substrate processing unit 102 may be adjusted according to the supply speed of the sheet substrate FB from the substrate cartridge 1. In addition, the control unit 104 detects whether or not the roller RR has deviated in the Y-axis direction and moves the roller RR to correct the position in case of detecting having deviated. In addition, the control unit 104 also performs the position correction of the sheet substrate FB.

The sheet substrate FB supplied from the substrate supply unit 101 to the substrate processing unit 102 is first transported to the barrier formation unit 91. In the barrier formation unit 91, the sheet substrate FB is clamped and pressed by the imprint roller 110 and the heat transfer roller 115, and the barrier BA and the alignment mark AM are formed through heat transfer.

Figure 14:
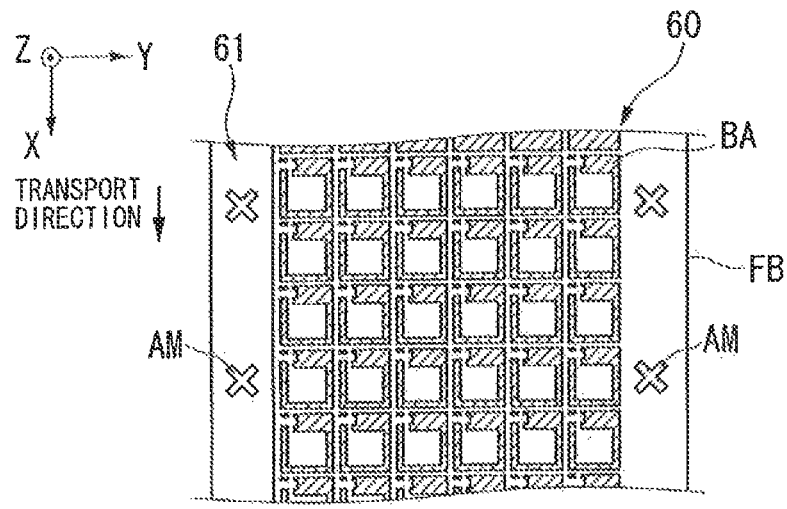
FIG. 14 illustrates a process of forming a barrier in the substrate processing unit.
Figure 15:
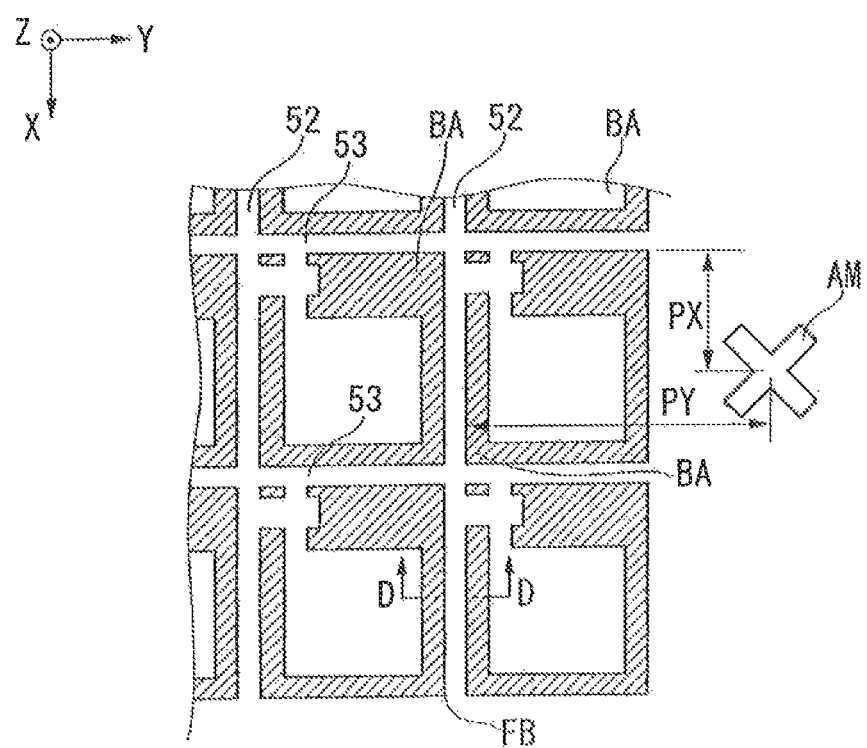
FIG. 15 illustrates a shape and an arrangement of the barriers formed in the sheet substrate.
Figure 16:
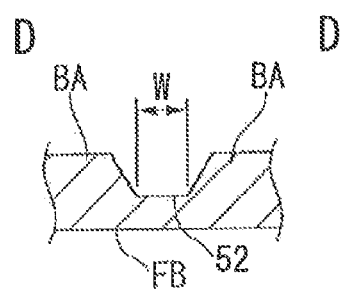
FIG. 16 is a cross-sectional view illustrating the barrier formed in the sheet substrate.

FIG. 14 illustrates a state where the barrier BA and the alignment mark AM are formed on the sheet substrate FB. FIG. 15 illustrates an expanded part of FIG. 14. FIG. 16 illustrates a cross-sectional configuration taken along the line D-D of FIG. 15. FIGS. 14 and 15 illustrate the sheet substrate FB as seen from the +Z side.

As shown in FIG. 14, the barrier BA is formed in the element formation area 60 of the center in the Y direction of the sheet substrate FB. As shown in FIG. 15, an area to form the gate bus line GBL and the gate electrode G, (a gate formation area 52), and an area to form the source bus line SBL, the source electrode S, drain electrode D, and the positive electrode P, (a source/drain formation area 53), are partitioned in the element formation area 60 by forming the barrier BA. As shown in FIG. 16, the gate formation area 52 has a trapezoidal shape as seen in a cross-sectional view. Although not shown in the drawings, the source/drain formation area 53 has the same shape. The internal width W (μm) of the barrier BA is the same as the line width of the gate bus line GBL. The width W is preferably set to double to quadruple the diameter d (μm) of the droplet applied from the droplet applying device 120G.

Furthermore, the cross-sectional shapes of the gate formation area 52 and the source/drain formation area 53 preferably have a V-shape or U-shape as seen in a cross-sectional view in order to make it easy to exfoliate the sheet substrate FB after pressing by a fine imprint mold 11. It may also have other shapes such as a rectangular shape as seen in a cross-sectional view.

Meanwhile, as shown in FIG. 14, a pair of alignment marks AM is formed in the edge areas 61 of both ends in the Y direction of the sheet substrate FB. The barrier BA and the alignment mark AM are simultaneously formed because a mutual positional relationship is important. As shown in FIG. 15, a predetermined distance PY between the alignment mark AM and the gate formation area 52 is defined in the Y-axis direction, and a predetermined distance PX between the alignment mark AM and the source/drain formation area 53 is defined in the X-axis direction. Therefore, it is possible to detect a deviation in the X-axis direction, a deviation in the Y-axis direction, and a θ-rotation of the sheet substrate FB based on the positions of a pair of the alignment marks AM.

In FIGS. 14 and 15, a pair of the alignment marks AM is provided in each plurality of rows of the barriers BA in the X-axis direction, but not limited thereto. For example, an alignment mark AM may be provided in each row of the barriers BA. In addition, if there is space, the alignment mark AM may be provided in the element formation area 60 as well as the edge area 61 of the sheet substrate FB. In addition, although, in FIGS. 14 and 15, the alignment mark AM has a cross shape, it may take other shapes such as a circular mark and a slanted-linear mark.

Subsequently, the sheet substrate FB is transported to the electrode formation unit 92 by the transport roller RR. In the electrode formation unit 92, the droplet is applied using each droplet applying device 120 to form electrodes over the sheet substrate FB.

Figure 17:
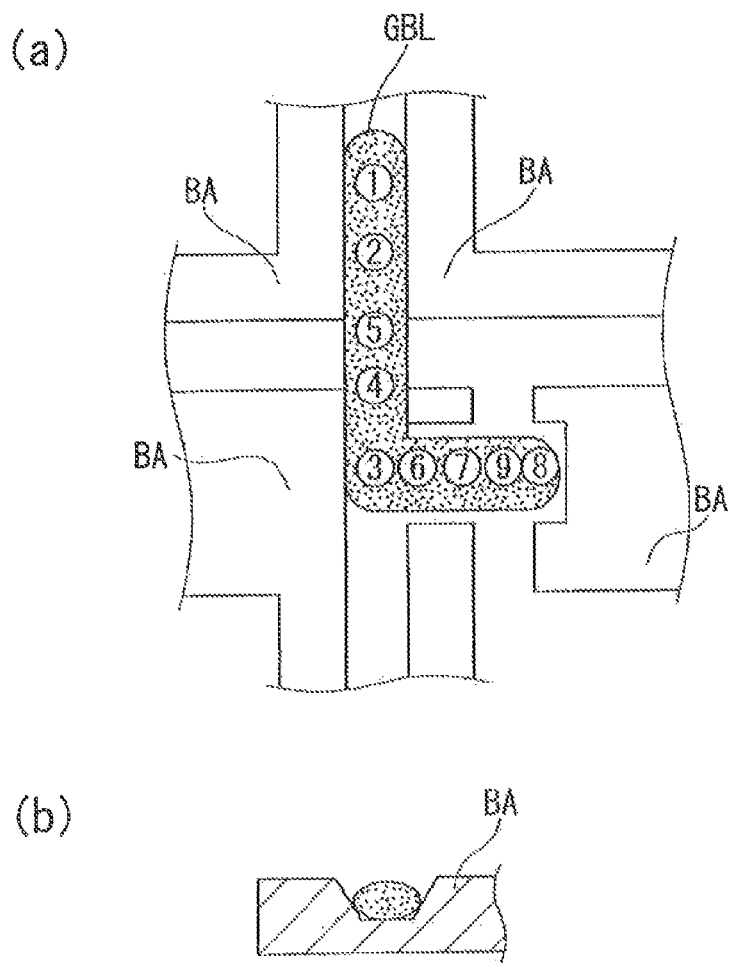
FIG. 17 illustrates a droplet applying operation.

First, the gate bus line GBL and the gate electrode G are formed on the sheet substrate FB by the droplet applying device 120 G. FIGS. 17(*a*) and 17(*b*) illustrate the sheet substrate FB where the droplet is applied by the droplet applying device 120G.

As shown in FIG. 17(*a*), the droplet applying device 120G applies metal ink in the order of, for example, 1 to 9 in the gate formation area 52 of the sheet substrate FB having the barriers BA. This order is, for example, a sequence of applying the metal ink in the linear shape by the tensional force of the metal inks. FIG. 17(*b*) illustrates, for example, a state where a single droplet of the metal ink is applied. As shown in FIG. 17(*b*), since the barrier BA is provided, the metal ink applied in the gate formation area 52 is not diffused but held. In this manner, the metal ink is applied on the entire gate formation area 52.

Figure 18:
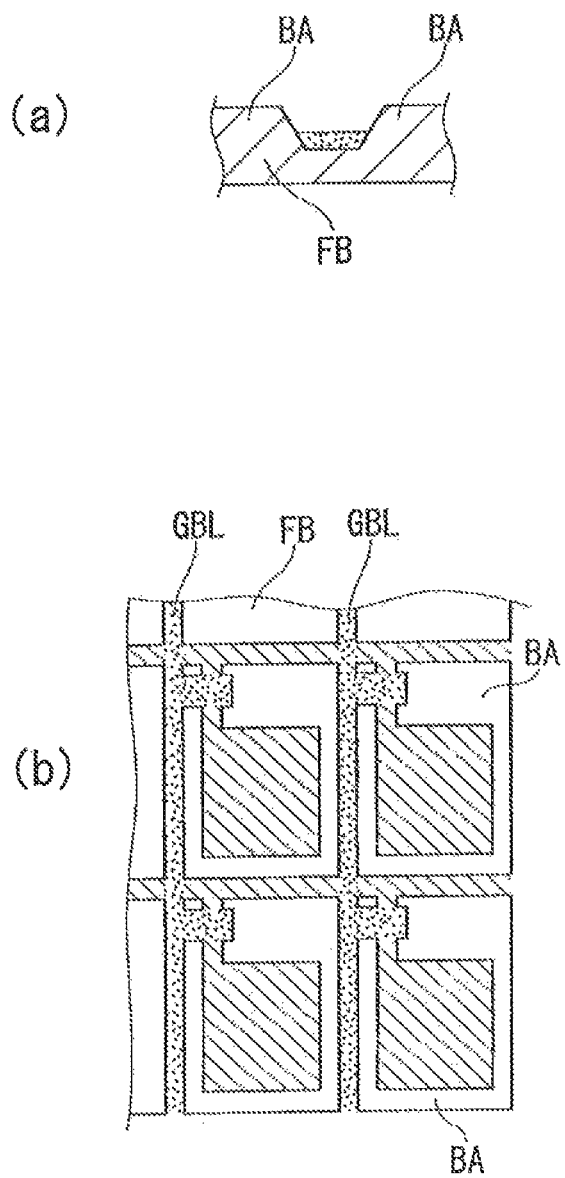
FIG. 18 illustrates a configuration of a thin film formed between the barriers.

After the metal ink is applied on the gate formation area 52, the sheet substrate FB is transported such that the portion where the metal ink is applied is positioned in the −Z side of the heat processing device BK. The heat processing device BK performs heat processing on the metal ink applied on the sheet substrate FB to dry the metal ink. FIG. 18(*a*) illustrates a state of the gate formation area 52 after the metal ink is dried. As shown in FIG. 18(*a*), by drying the metal ink, the conductor included in the metal ink is laminated in a thin film state. Such a thin-filmed conductor is formed in the entire gate formation area 52 so that the gate bus line GBL and the gate electrode G are provided on the sheet substrate FB as shown in FIG. 18(*b*).

Figure 19:
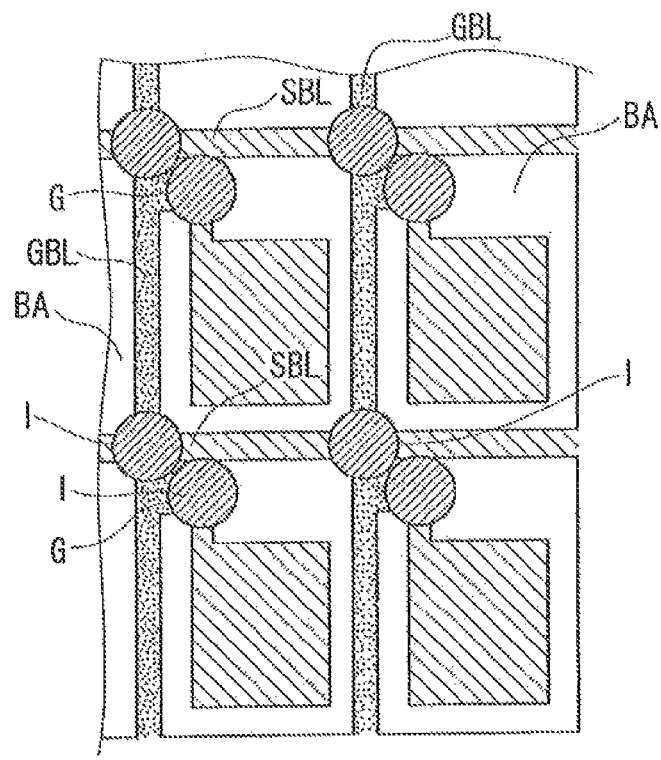
FIG. 19 illustrates a process of forming a gate insulation layer in the sheet substrate.

Next, the sheet substrate FB is transported to the −Z side of the droplet applying device 120I. Electrically insulated ink is applied on the sheet substrate FB by the droplet applying device 120I. The droplet applying device 120I applies electrically insulated ink on the gate bus line GBL and the gate electrode G passing though the source/drain formation area 53, for example, as shown in FIG. 19.

After the electrically insulated ink is applied, the sheet substrate FB is transported to the −Z side of the heat processing device BK, and a heat processing is applied to the electrically insulated ink by the heat processing device BK. Through the heat processing, the electrically insulated ink is dried to form the gate insulation layer 1. While, in FIG. 19, the gate insulation layer 1 is formed to have a circular shape across the barrier BA, it is not necessary to form the gate insulation layer 1 across the barrier BA.

Figure 20:
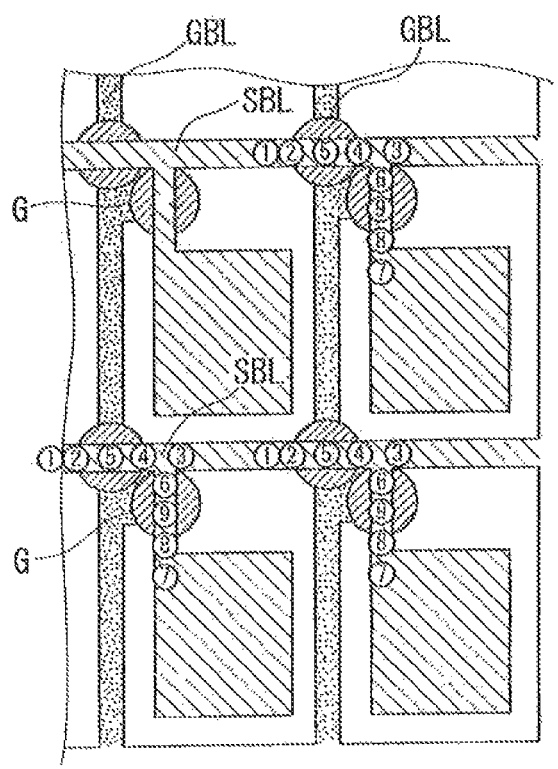
FIG. 20 illustrates a process of cutting a wiring of the sheet substrate.

After the gate insulation layer 1 is formed, the sheet substrate FB is transported to the −Z side of the droplet applying device 120SD. In the droplet applying device 120SD, metal ink is applied on the source/drain formation area 53 of the sheet substrate FB. The metal ink is discharged, for example, in the sequence of 1 to 9 as shown in FIG. 20 for the portion crossing over the gate insulation layer 1 within the source/drain formation area 53.

After the metal ink is discharged, the sheet substrate FB is transported to the −Z side of the heat processing device BK to perform the drying process of the metal ink. After the drying process, the conductor included in the metal ink is layered in a thin film so as to form the source bus line SBL, the source electrode S, the drain electrode D, and the positive electrode P. However, in this stage, the source electrode S and the drain electrode D are connected to each other.

Figure 21:
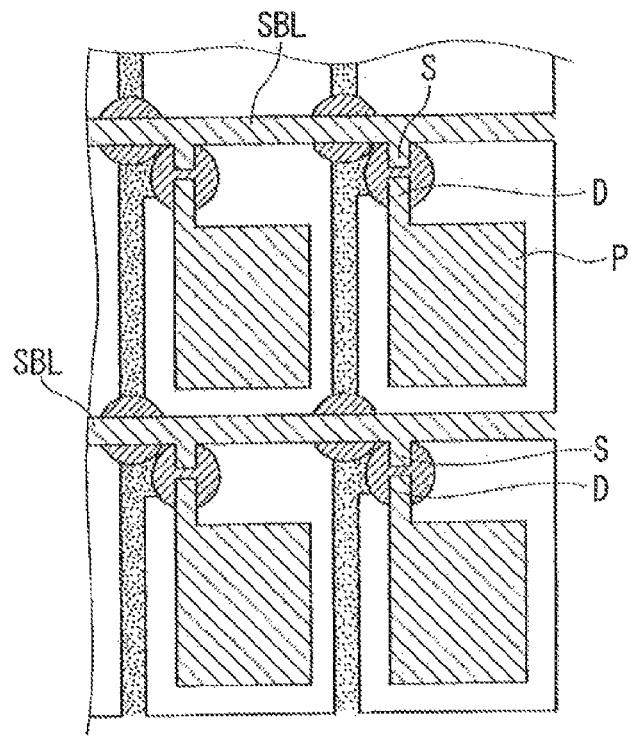
FIG. 21 illustrates a process of forming a thin film in a source-drain formation area.

Next, the sheet substrate FB is transported to the −Z side of the cutting device 130. The source electrode S and the drain electrode D on the sheet substrate FB are disconnected by the cutting device 130. FIG. 21 illustrates a state where the source electrode S and the drain electrode D are disconnected by the cutting device 130. The cutting device 130 performs disconnection while adjusting the irradiation position of the laser light LL onto the sheet substrate FB using the Galvano mirror 131.

After the source electrode S and the drain electrode D are disconnected, the sheet substrate FB is transported to the −Z side of the droplet applying device 120OS. The organic semiconductor layer OS is formed on the sheet substrate FB by the droplet applying device OS. In the area of the sheet substrate FB overlapping with the gate electrode G, the organic semiconductor ink is discharged across the source electrode S and the drain electrode D.

Figure 22:
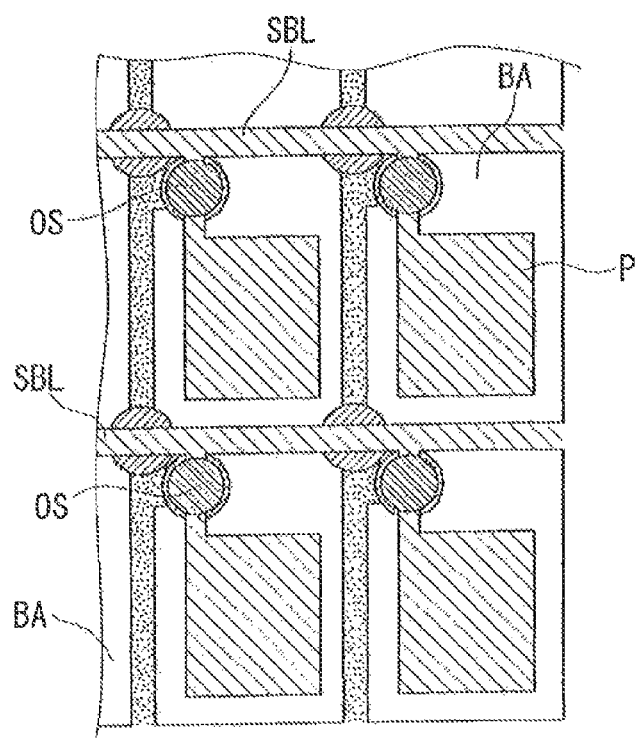
FIG. 22 illustrates a process of forming an organic semiconductor layer.

After the organic semiconductor ink is discharged, the sheet substrate FB is transported to the −Z side of the heat processing device BK to dry the organic semiconductor ink. After the drying process, the semiconductor included in the organic semiconductor ink is layered in a thin film to form the organic semiconductor OS as shown in FIG. 22. Through the aforementioned process, a field effect transistor and a wiring are formed on the sheet substrate FB.

Subsequently, the sheet substrate FB is transported to the light-emitting layer formation unit 93 by the transport roller RR (refer to FIG. 3). Red, green, and blue light-emitting layers IR are respectively formed by the droplet applying device 140Re, the droplet applying device 140Gr, the droplet applying device 140Bl, and the heat processing device BK in the light-emitting layer formation unit 93. Since the barrier BA is formed on the sheet substrate FB, even when the red, green, and blue light-emitting layers IR are sequentially applied without performing heat processing in the heat processing device BK, a mixing of colors does not occur due to the solution overflowing to adjacent pixel areas.

After the light-emitting layer IR is formed, the sheet substrate FB passes through the droplet applying device 140I and the heat processing device BK to form the insulation layer 1 and passes through the droplet applying device 140IT and the heat processing device BK to form the transparent electrode IT. Through the aforementioned processes, an organic EL element 50 shown in FIG. 1 is formed on the sheet substrate FB.

Figure 23:
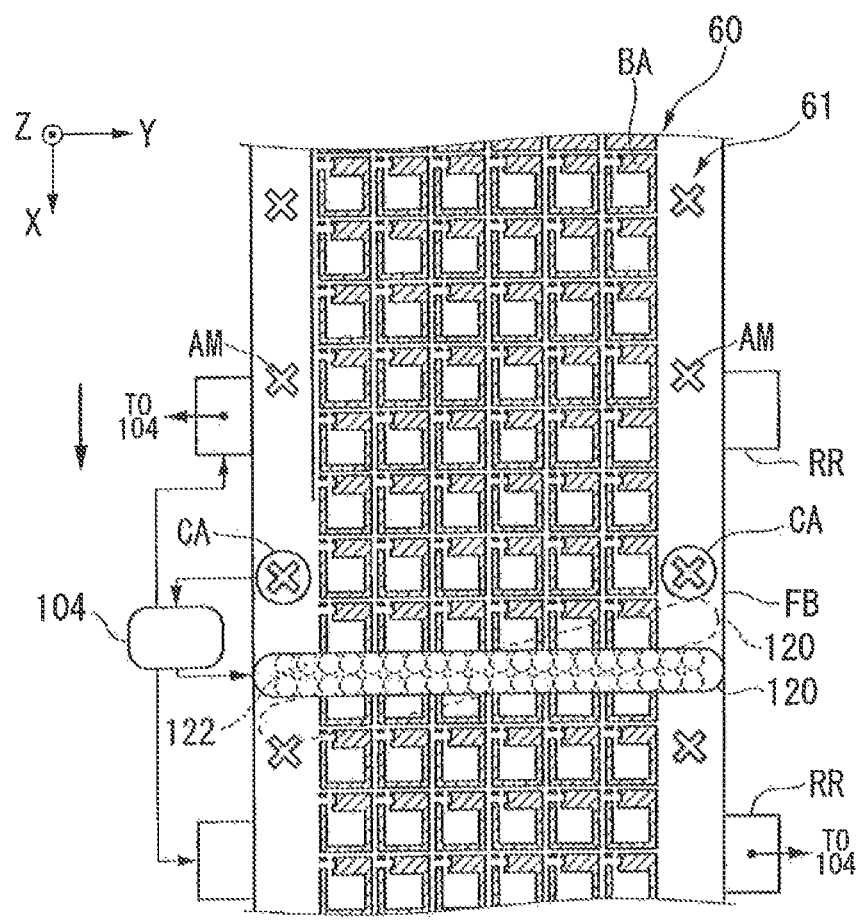
FIG. 23 illustrates an example of alignment.

In the element formation operation, in order to prevent the sheet substrate FB from deviating in the X direction, the Y direction, and the θZ direction in the step of forming the organic EK element 50 while transporting the sheet substrate FB as described above, an alignment operation is performed. Hereinafter, the alignment operation will be described with reference to FIG. 23.

In the alignment operation, a plurality of alignment cameras CA (CA1 to CA8) provided in each part appropriately detect the alignment mark AM formed on the sheet substrate FB and send the detection result to the control unit 104. The control unit 104 performs the alignment operation based on the transmitted detection result.

For example, the control unit 104 detects the transport speed of the sheet substrate FB based on such an image-captured (imaging) interval of the alignment mark AM detected by the alignment cameras CA (CA1 to CA8) and determines whether or not the roller RR is rotated, for example, at a predetermined speed. When it is determined that the roller RR is not rotated at a predetermined speed, the control unit 104 instructs the roller RR to adjust the rotation speed and return a feedback.

In addition, for example, the control unit 104 detects whether or not the position of the alignment mark AM in the Y direction has deviated based on the image-capturing result of the alignment mark AM to detect a positional deviation in the Y-axis direction of the sheet substrate FB. When the positional deviation is detected, the control unit 104 detects how long the positional deviation continues while transporting the sheet substrate FB.

If the positional deviation continues for a short time, a nozzle for applying the droplet is switched from a plurality of nozzles 122 of the droplet applying device 120. If the deviation in the Y-axis direction of the sheet substrate FB continues for a long time, a positional correction is performed in the Y-axis direction of the sheet substrate FB by moving the roller RR.

For example, the control unit 104 detects whether or not the sheet substrate FB has deviated in the θZ direction based on the positions in the X-axis and Y-axis directions of the alignment mark AM detected by the alignment camera CA. If the positional deviation is detected, the control unit 104 detects how long the positional deviation has continued while the sheet substrate FB has been transported in the same manner as in the detection of the positional deviation in the Y-axis direction.

If the positional deviation continues for a short time, a nozzle 122 for applying the droplet is switched in a plurality of nozzles 122 of the droplet applying device 120. If the deviation continues for a long time, the positional correction is performed in the θZ direction of the sheet substrate FB by moving two rollers RR, provided across the alignment camera CA which has detected the deviation, in the X or Y directions.

Next, a removal operation will be described. For example, the organic EL element 50 is formed on the sheet substrate FB, and the sheet substrate FB is recovered. Then, the substrate cartridge 1 used as the substrate supply unit 101 is removed from the substrate processing unit 102.

Figure 24:
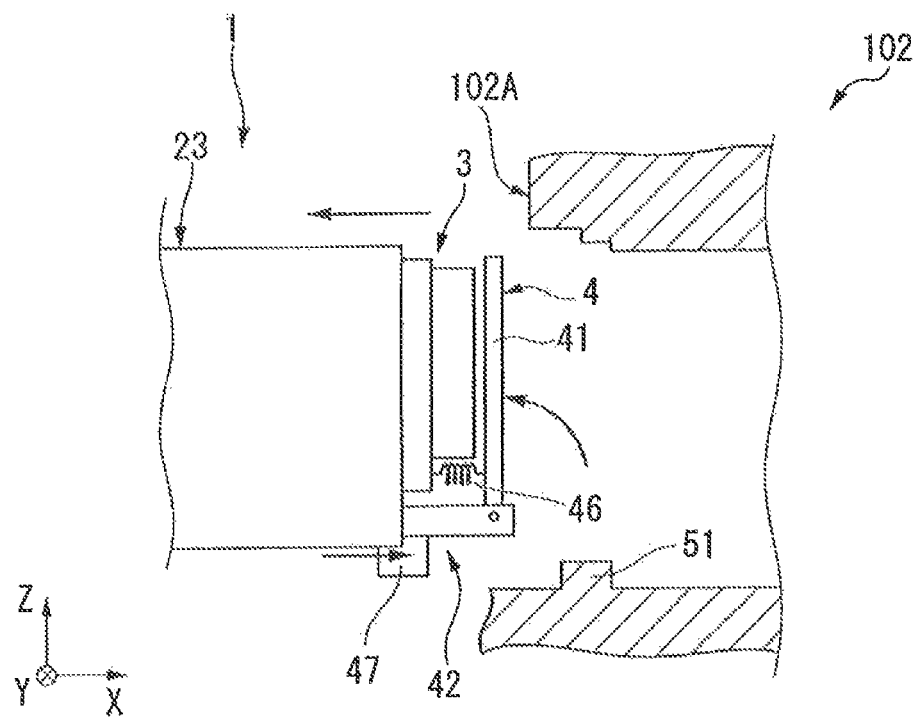
FIG. 24 illustrates a removal operation of the substrate cartridge.

FIG. 24 illustrates an operation of removing the substrate cartridge 1.

In the removal operation, the mount portion 3 is moved to the −X direction to evacuate from the supply side connecting portion 102A.

Since it is disengaged between the engagement member and the movable member 47 by evacuating the mount portion 3, the cap member 41 becomes a closed state by virtue of the elastic force of the elastic member 46. In this manner, in the blocking unit 4, the cap member 41 is opened when the mount portion 3 is connected to the substrate processing unit 102, and the cap member 41 is closed when the mount portion 3 is not connected to the substrate processing unit 102.

As described above, according to an embodiment of the present invention, there are provided the cartridge mainframe 2 that has an opening 34 where the flexible sheet substrate FB is carried in/out and accommodates the sheet substrate FB through the opening 34; the mount portion 3 that is provided in the cartridge mainframe 2 and is detachably connected to the supply side connecting portion 102A and the recovery side connecting portion 102B; and the blocking unit 4 that blocks the opening 34 depending on the connection state between the mount portion 3 and the supply side connecting portion 102A or the recovery side connecting portion 102B. Therefore, it is possible to prevent foreign objects such as dust from coming from the opening 34. As a result, it is possible to prevent foreign objects from being attached to the sheet substrate FB.

In addition, according to an embodiment of the present embodiment, it is possible to readily attach/detach the substrate cartridge 1 to/from a target object (such as the substrate processing unit 102).

Figure 25:
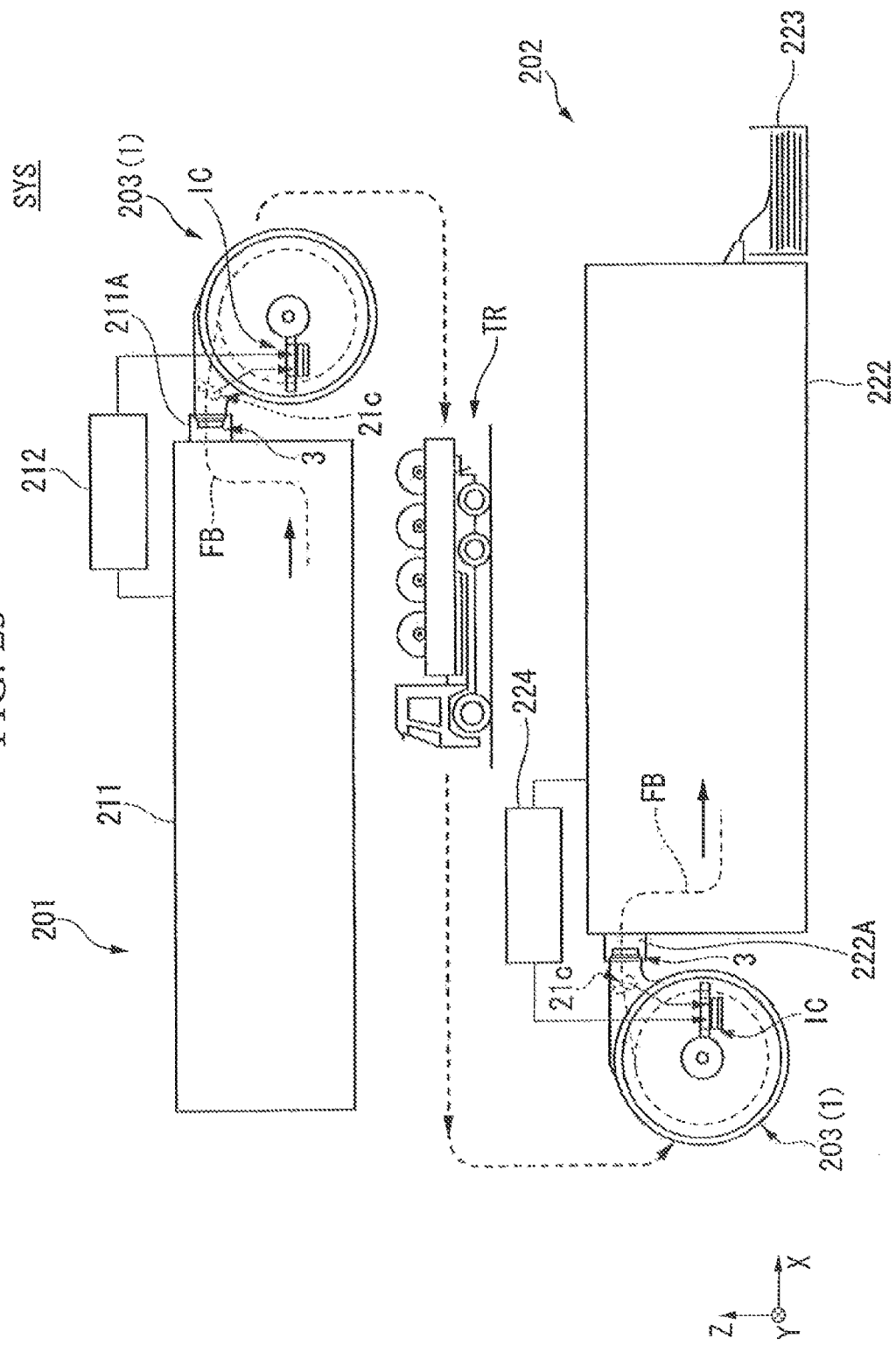
FIG. 25 illustrates a configuration of the substrate processing system.

FIG. 25 illustrates a configuration of the substrate processing system SYS according to an embodiment. In the following description, components the same as or similar to the aforementioned embodiments are denoted by the same reference symbols, and their description is simplified or omitted.

As shown in FIG. 25, the substrate processing system SYS has a substrate manufacturing apparatus (first processing apparatus) 201, a substrate processing apparatus 202 (second processing apparatus), and a relay apparatus (substrate relay apparatus) 203. The substrate manufacturing apparatus 201 and the substrate processing apparatus 202 are provided, for example, in different manufacturing lines, places, or factories.

The substrate manufacturing apparatus 201 is an apparatus for manufacturing a flexible strip-like sheet substrate FB as a first process as described in the aforementioned embodiment and includes a substrate manufacturing unit 211 and a control unit 212. The substrate manufacturing unit 211 manufactures the sheet substrate FB under control of the control unit 212.

The substrate processing apparatus 202 is an apparatus for forming the organic EL element 50 shown in FIG. 3 or the like in the sheet substrate FB as a second process. The substrate processing apparatus 202 includes a substrate processing unit 222, a substrate recovery unit 223, and a control unit 224. The substrate processing unit 222, the substrate recovery unit 223, and the control unit 224 have the same configurations as those of the substrate processing unit 102, the substrate recovery unit 103, and the control unit 104 shown in FIG. 2 or the like.

The relay apparatus 203 is formed to be attached/detached to/from both the substrate manufacturing apparatus 201 and the substrate processing apparatus 202. Specifically, the relay apparatus 203 is connected to a connecting portion 211A provided in the substrate manufacturing unit 211 of the substrate manufacturing apparatus 201 and a connecting portion 222A provided in the substrate processing unit 222 of the substrate processing apparatus 202 through the mount portion 3. In addition, the configurations of the connecting portions 211A and 222A are similar to the configuration of the supply side connecting portion 102A shown in FIG. 2 or the like.

The relay apparatus 203 is an apparatus for recovering the sheet substrate FB manufactured by the substrate manufacturing apparatus 201 and supplying the sheet substrate FB to the substrate processing apparatus 202. For example, the substrate cartridge 1 shown in FIG. 2 or the like is used as the relay apparatus 203. A detailed description of the relay apparatus 203 will be omitted.

In the substrate processing system SYS configured as described above, first, the relay apparatus 203 is connected to the connecting portion 211A of the substrate manufacturing apparatus 201. After connecting the relay apparatus 203 to the connecting portion 211A, the sheet substrate FB is supplied from the substrate manufacturing unit 211 to the relay apparatus 203. The relay apparatus 203 winds and recovers the sheet substrate FB by the operation similar to the operation shown in FIG. 10, FIG. 11 and the like.

In this case, for example, processing information such as information on takt or a throughput of the substrate manufacturing apparatus 201, information on a transport speed of the relay apparatus 203 or a winding/feeding speed of the roller 26, process information regarding an entire process or a completed (finished) process, and information regarding the sheet substrate FB such as the remaining length or the entire length of the sheet substrate FB are transmitted from the control unit 212 to the information processing unit IC of the relay apparatus 203 (refer to FIG. 5).

The aforementioned processing information transmitted to the information processing unit IC is received by the communication unit CR of the information processing unit IC and then stored in the memory unit MR or displayed on the display unit 29. In addition, information regarding the length of the sheet substrate FB detected by the detection unit 21c of the relay apparatus 203 is also transmitted to the information processing unit IC.

Next, the relay apparatus 203 that recovered the sheet substrate FB is transported to the substrate processing apparatus 202 using a delivery system TR such as a truck. After the relay apparatus 203 is transported to the substrate processing apparatus 202, the relay apparatus 203 is connected to the connecting portion 222A of the substrate processing apparatus 202 in the sequence shown in FIG. 12, FIG. 13 and the like, and the organic EL element 50 is formed on the sheet substrate FB in the substrate processing unit 222 while the sheet substrate FB is supplied from the relay apparatus 203.

At this moment, for example, the control unit 224 communicates with the information processing unit IC of the relay apparatus 203 and receives processing information stored in the information processing unit IC. Based on the received processing information, the control unit 224 performs control to execute each process of forming the organic EL element 50 while operations relating to the received processing information such as the transport speed of the sheet substrate FB and the heating time or the heating temperature of the heat transfer roller 115 and the heat processing device BK are adjusted. The sheet substrate FB having the organic EL element 50 is cut in a panel shape and recovered by the substrate recovery unit 223.

As described above, according to an embodiment of the present invention, there are provided the substrate manufacturing apparatus 201 that manufactures the flexible sheet substrate FB as a first process, the substrate processing apparatus 202 that forms the organic EL element 50 on the sheet substrate FB as the second process after manufacturing the sheet substrate FB, and the relay apparatus 203 that recovers the sheet substrate FB from the substrate manufacturing apparatus 201 and supplies the recovered sheet substrate FB to the substrate processing apparatus 202, wherein the substrate cartridge 1 is used as the relay apparatus 203. Therefore, it is possible to prevent dust or the like from adhering to the sheet substrate FB between the substrate manufacturing apparatus 201 and the substrate processing apparatus 202. In addition, the processing information of the substrate manufacturing apparatus 201 is supplied to the substrate processing apparatus 202 using the information processing unit IC provided in the relay apparatus 203, and the processing can be performed by the substrate processing apparatus 202 using the processing information. Therefore, it is possible to improve processing efficiency in the substrate processing apparatus 202. In addition, in the present embodiment, since the aforementioned substrate cartridge 1 is used as the relay apparatus 203, it is possible to readily recognize the length or the remaining length of the sheet substrate FB. Furthermore, in the present embodiment, since the substrate cartridge 1 is used as the relay apparatus 203, it is possible to readily segmentalize a plurality of processes such as the first and second processes.

Figure 26:
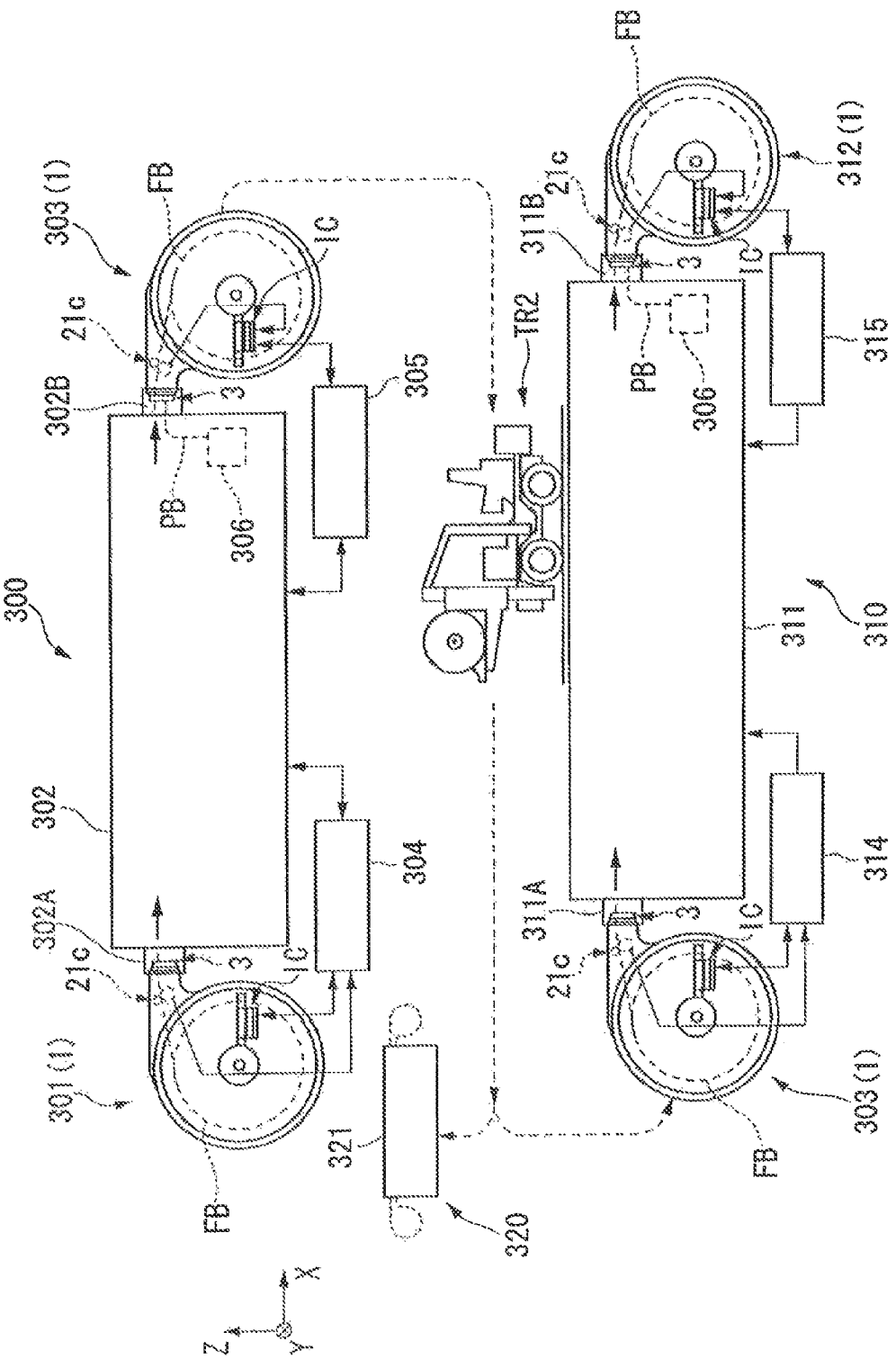
FIG. 26 illustrates a configuration of the substrate processing system.

FIG. 26 illustrates a configuration of the substrate processing system SYS2 according to an embodiment of the present invention. In the following description, components the same as or similar to the abovementioned embodiments are denoted by the same reference symbols, and their description is simplified or omitted.

As shown in FIG. 26, substrate processing system SYS2 has a first substrate processing apparatus (first processing apparatus) 300, second substrate processing apparatuses (second processing apparatus) 310 and 320, and a relay apparatus (substrate relay apparatus) 303. The first substrate processing apparatus 300 and the second substrate processing apparatuses 310 and 320 are provided, for example, in the same place or factory.

The first substrate processing apparatus 300 is, for example, an apparatus for forming the barrier BA of the organic EL element 50 on the sheet substrate FB. The second substrate processing apparatus 310 or 320 is, for example, an apparatus for forming an electrode (such as the gate electrode G), the light-emitting layer IR and the transparent electrode ITO of the organic EL element 50 on the sheet substrate FB. The second substrate processing apparatuses 310 and 320 have the same configuration. Hereinafter, in principle, a description will be given representatively of the second substrate processing apparatus 310 in order to describe a configuration or operation of the second substrate processing apparatus, but the same description may be possible for the second substrate processing apparatus 320.

As described above, the substrate processing system SYS2 has two kinds of apparatuses including the first substrate processing apparatus 300 and the second substrate processing apparatuses 310 and 320 as an apparatus for forming the organic EL element 50. The relay apparatus 303 is an apparatus which receives/transmits (relays) the sheet substrate FB from the first substrate processing apparatus 300 to the second substrate processing apparatuses 310 and 320. In the present embodiment, the substrate cartridge 1 having the same configuration as that shown in FIG. 5 or the like is used as the relay apparatus 303.

The first substrate processing apparatus 300 includes a substrate supply unit 301, a substrate processing unit 302, a first control unit 304, a second control unit 305, and a protection substrate supply unit 306. The substrate supply unit 301 has, for example, the same configuration as that of the substrate supply unit 101 shown in FIG. 2. The substrate processing unit 302 has the same configuration as that of the barrier formation unit 91 of the substrate processing apparatus 100 shown in FIG. 2, and a supply side connecting portion 302A is provided in a portion connected to the substrate supply unit 301. The supply side connecting portion 302A has the same configuration as that of the supply side connecting portion 102A shown in FIG. 2. As described above, the first substrate processing apparatus 300 has the same configuration as that between the substrate supply unit 101 of the substrate processing apparatus 100 and the barrier formation unit 91 of the substrate processing unit 102 shown in FIG. 2.

A recovery side connecting portion 302B connected to the mount portion 3 of the relay apparatus 303 is provided in the +X side end of the substrate processing unit 302. The recovery side connecting portion 302B has the same configuration as that of the supply side connecting portion 302A. The first control unit 304 receives the processing information stored in the information processing unit IC of the substrate supply unit 301 and performs control of the operation (such as operations for the process or the processing) of the substrate processing unit 302 based on the processing information. The second control unit 305 transmits the processing information regarding the substrate supply unit 301, the substrate processing unit 302, the sheet substrate FB, or the like to the information processing unit IC of the relay apparatus 303. The processing information may include, for example, information having contents as that of the processing information described in the aforementioned embodiments. The first substrate processing apparatus 300 may have a non-illustrated control device which collectively performs control and management for the first control unit 304 and the second control unit 305. The protection substrate supply unit 306 is provided, for example, in the +X side end of the substrate processing unit 302.

The second substrate processing apparatus 310 includes a substrate processing unit 311, a substrate recovery unit 312, a first control unit 314, and a second control unit 315. The substrate processing unit 311 has the same configuration as that of the electrode formation unit 92 and the light-emitting layer formation unit 93 of the substrate processing apparatus 100 shown in FIG. 2. The substrate processing unit 311 includes a supply side connecting portion 311A in the −X side end and the recovery side connecting portion 311B in the +X side end. The supply side connecting portion 311A and the recovery side connecting portion 311B have the same configurations as those of the supply side connecting portion 302A and the recovery side connecting portion 302B, respectively, described above.

The aforementioned relay apparatus 303 is detachably connected to the supply side connecting portion 311A. The first control unit 314 receives the processing information stored in the information processing unit IC of the relay apparatus 303 and performs control of the operations (such as operations for the process or processing) of the substrate processing unit 311 based on the processing information. The second control unit 315 transmits processing information regarding the relay apparatus 303, the substrate processing unit 311, the sheet substrate FB, or the like to the information processing unit IC of the substrate recovery unit 312. The processing information may include, for example, information having contents similar to contents of the processing information described in the aforementioned embodiments.

Next, in the substrate processing system SYS2 configured as described above, first, the sheet substrate FB is accommodated in the substrate cartridge 1, the substrate cartridge 1 is connected as the substrate supply unit 301 to the supply side connecting portion 302A of the substrate processing unit 302 of the first substrate processing apparatus 300. The substrate cartridge 1 is used as the substrate supply unit 301. In addition, the empty substrate cartridge 1 is connected as the relay apparatus 303 to the recovery side connecting portion 302B of the substrate processing unit 302.

Next, the sheet substrate FB is supplied from the substrate supply unit 301 to the substrate processing unit 302, and the barrier BA is formed by the substrate processing unit 302. In this case, the control units 304 and 305 communicate with the information processing unit IC of the substrate supply unit 301 and the information processing unit IC of the relay apparatus 303 to receive the information stored in the information processing unit IC. The control units 304 and 305 perform control to form the barrier BA while adjusting the operations regarding, for example, the received processing information such as the transport speed of the sheet substrate FB and the heating time or heating temperature of the heat transfer roller 115.

The sheet substrate FB having the barrier BA is supplied from the substrate processing unit 302 to the relay apparatus 303, and the supplied sheet substrate FB is wound in the roll shape and recovered by the relay apparatus 303. The relay apparatus 303 recovers the sheet substrate FB such that the protection substrate PB is disposed on the face where the barrier BA is formed within the sheet substrate FB.

Figure 27:
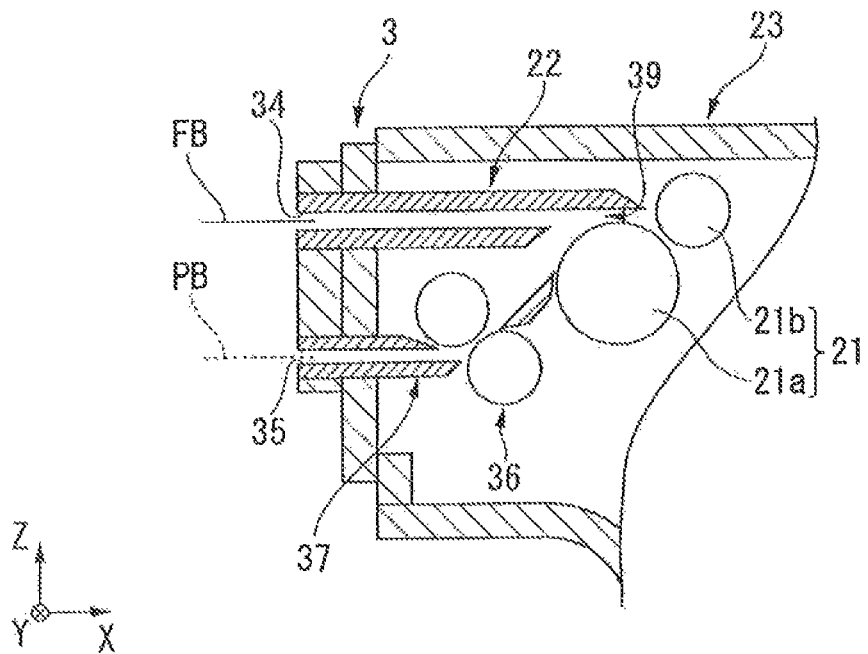
FIG. 27 illustrates a recovery operation of the sheet substrate FB.
Figure 28:
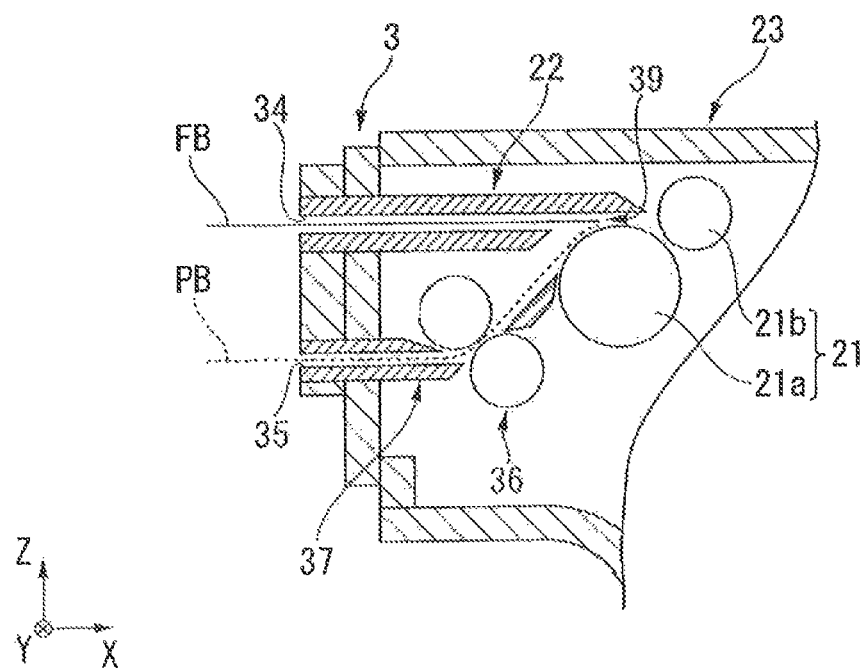
FIG. 28 illustrates a recovery operation of the sheet substrate FB.
Figure 29:
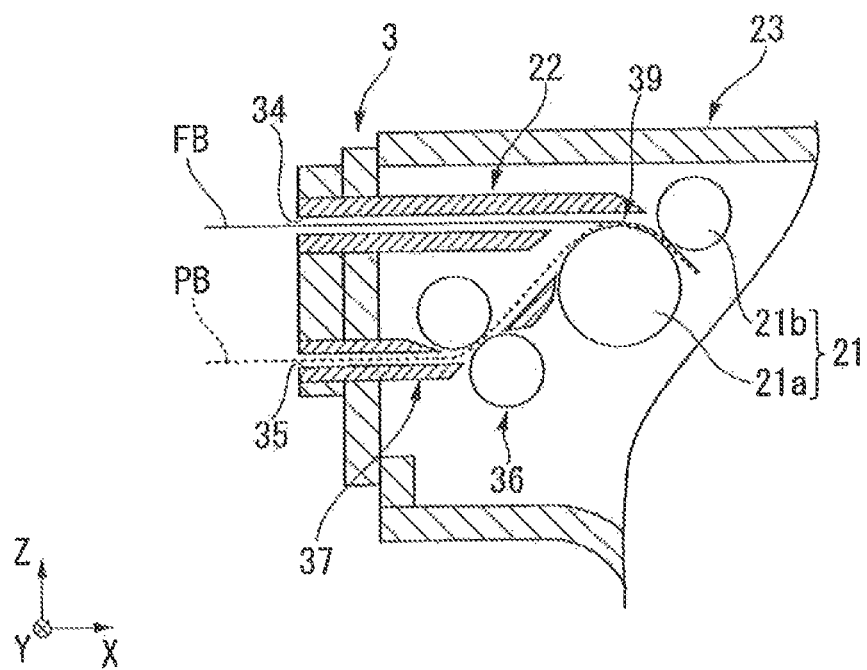
FIG. 29 illustrates a recovery operation of the sheet substrate FB.

FIGS. 27 to 29 illustrate operations for recovering the sheet substrate FB in the substrate recovery unit 103. In FIGS. 27 to 29, some components are intentionally omitted to facilitate understanding of the drawings.

In the recovery operation, as shown in FIG. 27, the sheet substrate FB is inserted into the opening 34 of the substrate cartridge 1, and at the same time, the protection substrate PB is inserted from the second opening 35. As shown in FIGS. 26 and 27, the protection substrate PB is supplied, for example, from the protection substrate supply unit 306 described above.

The inserted sheet substrate FB and the protection substrate PB are guided by the substrate guide unit 22 and the second substrate guide unit 37 as shown in FIG. 28 and join together in the joining portion 39. The sheet substrate FB and the protection substrate PB joined together at the joining portion 39 are transported by the transport unit 21 in the joined state as shown in FIG. 29 and pressed by the tension roller 21a and the measurement roller 21b to be in close contact with each other. The sheet substrate FB and the protection substrate PB are wound around the roller unit 26 and recovered while they are in close contact with each other.

Next, the relay apparatus 303 that recovers the sheet substrate FB abutting the protection substrate PB is transported to the second substrate processing apparatus 310 by the transport system TR2 such as a fork lift. After transportation, the relay apparatus 303 is connected to the supply side connecting portion 311A of the second substrate processing apparatus 310 in the sequence shown in FIG. 12, FIG. 13 and the like, and the empty substrate cartridge 1 is connected to the recovery side connecting portion 311B as the substrate recovery unit 312. After the substrate recovery unit 312 is connected to the recovery side connecting portion 311B, the electrode, the light-emitting layer TR, and the transparent electrode ITO are formed on the sheet substrate FB by the substrate processing unit 311 while supplying the sheet substrate FB from the relay apparatus 303.

At this moment, for example, the control units 314 and 315 communicate with the information processing unit IC of the relay apparatus 303 and the information processing unit IC of the substrate recovery unit 312, to receive the processing information stored in each of the information processing units IC. On the basis of the received processing information, the control units 314 and 315 form the electrode, the light-emitting layer IR, and the transparent electrode ITO while adjusting operations regarding the received processing information such as the transport speed of the sheet substrate FB, and the heating time or heating temperature of the heat processing device BK.

In addition, when the processing speed of the first substrate processing apparatus 300 is higher than that of the second substrate processing apparatus 310 (having less takt), such as in the case where the ratio between the processing speed of the first substrate processing apparatus 300 and the processing speed of the second substrate processing apparatus 310 is set to, for example, 2:1, the number of destinations relayed by the relay apparatus 303 may increase. In the present embodiment, for example, the second substrate processing apparatus 320 is added as the destination relayed by the relay apparatus 303. As a result, since the sheet substrate FB processed by the first substrate processing apparatus 300 is processed in parallel in two places the second substrate processing apparatuses 310 and 320, the number of lines having a lower processing speed (having more takt) increases.

As described above, the processing of the sheet substrate FB is completed via the process by the first substrate processing apparatus 300 and the process by the second substrate processing apparatus 310. Therefore, when a single first substrate processing apparatus 300 and a single second substrate processing apparatus 310 are used (or when the processing is sequentially performed), the processing speed of the entire substrate processing system SYS2 is the processing speed of the first substrate processing apparatuses 300 or the substrate processing apparatuses second 310, whichever is lower.

On the contrary, in the present embodiment, the number of lines increases using two second substrate processing apparatuses 310 (the second substrate processing apparatuses 310 and 320) having a lower processing speed. Therefore, the difference of the processing speed is compensated, and it is possible to draw on the processing speed of the first substrate processing apparatus 300. As a result, it is possible to prevent the processing efficiency of the entire substrate processing system SYS2 from decreasing.

The organic EL element 50 is formed on the sheet substrate FB by forming the electrode, the light-emitting layer IR, and the transparent electrode ITO on the sheet substrate FB having the barrier BA. The sheet substrate FB having the organic EL element 50 is wound and recovered, for example, by the substrate recovery unit 312 as in the operation sequence described in FIGS. 27 to 29.

As described above, according to the present embodiment, there are provided the first substrate processing apparatus 300 that performs a process of forming the barrier BA on the sheet substrate FB as the first process, the second substrate processing apparatus 310 that performs a process of forming the electrode, the light-emitting layer IR, and the transparent electrode ITO on the sheet substrate FB as the second process after the process of forming the barrier BA, and the relay apparatus 303 that recovers the sheet substrate FB from the first substrate processing apparatus 300 and supplies the recovered sheet substrate FB to the second substrate processing apparatus 310, wherein the substrate cartridge 1 according to the present invention is used as the relay apparatus 303. Therefore, it is possible to prevent dust or the like from being attached to the sheet substrate FB during transportation between the first and second substrate processing apparatuses 300 and 310 provided in the same place or factory. In addition, the processing information is transmitted using the information processing unit IC provided in the substrate cartridge 1, and the substrate processing units 302 and 311 can perform processing using the processing information. Therefore, it is possible to improve processing efficiency in the entire substrate processing system SYS2.

In addition, in another example, the first substrate processing apparatus 300 is, for example, an apparatus for forming the barrier BA and an electrode (such as the gate electrode G) of the organic EL element 50 on the sheet substrate FB. The second substrate processing apparatus 310 or 320 is, for example, an apparatus for forming the light-emitting layer IR and the transparent electrode ITO of the organic EL element 50 on the sheet substrate FB.

In this example, the organic EL element 50 is formed on the sheet substrate FB, by forming the light-emitting layer IR, and the transparent electrode ITO on the sheet substrate FB having the barrier BA and the electrode. The sheet substrate FB having the organic EL element 50 is wound and recovered, for example, by the substrate recovery unit 312 as in the operation sequence described in FIGS. 27 to 29.

In addition, the aforementioned substrate processing system SYS2 may be configured such that the processing speed of the second substrate processing apparatus 310 is higher than the processing speed of the first substrate processing apparatus 300. In this configuration, for example, the first substrate processing apparatus 300 may include the barrier formation unit 91 and the electrode formation unit 92, and the second substrate processing apparatus 310 may include the light-emitting layer formation unit 93. In this case, with the same concept as the present embodiment, for example, by setting the number of the first substrate processing apparatuses 300 to be larger than the number of the second substrate processing apparatuses 310, it is possible to compensate for the difference of the processing speed.

Figure 30:
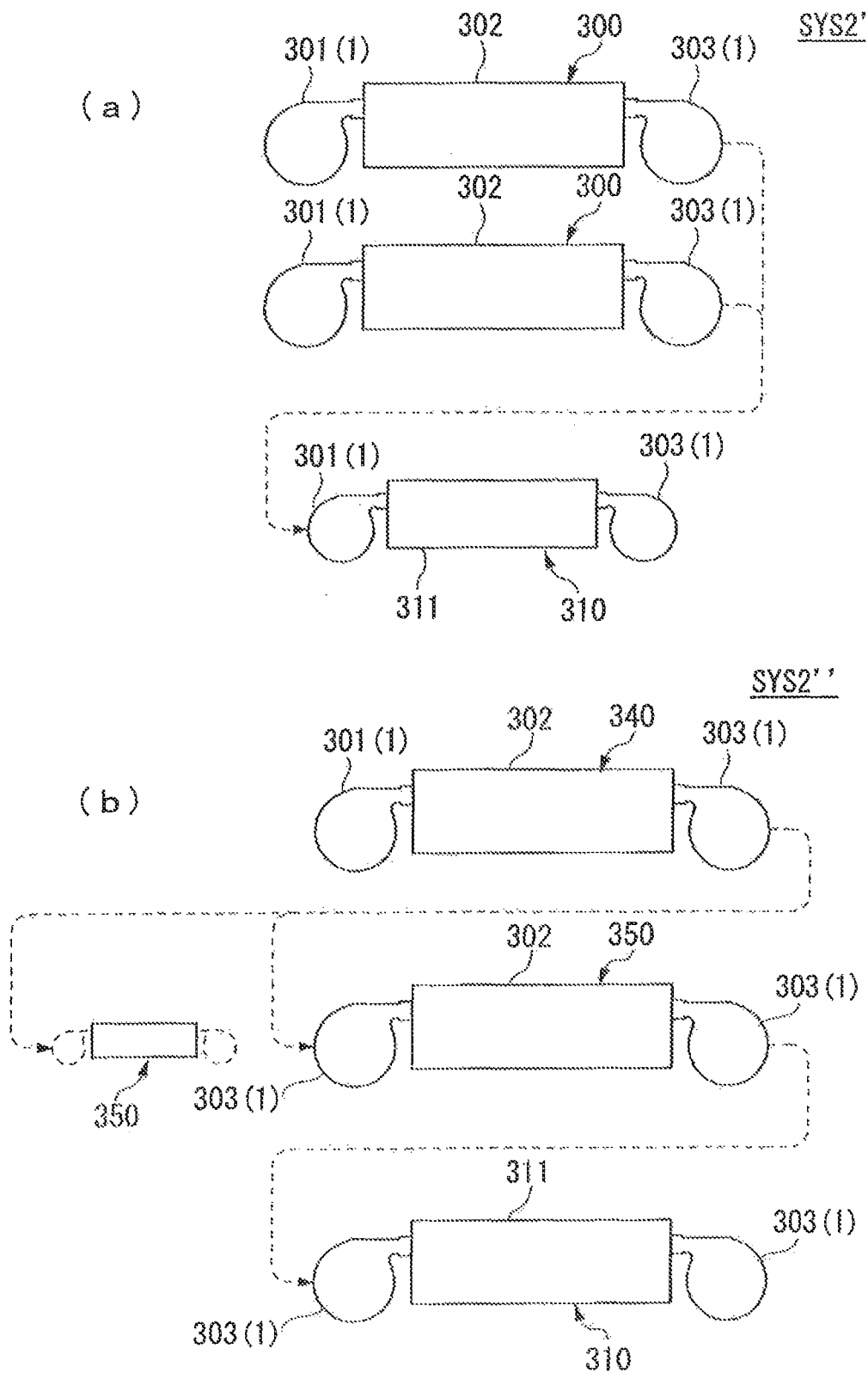
FIG. 30 illustrates another configuration of the substrate processing system.

For example, in FIG. 30(a), the substrate processing system SYS2' includes two first substrate processing apparatuses 300 and a single second substrate processing apparatus 310. Since the number of lines for the processing of the first substrate processing apparatus 300 having a lower processing speed increases, the difference of the processing speed can be compensated. In this case, for example, it is preferable that the relay apparatus 303 be alternately connected to the second substrate processing apparatus 310 by controlling the timing of the processing in two first substrate processing apparatuses 300. As a result, it is possible to significantly reduce a stand-by time of the relay apparatus 303 and effectively perform the processing.

In addition, for example, this substrate processing system SYS2' may have a configuration (the substrate processing system SYS2") further separated the first substrate processing apparatus 300 into the barrier formation apparatus 340 and the electrode formation apparatus 350 as shown in FIG. 30(b). Furthermore, the barrier formation apparatus 340 has a configuration corresponding to the barrier formation unit 91 shown in FIG. 3, and the electrode formation apparatus 350 has a configuration corresponding to the electrode formation unit 92 shown in FIG. 3. The second substrate processing apparatus 310 has the light-emitting layer formation unit 93 similar to the substrate processing system SYS2'.

In three kinds of processes, the barrier formation process, the electrode formation process, and the light-emitting layer formation process, the electrode formation process has the lowest processing speed due to be particularly needed performing with higher alignment accuracy. As a result, as shown in FIG. 30(b), if the two electrode formation apparatuses 350 having a lower processing speed are arranged to increase the number of lines, and a single barrier formation apparatus 340 and a single second processing apparatus 310 (having the light-emitting layer formation unit 93) are arranged, it is possible to compensate for the difference of the processing speed.

In this case, the relay apparatus 303 from the barrier formation apparatus 340 to the electrode formation apparatus 350 has the same function as that of the relay apparatus 303 of the substrate processing system SYS2 in the aforementioned embodiments, and the relay apparatus 303 from the electrode formation apparatus 350 to the second processing apparatus 310 has the same function as that of the relay apparatus 303 of the aforementioned substrate processing system SYS'. In addition, in the substrate processing system SYS2", for example, the electrode formation apparatus 350 may be divided into a gate formation apparatus for forming the gate electrode G and a source/drain formation apparatus for forming the source electrode S and the drain electrode D. In this case, since the processing speed of the source/drain formation apparatus is lower than the processing speed of the gate formation apparatus, it is preferable that a plurality of source/drain formation apparatuses be provided. In this manner, by dividing the apparatus having a lower processing speed and increasing the number of lines of the divided apparatuses, it is possible to reduce costs for the increasing number of lines.

Figure 31:
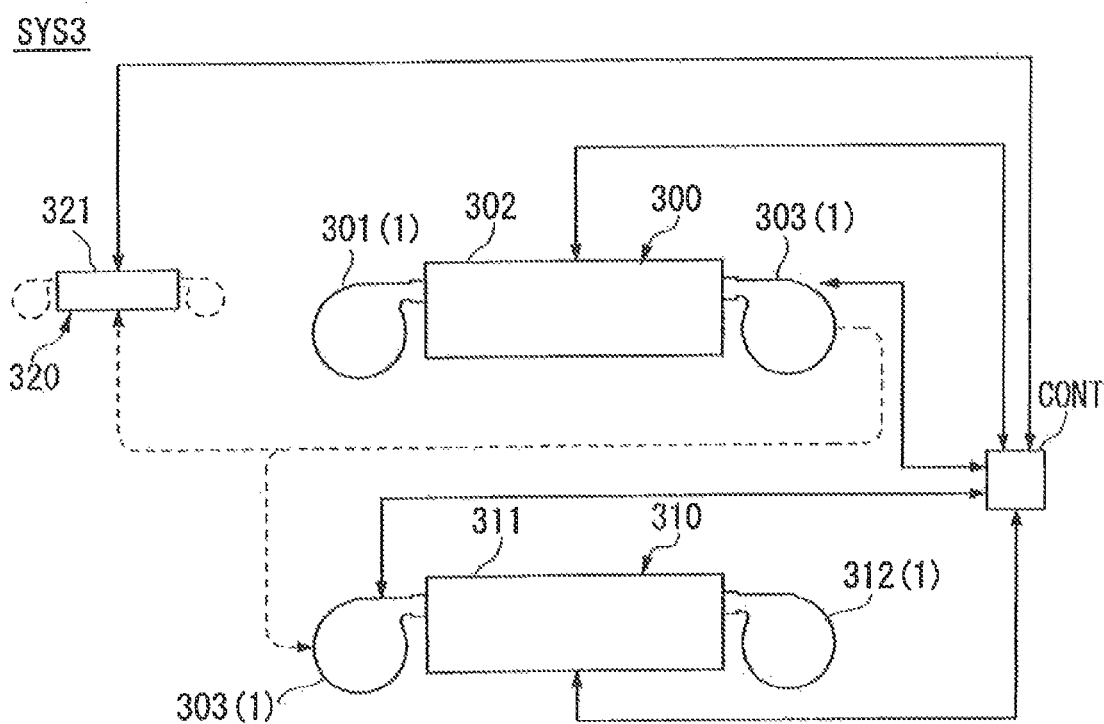
FIG. 31 illustrates a configuration of the substrate processing system.

FIG. 31 illustrates a substrate processing system SYS3 according to an embodiment. In addition, the substrate processing system SYS3 according to the present embodiment differs from the substrate processing system SYS2 shown in FIG. 26 in some components, and other components are the same. Hereinafter, descriptions will be given focusing on differences from the substrate processing system SYS2. In the following descriptions, components the same as or similar to the substrate processing system SYS2 are denoted by the same reference symbols, and their description is simplified or omitted.

As shown in FIG. 31, the substrate processing system SYS3 includes a first substrate processing apparatus (first processing apparatus) 300, second substrate processing apparatuses (second processing apparatus) 310 and 320, and a relay apparatus (substrate relay apparatus) 303. The substrate processing system SYS3 according to the present embodiment differs from the substrate processing system SYS2 in that the control apparatuses 304 and 305 and the control apparatuses 314 and 315 of the substrate processing system SYS2 are not provided, and a main control apparatus CONT is provided. Other components are similar to those of the substrate processing system SYS2.

The main control apparatus CONT collectively performs control of the first substrate processing apparatus 300, the second substrate processing apparatuses 310 and 320, and the relay apparatus 303, for example, based on the processing information (such as takt, a throughput, a transport speed, a winding speed, and a supplying speed of the substrate processing apparatus, and information on the sheet substrate FB) described in the aforementioned embodiments. For example, which one of the second substrate processing apparatuses 310 and 320 is set as the relay destination of the relay apparatus 303 may be determined based on the transport speed, the winding speed, or the supplying speed of the sheet substrate FB.

In this manner, in the present embodiment, since the first substrate processing apparatus 300, the second substrate processing apparatuses 310 and 320, and the relay apparatus 303 are collectively controlled by the main control apparatus CONT, it is possible to efficiently perform a series of processes for the sheet substrate FB.

Figure 32:
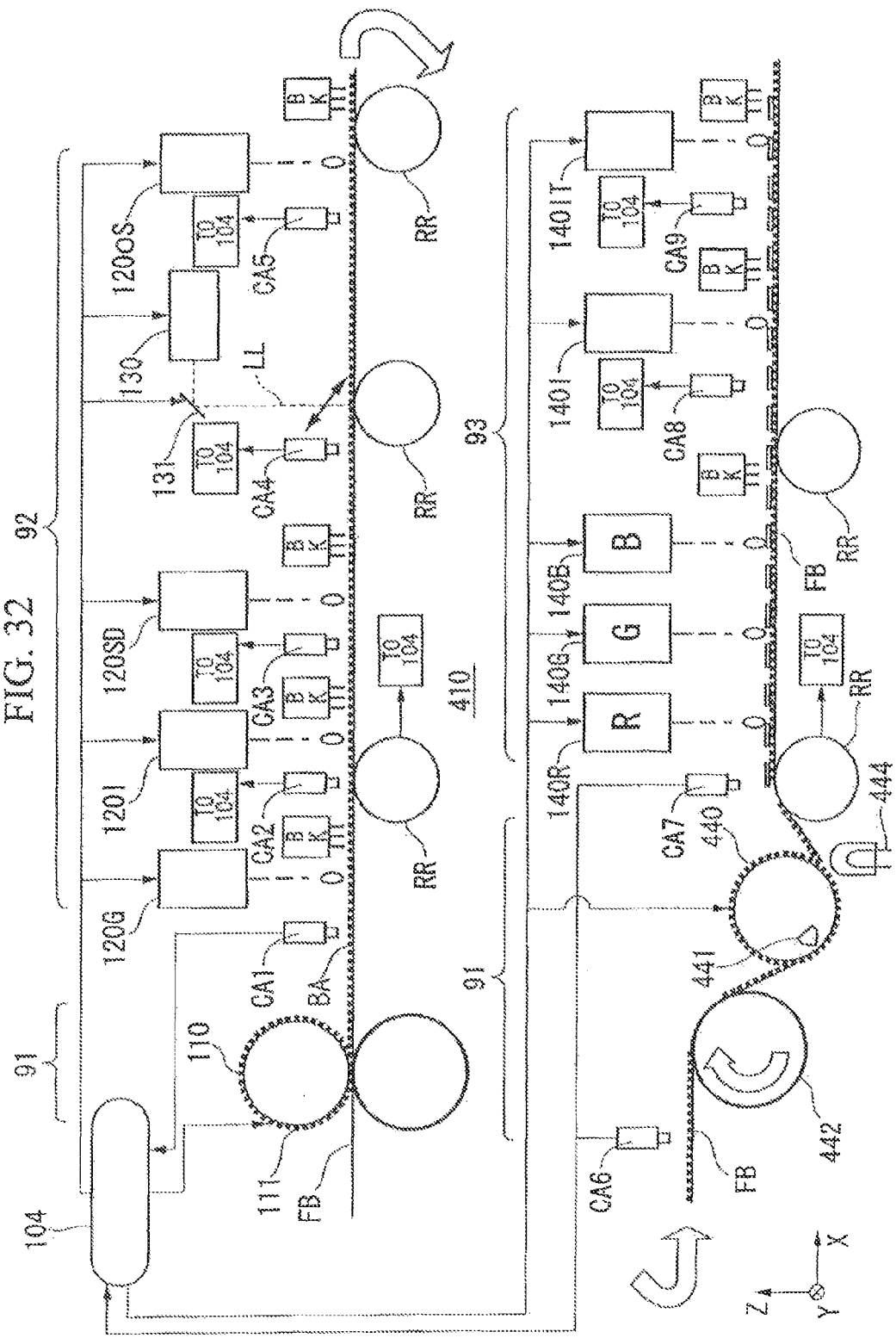
FIG. 32 illustrates a configuration of the substrate processing apparatus.

FIG. 32 is a schematic diagram illustrating a configuration of the manufacturing apparatus 410 for manufacturing a display element (such as the organic EL element) having the pixel electrode, the light-emitting layer, or the like on a flexible substrate and also illustrates another example of the substrate processing unit 102 of FIG. 2. However, the same reference symbols denote the same elements or apparatuses as in the substrate processing unit 102.

The manufacturing apparatus 410 shown in FIG. 32 differs from the aforementioned substrate processing unit 102 in that two barrier formation units 91 are provided. In one of the barrier formation processes, a barrier BA for the wiring of the thin film transistor is formed by using the imprint roller 110, and the alignment mark AM is formed in both sides of the Y-axis direction, which is the widthwise direction of the sheet substrate FB. In addition, in the other barrier formation process, a print roller 440 is used.

A metal mask is formed on the print roller 440 so that a screen print can be performed on that surface. In addition, ultraviolet-curable resin is contained inside the print roller 440. The ultraviolet-curable resin is applied on the sheet substrate FB through a metal mask using a squeegee 441. As a result, the barrier BA made of ultraviolet-curable resin is formed. The height of the barrier is less than a dozen of μm. The barrier BA made of ultraviolet-curable resin formed on the sheet substrate FB is cured by using an ultraviolet lamp 444 such as a mercury lamp.

It is necessary to increase the height of the barrier BA when the light-emitting layer, the hole transport layer, and the electron transport layer are formed in the display element. In the heat transfer in the imprint roller 110, it may be impossible to sufficiently increase the height of the barrier BA extruded from the sheet substrate FB. Therefore, the print roller 440 is provided separately from the imprint roller 110.

By disposing the alignment camera CA6 in the upstream side of the print roller 440, the control unit 104 recognizes the position of the sheet substrate FB in front of the print roller 440. And, the control unit 104 performs control of the rotation of the print roller 440 to print the ultraviolet-curable resin according to the position of the thin film transistor formed on the sheet substrate FB.

The ultraviolet-curable resin layer refers to a layer made of, as a main component, resin which is curable through a cross-linking reaction or the like by irradiating ultraviolet light. A component containing monomer having an ethylene-based unsaturated double bond is preferably used as the ultraviolet-curable resin, and the ultraviolet-curable resin layer is formed by irradiating ultraviolet light to cure the ultraviolet-curable resin. The ultraviolet-curable resin preferably includes, for example, ultraviolet-curable urethane acrylate-based resin, ultraviolet-curable polyester acrylate-based resin, ultraviolet-curable epoxy acrylate-base resin, ultraviolet-curable polyol acrylate-based resin, or ultraviolet-curable epoxy resin, or the like. The ultraviolet-curable acrylate-based resin is preferably used above all. In addition, since a black matrix is preferably used for the barrier BA of the light-emitting layer, metal such as chromium or oxide may be introduced into the ultraviolet-curable acrylate-based resin.

The barrier BA made of ultraviolet-curable resin may be overlappingly formed over the barrier BA formed on the sheet substrate by the imprint roller 110 or may be formed on the area where the barrier BA is not formed by the imprint roller 110. Thereafter, the process of forming the light-emitting layer may be sufficiently performed using the same configuration as that described in FIG. 3 or the like.

Next, an apparatus and method of manufacturing a liquid crystal display element according to an embodiment will be described. The liquid crystal display element generally comprises a deflection filter, a sheet substrate FB having a thin film transistor, a liquid crystal layer, a color filter, and a deflection filter. Of these, description has been made regarding the fact that the sheet substrate FB having the thin film transistor can be manufactured by using the substrate processing unit 102 illustrated in the upper half of FIG. 3 or the manufacturing apparatus 410 illustrated in the upper half of FIG. 32.

In the present embodiment, a description will be given of supply of the liquid crystal and bonding of the color filter CF. It is necessary to supply liquid crystals to the liquid crystal element and form the barrier for encapsulating liquid crystals. For this reason, in the present embodiment, the print roller 440 illustrated in the lower half of FIG. 32 is used not for the barrier BA for the light-emitting layer but for the barrier for encapsulating liquid crystals.

Figure 33:
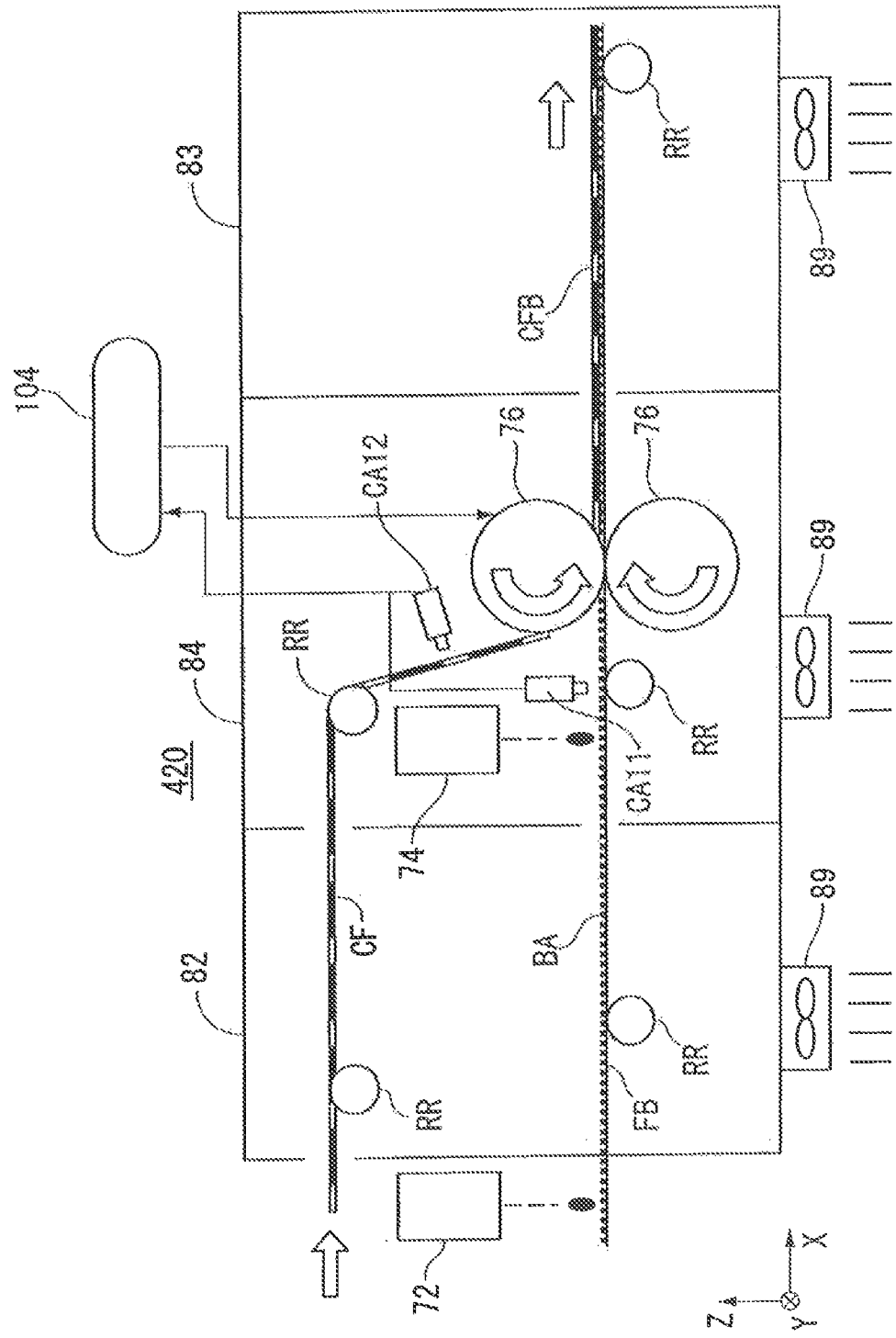
FIG. 33 illustrates a configuration of a roller of the substrate processing apparatus.

FIG. 33 illustrates a supply bonding apparatus 420 that performs supply of liquid crystals and bonding of the color filter.

The supply bonding apparatus 420 includes an upstream low-vacuum chamber 82, a downstream low-vacuum chamber 83, and a high-vacuum chamber 84 provided between the upstream low-vacuum chamber 82 and the downstream low-vacuum chamber 83. The low-vacuum chambers 82 and 83 and the high-vacuum chamber 84 are vacuumed using a rotary pump or a turbo-molecular pump 89.

The upstream low-vacuum chamber 82 is supplied with the color filter CF and also with the sheet substrate FB having the barrier for encapsulating the liquid crystal through the print roller 40 shown in FIG. 32. In addition, the alignment mark is formed in both sides of the Y direction of the color filter CF.

To the sheet substrate FB having the barrier for encapsulating liquid crystals, first, a thermosetting adhesive for bonding with the color filter CF is applied from the adhesive dispenser 72. Then, the sheet substrate FB is transported to the high-vacuum chamber 84 through the upstream low-vacuum chamber 82. The liquid crystals are applied from the liquid crystal dispenser 74 in the high-vacuum chamber 84. In addition, the color filter CF and the sheet substrate FB are bonded using the heat transfer roller 76.

The image of the alignment mark AM of the sheet substrate FB is captured by the alignment camera CA11, and the image of the alignment mark AM of the color filter CF is captured by the alignment camera CA12. The resulting images captured by the alignment cameras CA11 and CA12 are transmitted to the control unit 104 to recognize a deviation in the X-axis direction, a deviation in the Y-axis direction, and a θ-rotation. The rotation speed of the heat transfer roller 76 changes depending on the positional signal transmitted from the control unit 104, and the color filter CF and the sheet substrate FB are positioned and bonded to each other.

The bonded liquid crystal display element sheet CFB is output to an external side through the downstream low-vacuum chamber 83. In addition, while the thermosetting adhesive is used in the aforementioned descriptions, an ultraviolet-curable adhesive may also be used. In this case, an ultraviolet lamp is used instead of the heat transfer roller 76.

FIG. 34 illustrates a mechanism for alignment in the Y-axis direction for the print roller 40. A metal mask is formed on the surface of the print roller. The positioning in the X-axis direction can be adjusted by the rotation speed of the print roller based on the signal from the control unit 104. The positioning in the Y-axis direction may be performed using the following method.

FIG. 34(*a*) illustrates a print roller 440*p* of which the center is inflated or depressed using a pneumatic or a hydraulic control method. It is possible to modify the positions in the Y-axis direction of the center and the edges of the roller by supplying air or oil based on the signal from the speed & alignment control unit 90.

FIG. 34(*b*) illustrates a print roller 440*q* of which the entire roller is enlarged or contracted using a thermal deformation control method. It is possible to modify the position of the entire roller in the X-axis direction and the Y-axis direction by heating or cooling the roller based on the signal from the speed & alignment control unit 90.

FIG. 34(*c*) illustrates a print roller 440*r* of which the entire roller is bent using a bending deformation control method. The print roller 440*r* preferably has a slit in a circumferential direction so as to be bent by a weak force.

The technical scope of the present invention is not limited to the aforementioned embodiments, thus any addition or modification may be appropriately made without departing from the spirit of the present invention.

In the aforementioned embodiments, the blocking unit 4 of the substrate cartridge 1 is configured such that the cap member 41 covers both the opening 34 and the second opening 35, but not limited thereto. For example, as shown in FIG. 33, a configuration in which the cap member 41A opens or closes the opening 34 and the cap member 41B opens or closes the second opening 35 may be possible.

In this configuration, for example, as shown in FIG. 35, there may be provided a driving apparatus that performs control of the opening/closing of the cap members 41A and 41B such that cap members 41A and 41B are opened when the mount portion 3 is inserted into the supply side connecting portion 102A of the substrate processing unit 102, and the cap members 41A and 41B are closed when the mount portion 3 is not connected to the supply side connecting portion 102A.

In this manner, by independently closing/opening the opening 34 and the second opening 35, it is possible to prevent any unused opening from being opened. As a result, it is possible to prevent foreign objects such as dust from being introduced from the opening.

For example, when a trouble occurs in a part of the aforementioned substrate processing apparatus or substrate processing system, a part of the sheet substrate FB may be cut out to remove the place where the trouble occurs. As a result, it is possible to prevent a extraction rate of the sheet substrate FB from being degraded. In addition, in the substrate cartridge or the substrate processing system of the present embodiment, it is possible to recognize the remaining length of the sheet substrate FB even when the sheet substrate FB is cut due to defects or even when the manufacturing line stops due to electric power outage. Therefore, it is possible to immediately perform the process after re-operation. Therefore, according to the present embodiment, it is possible to improve processing efficiency and safety.

In the aforementioned embodiments, the field effect transistor shown in FIG. 1 has been described as an example, but not limited thereto. FIGS. 36(a) and 36(b) are cross-sectional views illustrating a field effect transistor different from the aforementioned embodiments. For example, the bottom gate type field effect transistor shown in FIG. 36(a) can be manufactured in addition to the field effect transistor of FIG. 1. After the gate electrode G, the gate insulation layer 1, and the organic semiconductor layer OS are formed on the sheet substrate FB, the source electrode S and the drain electrode D are formed thereon.

FIG. 36(b) illustrates a top gate type field effect transistor obtained by forming the source electrode S and the drain electrode D on the sheet substrate FB, then forming the organic semiconductor layer OS, and further forming the gate insulation layer 1 and the gate electrode G thereon.

In any field effect transistor, a modification may be made by using the substrate processing unit 102 by changing the sequence of metal ink or the like.

In the aforementioned embodiment, the opening 34 and the second opening 35 are provided in the +X side end of the mount portion 3, but not limited thereto. For example, the opening 34 and the second opening 35 may be provided in positions other than the mount portion 3. In addition, the second opening 35 may not be provided.

In the aforementioned embodiments, the substrate driving mechanism 24 is provided as the substrate cartridge 1, and the sheet substrate FB is accommodated by winding, but not limited thereto. Other methods may be used to accommodate the sheet substrate FB.

In the aforementioned embodiments, the attaching portion 26c is provided on the surface of the roller unit 26 of the substrate driving mechanism 24, but not limited thereto. Other mechanisms may be used if they can hold the sheet substrate FB. In addition, it is not necessary to provide the attaching portion 26c on the entire surface of the roller unit 26, thus the attaching portion 26c may be provided on a part of the surface of the roller unit 26.

The transport unit 21 or the guide unit 27 provided inside the accommodation unit 20 is not limited to those described in the aforementioned embodiments, but other arrangements may be used.

In the aforementioned embodiments, a single external connecting portion as a connection destination of the substrate cartridge 1 is provided in each substrate processing unit, but not limited thereto. For example, a plurality of external connecting portions may be provided in the Z direction. In this configuration, for example, it is possible to install the substrate cartridge 1 in the reversed state in the Z direction.

In the aforementioned embodiments, the external connecting portion may be movably provided in the Z direction. In this case, for example, when the substrate cartridge 1 is installed in a reversed state to the Z direction, the external connecting portion may be movable in the Z direction.

(Another Embodiment of Substrate Cartridge)

Figure 37:
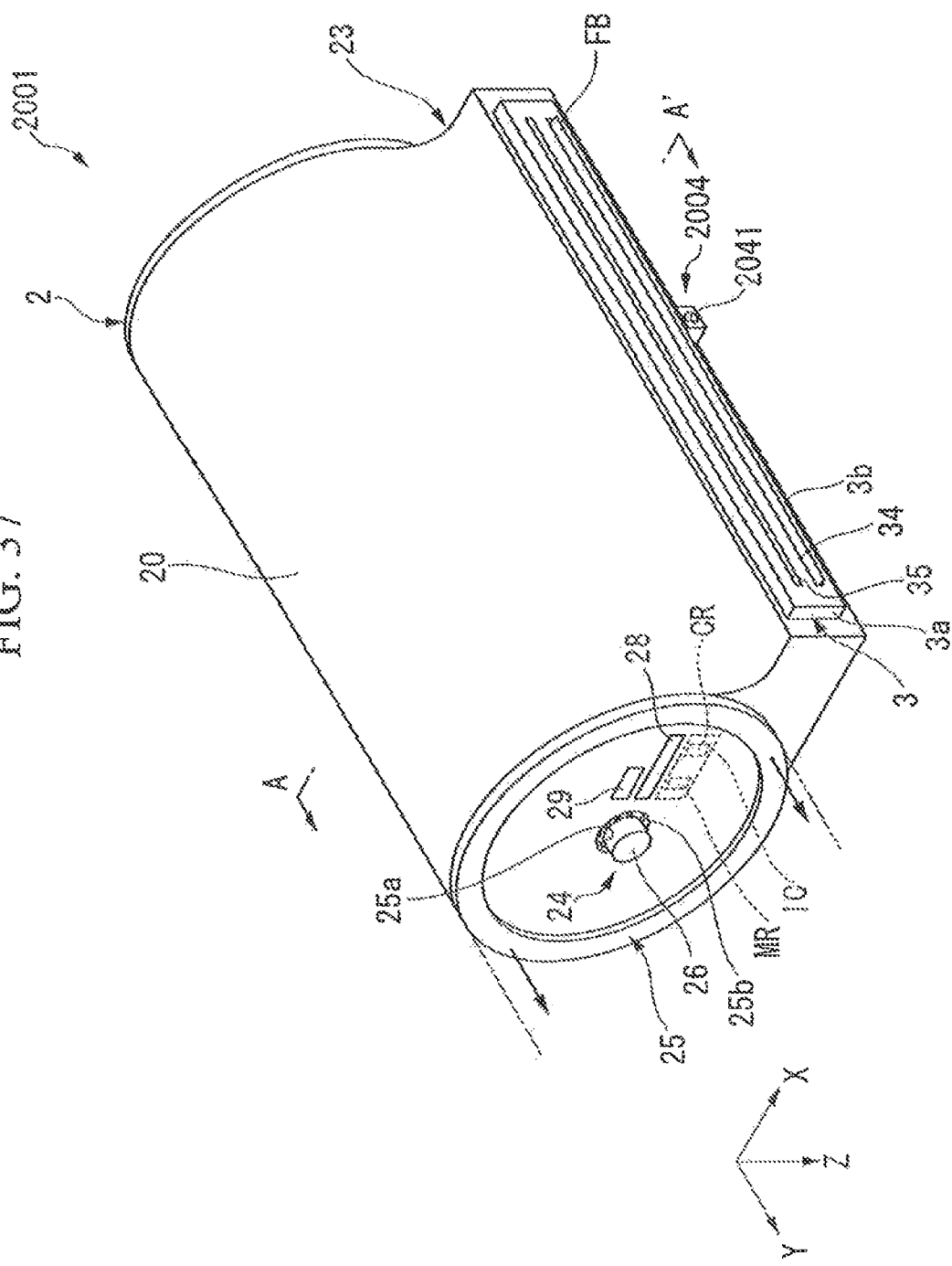
FIG. 37 is a perspective view illustrating a configuration of a substrate cartridge according to another embodiment of the present invention.
Figure 38:
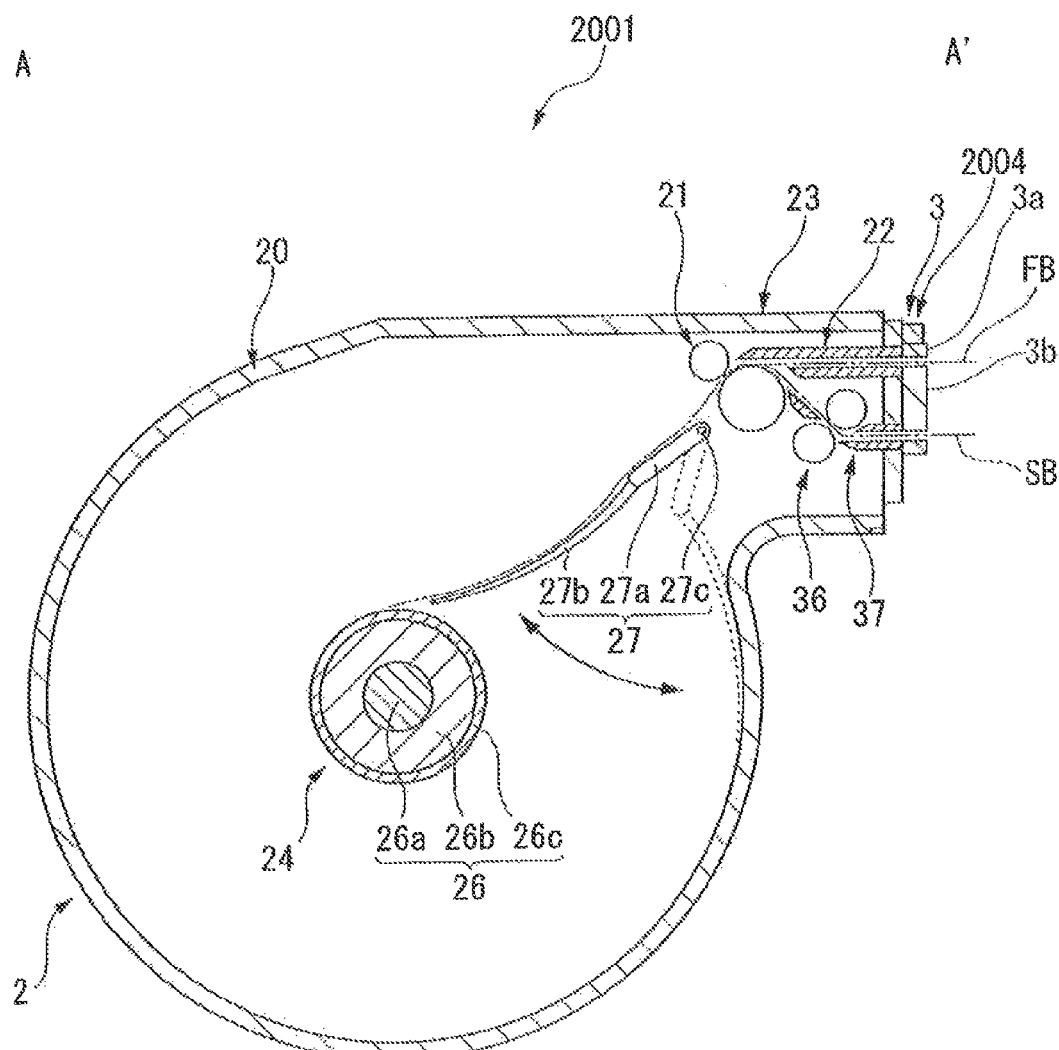
FIG. 38 is a cross-sectional view illustrating a configuration of a substrate cartridge.

FIG. 37 is a perspective view illustrating a configuration of the substrate cartridge 2001 according to another embodiment. In addition, FIG. 38 illustrates a cross-sectional configuration taken along the line A-A' of FIG. 37. In the following description, components the same as or similar to the abovementioned embodiments are denoted by the same reference symbols, and their description is simplified or omitted. As shown in FIGS. 37 and 38, the substrate cartridge 2001 includes a cartridge mainframe 2 and a mount portion 3.

In the present embodiment, the substrate cartridge 2001 is used as the substrate supply unit 101 and the substrate recovery unit 103. In the following descriptions, for convenience descriptions, an XYZ rectangular coordinates system similar to that of FIG. 2 is established, and a positional relationship of each member will be described referring to the XYZ rectangular coordinates system. In the following XYZ rectangular coordinates system, a case where the substrate cartridge 2001 is used as the substrate supply unit 101 while the substrate supply unit 101 is connected to the substrate processing unit 102 will be exemplarily described.

For example, a heat-resistant resin film, stainless steel, or the like may be used as the sheet substrate FB. Specifically, materials of the sheet substrate FB may include polyethylene resin, polypropylene resin, polyester resin, ethylenevinyl copolymer resin, polyvinyl chloride resin, cellulose resin, polyamide resin, polyimide resin, polycarbonate resin, polystyrene resin, polyvinylacetate resin, or the like. For example, a Y direction dimension of the sheet substrate FB is formed at about 50 cm to 2 m, and a Y direction dimension is formed at 10 m or larger. Needless to say, such dimensions are just exemplary, and but not limited thereby. For example, the Y direction dimension of the sheet substrate FB may be less than 50 cm, or equal to or larger than 2 m. In addition, the X direction dimension of the sheet substrate FB may be less than 10 m. Furthermore, flexibility of the present embodiment means a flexible property where the substrate can flex without any causing cracks or fractures when a predetermined force such as at least about a self weight is applied to the substrate. In addition, the flexibility changes depending on a material, size, or thickness of the substrate, or an environment such as a temperature.

The substrate driving mechanism 24 is a part for performing operation for winding the sheet substrate FB and operation for supplying the sheet substrate FB. The substrate driving mechanism 24 is provided inside the accommodation unit 20. The substrate driving mechanism 24 has a roller (shaft) 26 and a guide 27. As shown in FIG. 38, the roller 26 has a rotational shaft member 26a, an enlarged radius portion 26b, and an attaching portion 26c.

The rotational shaft member 26a is connected to a non-illustrated rotation driving mechanism. By controlling the rotation driving mechanism, the rotational shaft member 26a is rotated with respect to the center axis. The rotation driving mechanism can rotate the rotational shaft member 26a, for example, in either the $+\theta Y$ or $-\theta Y$ direction as shown in FIG. 38.

A gas supply port (switching mechanism) 2004 is provided in the end portion of +X-side of the protrusion 23. The gas supply port 2004 is provided with the supply inlet 2041 connected to an external gas supply source. The gas supply port 2004 is provided, for example, in the center of the Y direction. While only a single gas supply port 2004 is provided in FIG. 37, a plurality of gas supply ports may be provided.

The cartridge mainframe 2 is provided with an information processing unit IC (refer to FIG. 37). The information processing unit IC includes, for example, an IC chip or the like, and is embedded, for example, in the cartridge mainframe 2. The information processing unit IC is provided with a memory unit MR for storing processing information of the substrate processing apparatus 100 and the substrate cartridge 2001, a communication unit CR, for example, for communicating processing information with the control unit 104, or the like.

Figure 39:
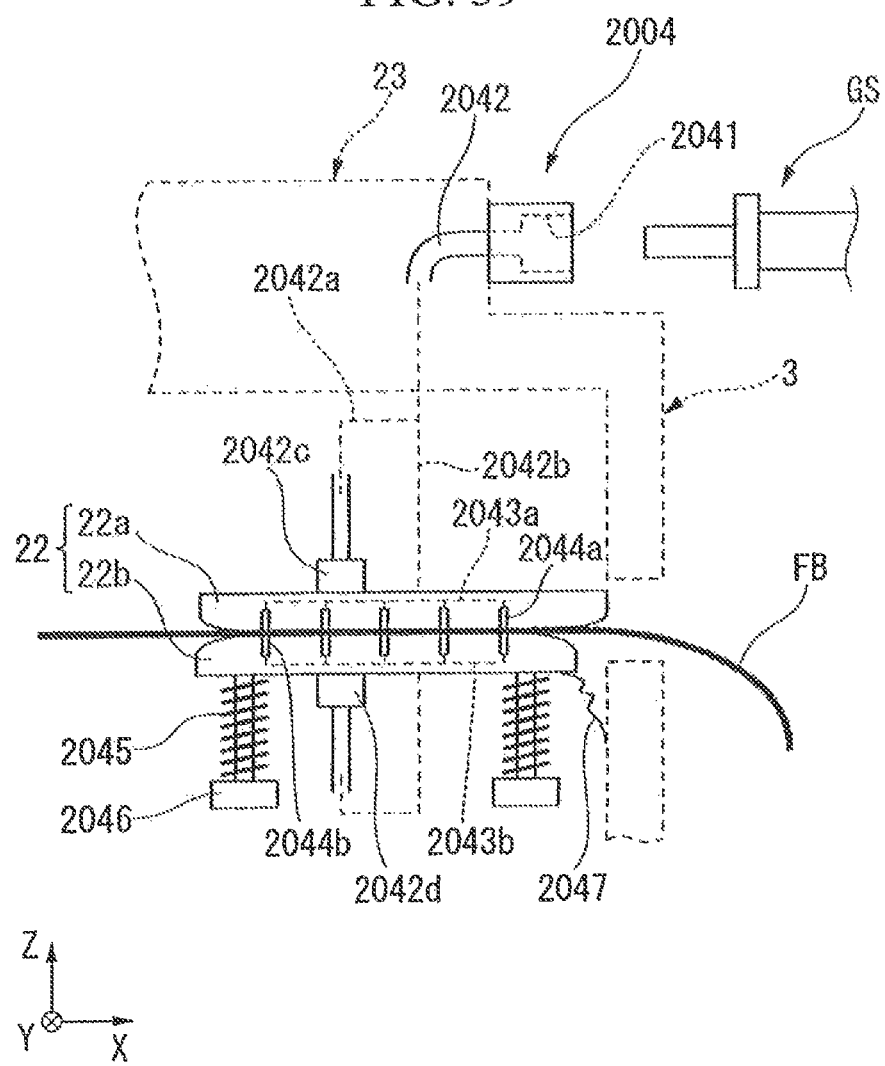
FIG. 39 is a lateral view illustrating a configuration of a part of the substrate cartridge.
Figure 40:
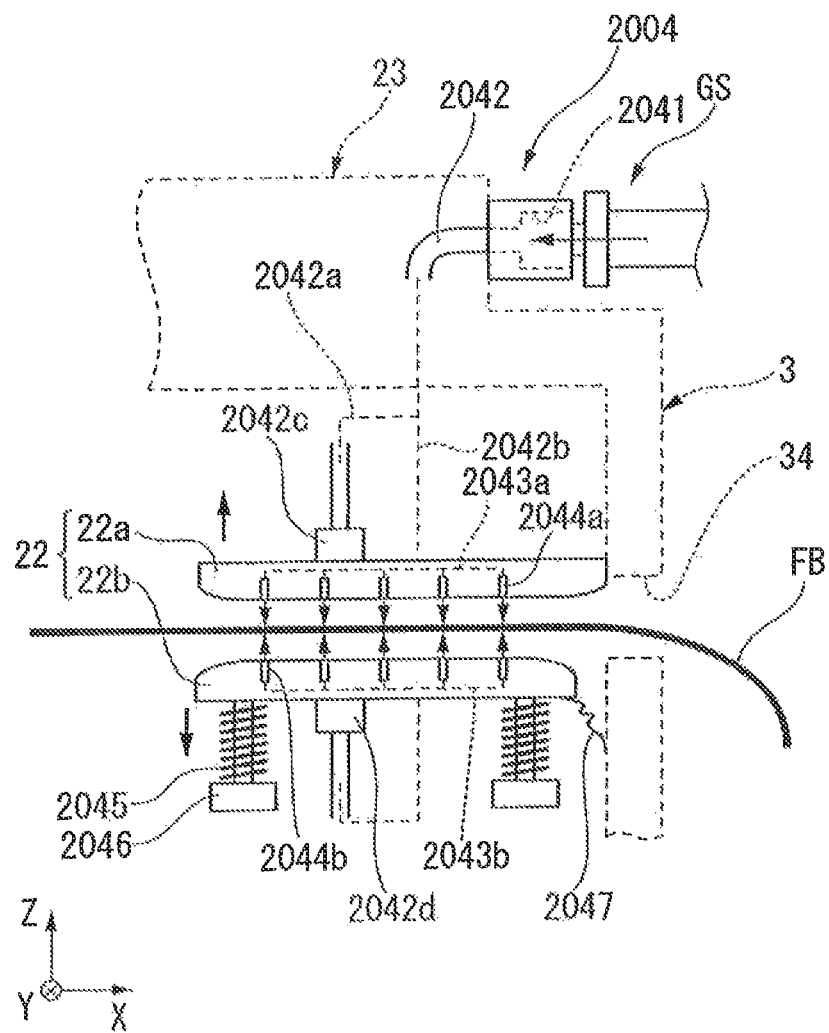
FIG. 40 is a side elevation illustrating a configuration of a part of the substrate cartridge.

FIGS. 39 and 40 illustrate an expanded configuration of the +X side end portion of the protrusion 23 and illustrate a flow path mechanism connected to the gas supply port 2004.

As shown in FIGS. 39 and 40, the supply inlet 2041 of the gas supply port 2004 is connected to the flow path 2042 formed inside the protrusion 23. The flow path 2042 is divided into a first flow path 2042a and a second flow path 2042b. The substrate guide member 22a internally includes a flow path 2043a, and the first flow path 2042a is connected to the flow path 2043a through the connecting portion 42c. A plurality of gas discharge ports 2044a are formed in the −Z-side face of the substrate guide member 22a, and each flow path 2043a is connected to these gas discharge ports 2044a. In this manner, the substrate guide member 22a is formed in an air pad shape which discharges gases from the −Z-side face.

Meanwhile, as shown in FIGS. 39 and 40, the flow path 2043b is also formed inside the substrate guide member 22b. The second flow path 2042b is connected to the flow path 2043b through the connecting portion 42d. A plurality of gas discharge ports 2044b are formed in the +Z side face of the substrate guide member 22b, and the flow path 2043b is connected to each of the gas discharge ports 2044b. In this manner, the substrate guide member 22b is formed in the air pad shape which discharges a gas from the +Z side face.

One end of a sealing member 2047 is connected to the −Z side face of the substrate guide member 22b. The other end of the sealing member 2047 is connected to, for example, the −Z side face of the mount portion 3. It is sealed by a sealing member 2047 between the substrate guide member 22b and the opening 34. The −Z side face of the substrate guide member 22b is pressed by the pressing mechanism 2045. The −Z side end of the pressing mechanism 2045 is fixed on, for example, a support 2046 supported by the internal face of the protrusion 23.

As shown in FIG. 39, while the gas supply source is not connected to the supply inlet 2041 of the gas supply port 2004, the gas does not flow through the flow path mechanism, and the gas is not injected from the substrate guide member 22a and the substrate guide member 22b. Therefore, the substrate guide member 22b is pressed by the pressing mechanism 2045 in the +Z side and clamps the sheet substrate FB in cooperation with the substrate guide member 22a.

On the contrary, as shown in FIG. 40, for example, by inserting an external gas supply unit GS into the supply inlet 2041 and supplying the gas, the gas is injected from the gas discharge port 2044a to the −Z direction via the flow path 2042, the flow path 2042a, the connecting portion 42c, and the flow path 2043a in the substrate guide member 22a. In addition, in the substrate guide member 22b, the gas is injected from the gas discharge port 2044b to the +Z direction via the flow path 2042, the flow path 2042b, the connecting portion 42d, and the flow path 2043b.

By injecting the gas from both sides of the Z direction across the sheet substrate FB, gas layers (an air bearing) are formed between the sheet substrate FB and the gas discharge port 2044a and between the sheet substrate FB and the gas discharge port 2044b. Since the gas layer is formed on both the +Z side surface and the −Z side surface of the sheet substrate FB, the substrate guide member 22a is moved to the +Z direction, and the substrate guide member 22b is moved to the −Z side so that it is possible to release the sheet substrate FB from a state of being interposed and held between the substrate guide member 22a and the substrate guide member 22b.

In addition, for example, if the gas injected from the substrate guide members 22a and 22b passes through an ionizer, it is possible to neutralize the sheet substrate FB or prevent the sheet substrate FB from being charged.

(Operation of Accommodating Sheet Substrate in Substrate Cartridge)

Figure 41:
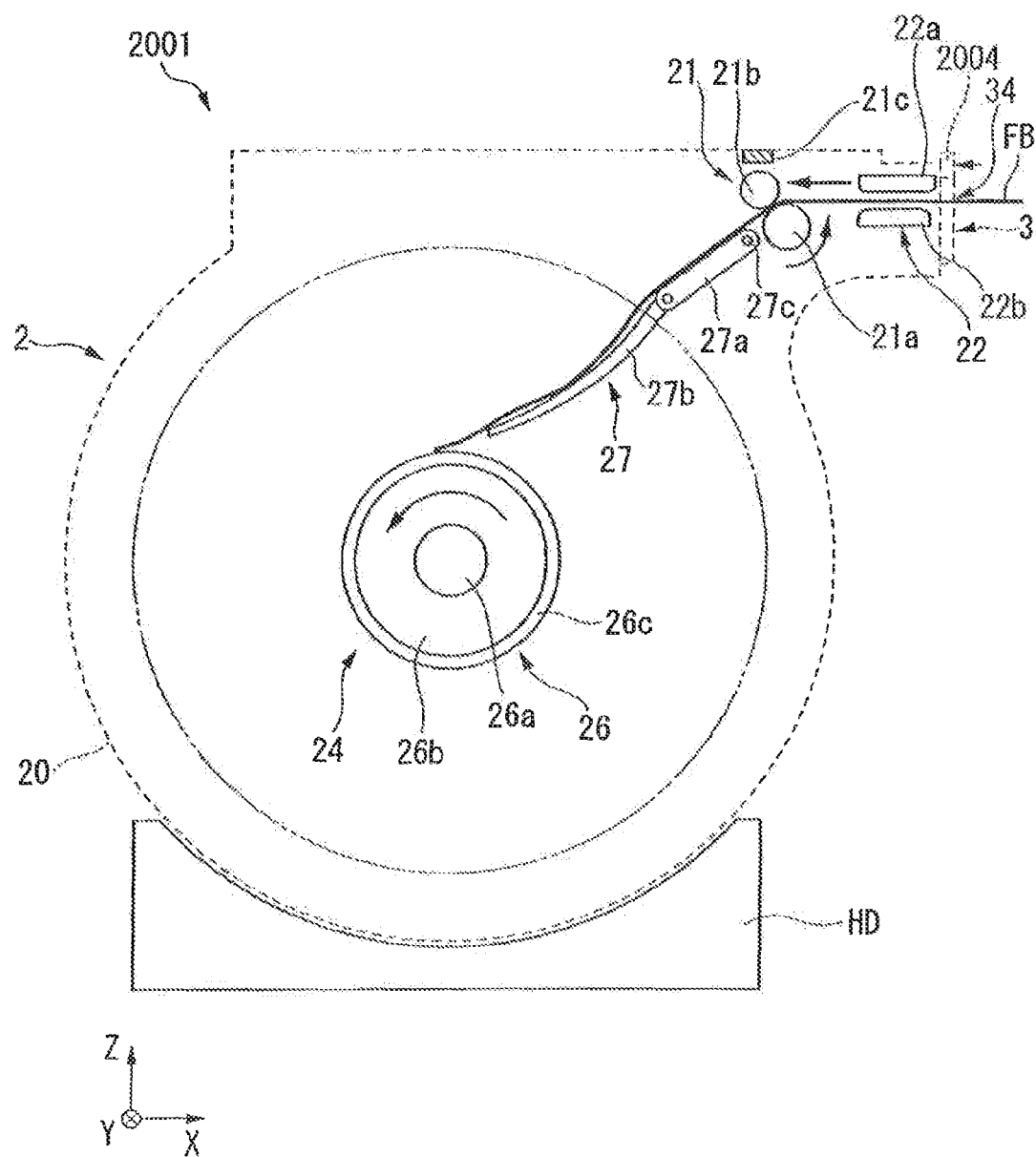
FIG. 41 illustrates an accommodating operation of the substrate cartridge.
Figure 42:
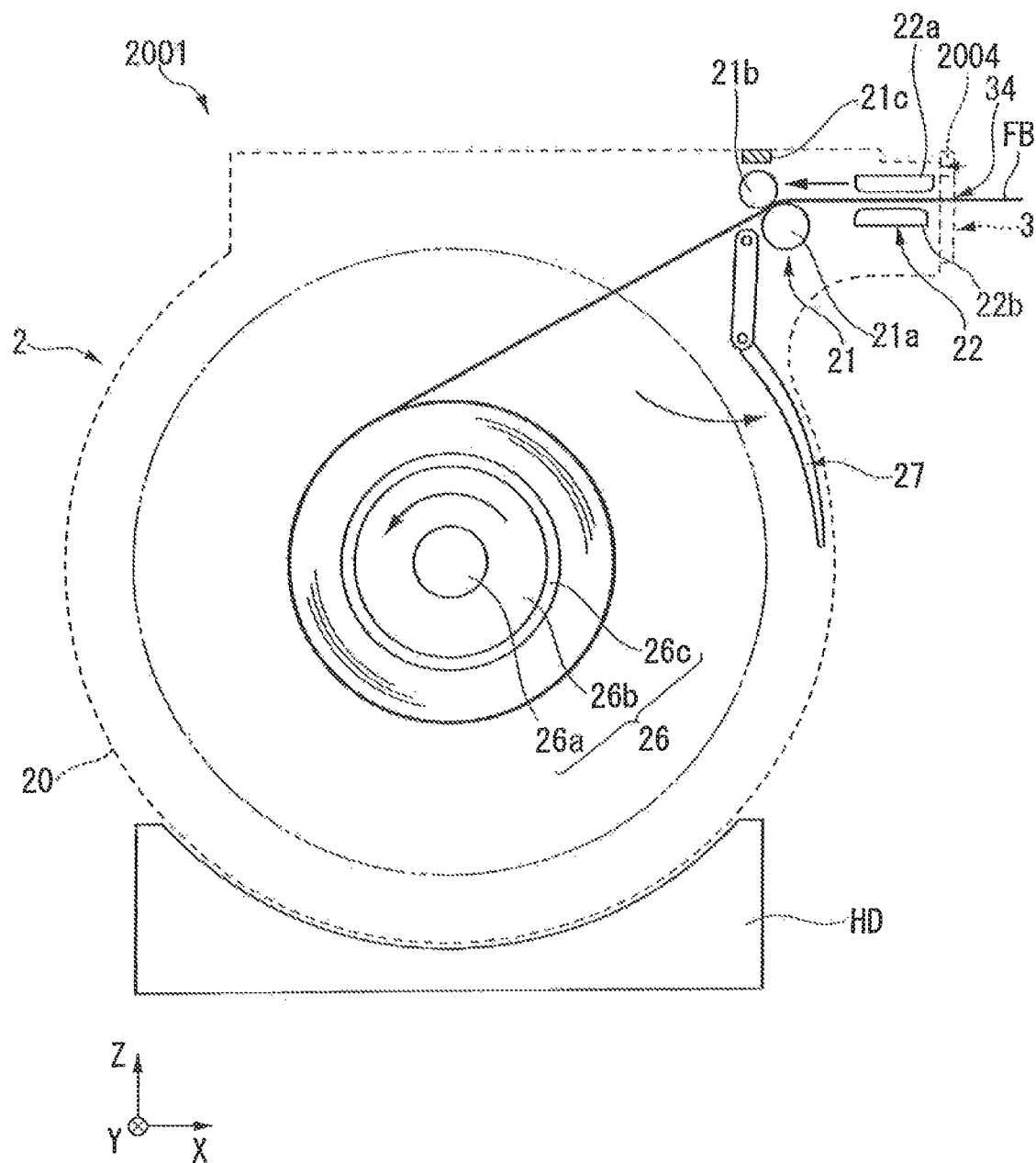
FIG. 42 illustrates an accommodating operation of the substrate cartridge.

Next, an operation of accommodating the sheet substrate FB in the substrate cartridge 2001 configured as described above will be described. FIGS. 41 and 42 illustrate states of the substrate cartridge 2001 during the accommodating operation. In FIGS. 41 and 42, in order to facilitate discrimination, the contour of the substrate cartridge 2001 is shown as a dashed line.

As shown in FIGS. 41 and 42, when the sheet substrate FB is accommodated in the substrate cartridge 2001, the substrate cartridge 2001 is held in the holder HD. Then, for example, a gas is supplied from the supply inlet 2041 of the gas supply port 2004 and injected from the substrate guide members 22a and 22b. By injecting the gas, the substrate guide members 22a and 22b are subjected to mutual injection actions in a state closed by the pressing mechanism 2045, thus the gap between the substrate guide members 22a and 22b is enlarged. In this state, the sheet substrate FB is inserted from the opening 34. When the sheet substrate FB is inserted, the tension roller 21a and the rotational shaft member 26a (the roller unit 26) are rotated.

The gas layer is formed by injecting the gas from both the +Z side and the −Z side and is formed on each surface of the sheet substrate FB inserted through the opening 34. The sheet substrate FB moves between the substrate guide members 22a and 22b to slide across the gas layer. In the transport unit 21, the sheet substrate FB is transported to the accommodation unit 20 while being interposed between the tension roller 21a and the measurement roller 21b. As the measurement roller 21b is rotated, the transport length of the sheet substrate FB is detected, for example, by the detection unit 21c.

The sheet substrate FB transported to the accommodation unit 20 by the transport unit 21 is guided while being warped to the −Z direction due to the self weight as shown in FIG. 41. In the present embodiment, since the guide unit 27 is provided in the −Z side of the sheet substrate FB, the sheet substrate FB is guided to the roller unit 26 along the pivot member 27a and the leading end member 27b of the guide unit 27.

As the leading end of the sheet substrate FB reaches the attaching portion 26c of the roller unit 26, the leading end of the sheet substrate FB is attached to the attaching portion 26c. In this state, as the roller unit 26 rotates, the sheet substrate FB is steadily attached to the attaching portion 26c, and the sheet substrate FB is wound around the roller unit 26. After the sheet substrate FB is attached to the attaching portion 26c, the sheet substrate FB is transported in order not to bend the sheet substrate FB between the roller unit 26 and the transport unit 21, for example, while adjusting the rotation speed of the tension roller 21a and the rotation speed of the rotational shaft member 26a.

After the sheet substrate FB is wound around the roller unit 26, for example, in a single turn, the guide unit 27 is withdrawn as shown in FIG. 42. By rotating the roller unit 26 in this state, the sheet substrate FB is steadily wound around the roller unit 26. While the winding thickness of the sheet substrate FB gradually increases, the sheet substrate FB does not make contact with the guide unit 27 because the guide unit 27 has been already withdrawn.

After winding the sheet substrate FB as much as a desired length, for example, the external portion of the sheet substrate FB out of the opening 34 is cut out, the gas supply to the supply inlet 2041 is stopped, and the gap between the substrate guide member 22a and the substrate guide member 22b is closed by clamping the sheet substrate FB therebetween. In this manner, the sheet substrate FB is accommodated in the substrate cartridge 2001. During the operation of accommodating the sheet substrate FB, for example, the entire length of the sheet substrate FB accommodated in the substrate cartridge 2001 may be calculated based on the measurement length of the sheet substrate FB measured by the detection unit 21c. In addition, the calculation result may be displayed on the display unit 29, stored in the memory unit MR, or transmitted using the communication unit CR.

In addition, for example, the sheet substrate FB may be wound while an operator observes the internal side of the accommodation unit 20 through the window 28. In this case, for example, the winding operation may be performed while checking whether or not the sheet substrate FB is wound in a bent state or whether or not the wound shape (rolled shape) of the sheet substrate FB has deviated. When a trouble occurs, the winding operation may be immediately stopped.

(Operation of Substrate Processing Apparatus)

Next, the operations of the substrate processing apparatus 100 configured as described above will be described.

In the present embodiment, an operation of connecting the substrate cartridge 2001 accommodating the sheet substrate FB to the supply side connecting portion 102A as a substrate supply unit 101, an operation of supplying the sheet substrate FB accommodated in the substrate cartridge 2001 by the substrate supply unit 101, an operation of forming elements by the substrate processing unit 102, and an operation of removing the substrate cartridge 2001 are sequentially performed.

Figure 43:
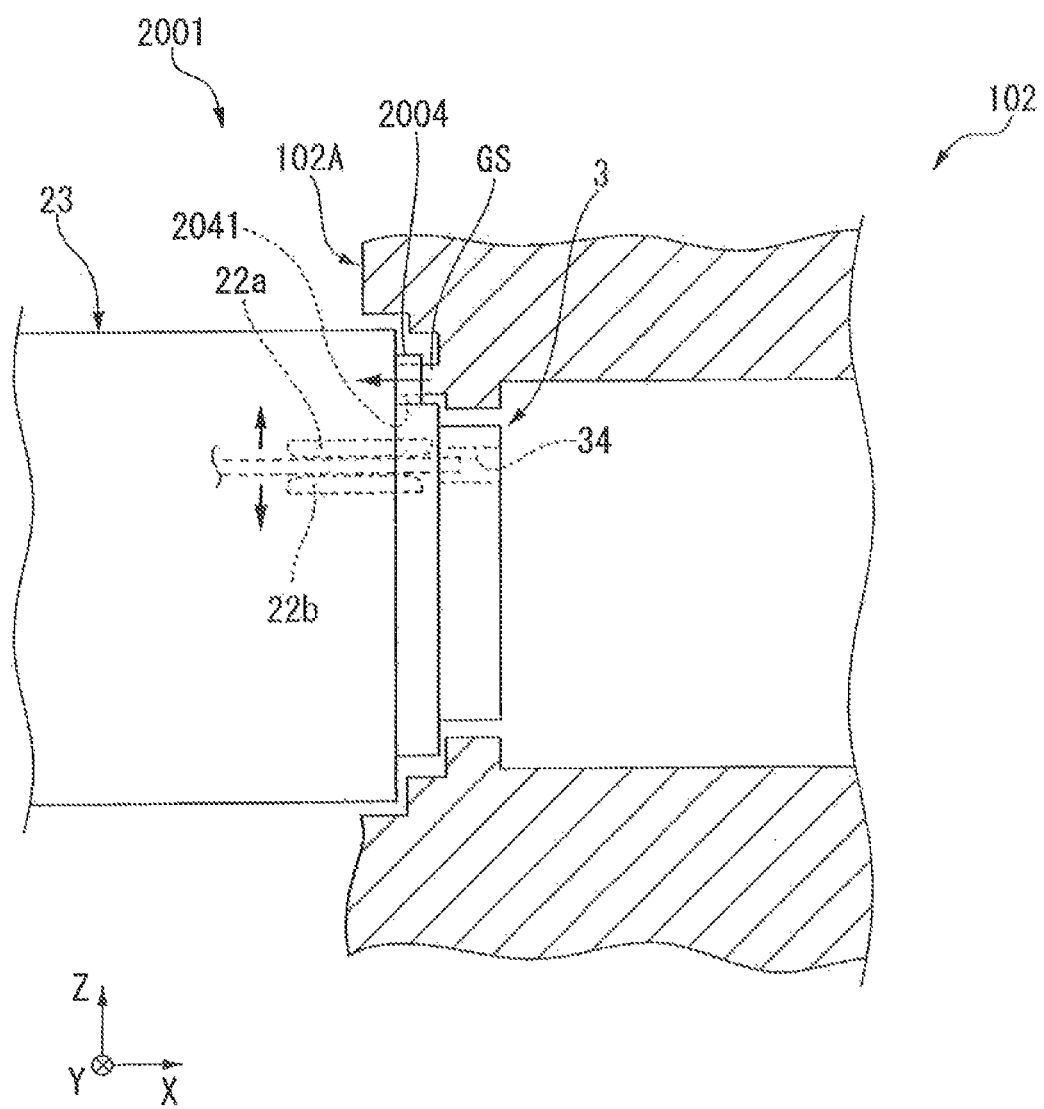
FIG. 43 illustrates a connection operation of the substrate cartridge.

First, an operation of connecting the substrate cartridge 2001 will be described. FIG. 43 illustrates an operation of connecting the substrate cartridge 2001.

As shown in FIG. 43, the supply side connecting portion 102A includes an insertion hole having a shape corresponding to the mount portion 3 and a gas supply portion GS formed in the position where the supply inlet 2041 of the gas supply port 2004 is inserted.

In the connecting operation, while the substrate cartridge 2001 is held in the holder (e.g., having the same configuration as that of the holder HD of FIG. 41), positioning between the mount portion 3 and the supply side connecting portion 102A is performed. After the positioning, the mount portion 3 is moved to the +X side to be inserted into the substrate processing unit 102. At this moment, the gas supply portion GS is inserted into the supply inlet 2041 of the gas supply port 2004. For this reason, in order to connect the mount portion 3 to the substrate processing unit 102, the gap between the substrate guide member 22a and the substrate guide member 22b is opened.

Figure 44:
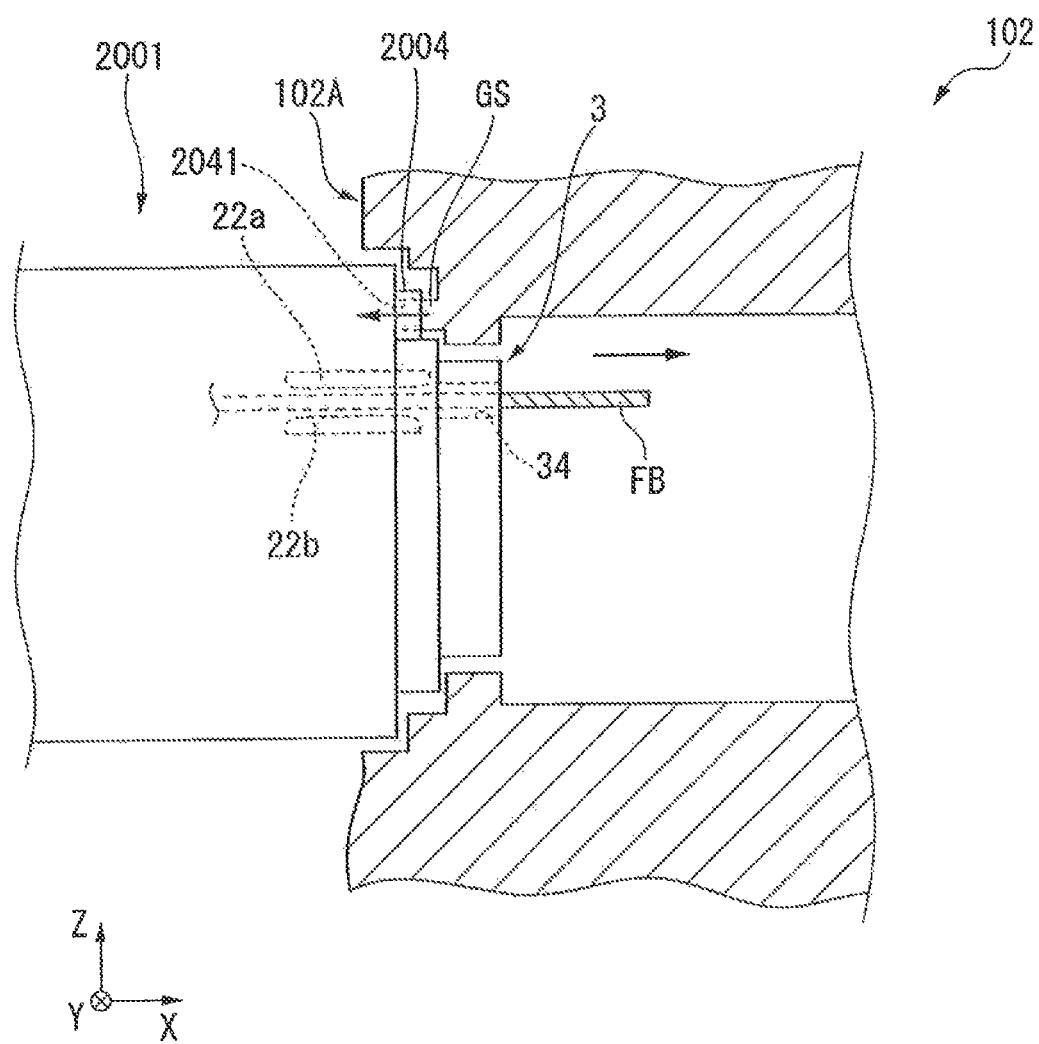
FIG. 44 illustrates a connection operation of the substrate cartridge.

Next, a supply operation will be described. In order to supply the sheet substrate FB to the substrate processing unit 102, for example, the tension roller 21a and the rotational shaft member 26a (roller unit 26) of the substrate cartridge 2001 are rotated in the direction reversed to that of the accommodating operation so as to supply the sheet substrate FB through the opening 34 as shown in FIG. 44.

Next, an element formation operation will be described. In the element formation operation, while the sheet substrate FB is supplied from the substrate supply unit 101 to the substrate processing unit 102 as shown in FIG. 2, elements are formed on the sheet substrate FB in the substrate processing unit 102. Specifically, it is the same operations as that shown in FIGS. 14 to 23. Next, a removal operation will be described. For example, the organic EL element 50 is formed on the sheet substrate FB, and the sheet substrate FB is recovered. Then, the substrate cartridge 2001 used as the substrate supply unit 101 is removed from the substrate processing unit 102.

Figure 45:
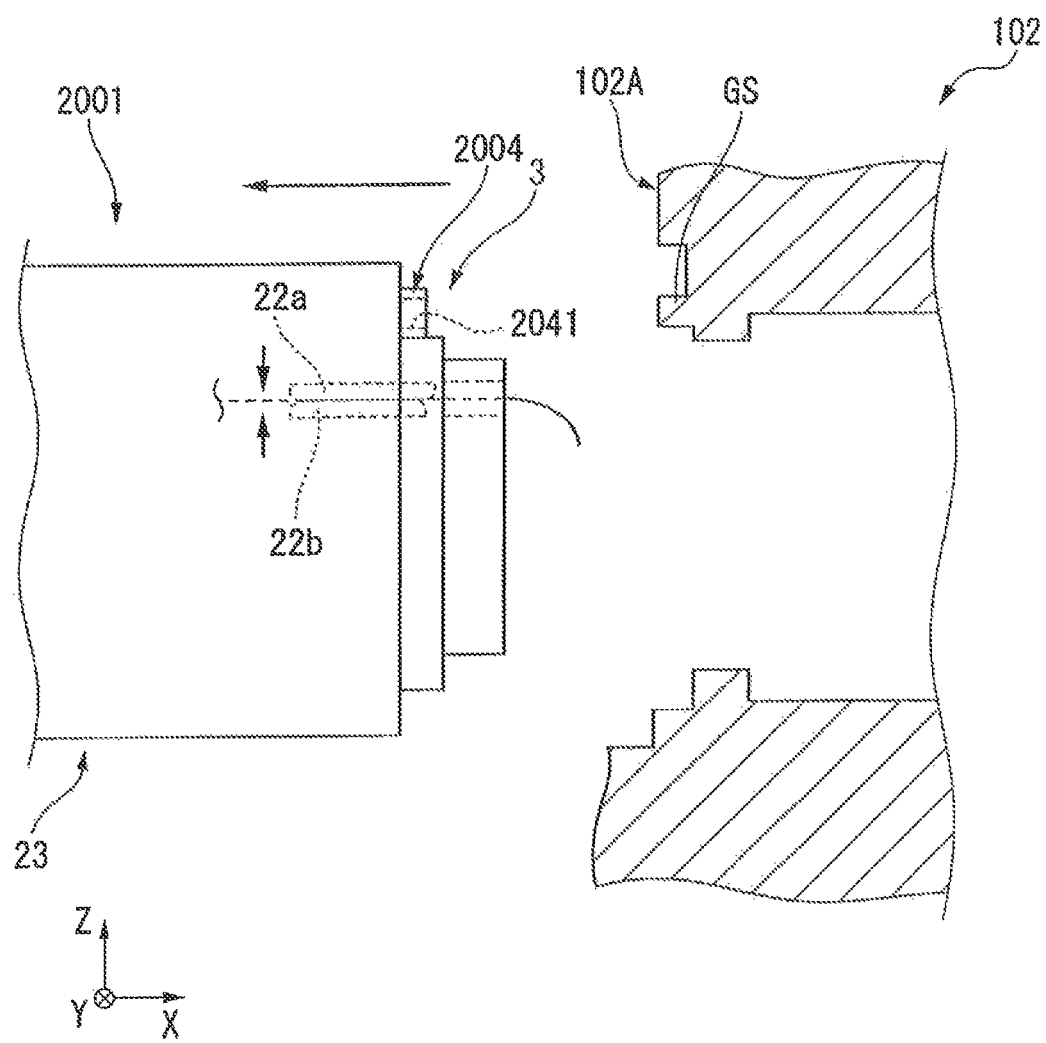
FIG. 45 illustrates a removal operation of the substrate cartridge.

FIG. 45 illustrates an operation of removing the substrate cartridge 2001.

In the removal operation, the mount portion 3 is moved to the −X direction to evacuate from the supply side connecting portion 102A. By evacuating the mount portion 3, the gas supply portion GS is extracted from the supply inlet 2041 of the gas supply port 2004. Therefore, it is closed again by interposing the sheet substrate FB between the substrate guide member 22a and the substrate guide member 22b.

In this manner, it is opened between the substrate guide member 22a and the substrate guide member 22b when the mount portion 3 is connected to the substrate processing unit 102. Therefore, the opening 34 is opened. It is closed between the substrate guide member 22a and the substrate guide member 22b when the mount portion 3 is not connected to the substrate processing unit 102. Therefore, the opening 34 is closed by the sheet substrate FB.

As described above, according to an embodiment of the present invention, there are provided the cartridge mainframe 2 that has an opening 34 where the flexible sheet substrate FB is carried in/out and accommodates the sheet substrate FB through the opening 34 and the mount portion 3 that is provided in the cartridge mainframe 2 and is detachably connected to the supply side connecting portion 102A and the recovery side connecting portion 102B, wherein the opening 34 can be blocked by the sheet substrate FB depending on the connection state between the mount portion 3 and the supply side connecting portion 102A or the recovery side connecting portion 102B. Therefore, it is possible to prevent foreign objects such as dust from coming from the opening 34. As a result, it is possible to prevent foreign objects from being attached to the sheet substrate FB.

In addition, according to an embodiment of the present embodiment, it is possible to readily attach/detach the substrate cartridge 2001 to/from a target object (such as the substrate processing unit 102).

The technical scope of the present invention is not limited to the aforementioned embodiments, thus any addition or modification may be appropriately made without departing from the spirit of the present invention.

In the aforementioned embodiments, only the substrate guide members 22a and 22b are formed of like air pad, and the supply inlet 2041 of the gas supply port 2004 is connected to only the substrate guide members 22a and 22b in the opening 34 side, but not limited thereto. For example, the same configuration may be provided for the second substrate guide members 37a and 37b in the second opening 35 side.

Figure 46:
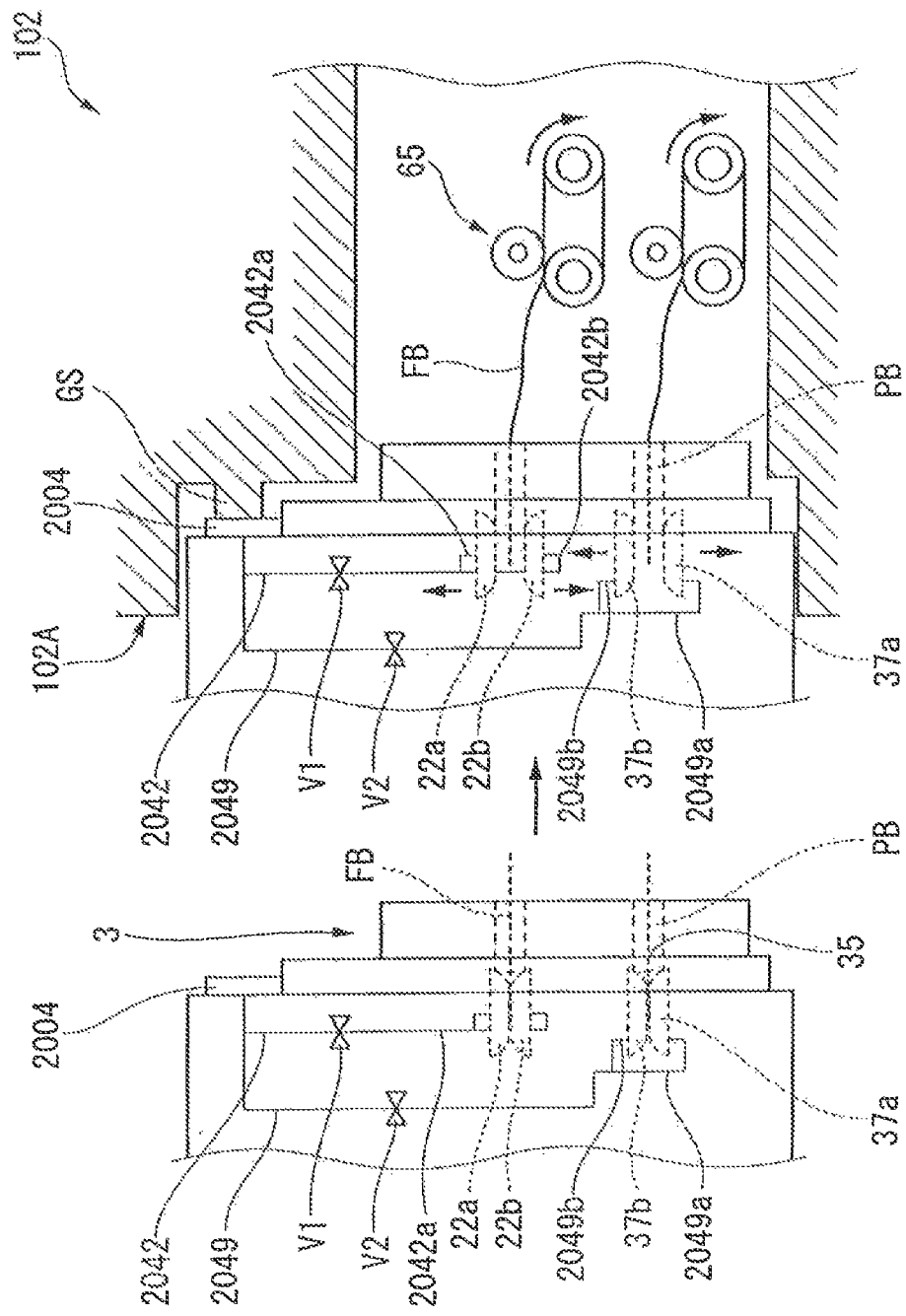
FIG. 46 illustrates a configuration of a blocking unit of another substrate processing apparatus.

For example, as shown in FIG. 46, a flow path 2049 may be provided from the supply inlet 2041 to the second substrate guide members 37a and 37b, and the flow path 2049 may be divided into a first flow path 2049a connected to the second substrate guide member 37a and a second flow path 2049b connected to the second substrate guide member 37b. In this case, the opening/closing control of the opening 34 and the second opening 35 may be independently performed by providing an electromagnetic valve V1 in the flow path 2042 and an electromagnetic valve V2 in the flow path 2049. The control of the electromagnetic valves V1 and V2 may be performed, for example, using the control unit 104, the information processing unit IC, or the like.

In the aforementioned embodiments, the substrate guide members 22a and 22b are also used as a clamp mechanism for clamping the sheet substrate FB to open/close the opening 34, but not limited thereto. The clamp mechanism may be separately provided from the substrate guide members 22a and 22b.

What is claimed is:

1. A substrate processing system comprising:
    a first processing unit that performs a first process for a flexible strip-like sheet substrate;
    a second processing unit that performs a second process for the substrate after the first process; and
    a substrate relay apparatus that recovers the substrate from the first processing unit and supplies the recovered substrate to the second processing unit,
    wherein the substrate relay apparatus includes a substrate cartridge which comprises:
        a cartridge mainframe that has
            an opening which extends in a widthwise direction of the substrate and through which the substrate is carried in/out in a striped direction of the substrate;
            a roller which is provided to be rotatable around a center axis along the widthwise direction and to wind up the substrate in the striped direction to accommodate the substrate in a roll shape; and
            a cap member which is movable provided to open or close the opening;
        a mount portion which is provided to the cartridge mainframe and is detachably connected to a connecting portion of the first processing unit or a connecting portion of the second processing unit; and
        a switching mechanism which switches the cap member to an opened state when the mount portion is connected to the connecting portion and switches the cap member to a closed state when the mount portion is detached from the connecting portion.

2. The substrate processing system according to claim 1, wherein the first process includes a process of forming an electric circuit device on the substrate, and the second process includes a process of forming pixels of a display device on the substrate.

3. The substrate processing system according to claim 1, wherein the substrate relay apparatus is used depending on each processing information of the first processing apparatus and the second processing apparatus.

4. The substrate processing system according to claim 3, further comprising a system control unit that manages at least the processing information.

5. The substrate processing system according to claim 1, further comprising a main control unit that performs control of the first and second processing units and the substrate relay apparatus.

6. The substrate processing system according to claim 5, wherein the main control unit determines a relay destination of the substrate relay apparatus in response to data based on the transport amount of the substrate.

7. A method of manufacturing a display element comprising:
    performing a process to form a pattern of the display element on a flexible strip-like sheet substrate using a substrate processing unit; and
    supplying the substrate to the substrate processing unit using a substrate cartridge which comprises:
    a cartridge mainframe that has
        an opening which extends in a widthwise direction of the substrate and through which the substrate is carried in/out in a striped direction of the substrate;
        a roller which is provided to be rotatable around a center axis along the widthwise direction and to wind up the substrate in the striped direction to accommodate the substrate in a roll shape; and
        a cap member which is movable provided to open or close the opening;
    a mount portion which is provided to the cartridge mainframe and is detachably connected to a connecting portion of the substrate processing unit; and
    a switching mechanism which switches the cap member to an opened state when the mount portion is connected to the connecting portion and switches the cap member to a closed state when the mount portion is detached from the connecting portion.

8. A method of manufacturing a display element comprising:
    performing a process to form a pattern of the display element on a flexible strip-like sheet substrate using a substrate processing unit; and
    supplying the substrate to the substrate processing unit using a substrate cartridge which comprises:
    a cartridge mainframe that has
        an opening which extends in a widthwise direction of the substrate and through which the substrate is carried in/out in a striped direction of the substrate;
        a roller which is provided to be rotatable around a center axis along the widthwise direction and to wind up the substrate in the striped direction to accommodate the substrate in a roll shape; and
        a clamp mechanism which is movably provided within the opening clamps or releases the substrate; and
    a mount portion which is provided to the cartridge mainframe and is detachably connected to a connecting portion of the substrate processing unit,
    wherein the clamp mechanism clamps the substrate and closes the opening when the mount portion is detached from the connecting portion, and releases the substrate and opens the opening when the mount portion is connected to the connecting portion.

* * * * *